US012680182B2

(12) United States Patent
Zhang et al.

(10) Patent No.: US 12,680,182 B2
(45) Date of Patent: Jul. 14, 2026

(54) FILM OF GRAPHITIC CARBON NITRIDE FOR PHOTOANODE AND A METHOD FOR FORMING THE SAME

(71) Applicant: City University of Hong Kong, Kowloon (HK)

(72) Inventors: Ruiqin Zhang, Kowloon (HK); May Thawda Oo, Kowloon (HK); Yanling Zhao, Kowloon (HK)

(73) Assignee: City University of Hong Kong, Kowloon (HK)

( * ) Notice: Subject to any disclaimer, the term of this patent is extended or adjusted under 35 U.S.C. 154(b) by 171 days.

(21) Appl. No.: 18/441,316

(22) Filed: Feb. 14, 2024

(65) Prior Publication Data

US 2025/0257485 A1 Aug. 14, 2025

(51) Int. Cl.
| | |
|---|---|
| *C25B 11/087* | (2021.01) |
| *C01B 21/06* | (2006.01) |
| *C03C 17/22* | (2006.01) |
| *C23C 16/34* | (2006.01) |
| *C23C 16/452* | (2006.01) |
| *C23C 16/56* | (2006.01) |
| *C25B 1/04* | (2021.01) |

(Continued)

(52) U.S. Cl.
CPC ........ *C25B 11/087* (2021.01); *C01B 21/0605* (2013.01); *C03C 17/225* (2013.01); *C23C 16/347* (2013.01); *C23C 16/452* (2013.01); *C23C 16/56* (2013.01); *C25B 9/50* (2021.01); *C25B 11/052* (2021.01); *C01P 2002/72* (2013.01); *C01P 2002/82* (2013.01); *C01P 2002/84* (2013.01); *C01P 2002/85* (2013.01);

*C01P 2004/03* (2013.01); *C01P 2004/04* (2013.01); *C01P 2004/10* (2013.01); *C01P 2006/40* (2013.01); *C03C 2217/281* (2013.01); *C03C 2217/71* (2013.01); *C03C 2218/152* (2013.01); *C03C 2218/32* (2013.01); *C25B 1/04* (2013.01)

(58) Field of Classification Search
CPC .......................... C01B 21/0605; C03C 17/225
See application file for complete search history.

(56) References Cited

U.S. PATENT DOCUMENTS 6,142,773 A * 11/2000 Shimazu ............. C23C 16/4401
118/733

OTHER PUBLICATIONS

Bian et al., "Thermal vapor condensation of uniform graphitic carbon nitride films with remarkable photocurrent density for photoelectrochemical applications," 2015, Nano Energy 15, pp. 353-361. (Year: 2015).*

(Continued)

*Primary Examiner* — Robert A Vetere
(74) *Attorney, Agent, or Firm* — Renner, Kenner, Greive, Bobak, Taylor & Weber

(57) ABSTRACT

A method for forming a film of graphitic carbon nitride (g-CN) by way of thermal vapor condensation comprising the steps of: a) providing a solid-phase thiourea precursor and a solid-phase melamine precursor in a container; b) covering the container with a first substrate; and c) thermally generating a vapor-phase thiourea source and a vapor-phase melamine source from the solid-phase thiourea precursor and the solid-phase melamine precursor in an air environment thereby forming a layer of g-CN on the first substrate. A film of g-CN formed by the method is also addressed.

25 Claims, 89 Drawing Sheets
(15 of 89 Drawing Sheet(s) Filed in Color)

(51) Int. Cl.
    *C25B 9/50*          (2021.01)
    *C25B 11/052*       (2021.01)

(56)           References Cited

OTHER PUBLICATIONS

Qin et al., "Highly efficient visible-light photocatalytic activity of graphitic carbon nitride prepared from melamine-thiourea molecular composite," 2016, J. Environ. Chem. Engr. 4, pp. 4374-4384. (Year: 2016).*

Mohamed et al., "The influences of post-annealing temperatures on fabrication graphitic carbon nitride, (g-C3N4) thin film," 2019, Appl. Surface Sci. 489, pp. 92-100. (Year: 2019).*

Metcalfe, C. D., T. L. Metcalfe, Y. Kiparissis, B. G. Koenig, C. Khan, R. J. Hughes, T. R. Croley, R. E. March and T. Potter. Estrogenic potency of chemicals detected in sewage effluents treatment plant effluents as determined by in vivo assays with Japanese medaka (Oryzias latipes). Environmental Toxicology and Chemistry., 20 (2001), 297-308.

Y. Xia et al; Subcellular responses of fish cells to sewa ge effluents: Cell line-based and whole-animal based approaches; Science of the Total Environment 906 (20240) 167528.

Van der Oost, R., J. Beyer and N. P. E. Vermeulen (2003). "Fish bioaccumulation and biomarkers in environmental risk assessment: a review." Environmental Toxicology and Pharmacology 13(2): 57-149.

Echeverría-Bugueño, M., R. Irgang, J. Mancilla-Schulz and R. Avendaño-Herrera. Healthy and infected Atlantic salmon (*Salmo salar*) skin-mucus response to Tenacibaculum dicentrarchi under in vitro conditions. Fish & Shellfish Immunology., 136 (2023): 108747.

Heinrich, P., U. Diehl, F. Förster and T. Braunbeck. Improving the in vitro ethoxyresorufin-O-deethylase (EROD) assay with RTL-W1 by metabolic normalization and use of B-naphthoflavone as the reference substance. Comparative Biochemistry and Physiology Part C: Toxicology & Pharmacology., 164 (2014), 27-34.

Tanneberger, K., M. Knöbel, F. J. M. Busser, T. L. Sinnige, J. L. M. Hermens and K. Schirmer. Predicting fish acute toxicity using a fish gill cell line-based toxicity assay. Environmental Science & Technology., 47 (2013), 1110-1119.

Schirmer, K. Proposal to improve vertebrate cell cultures to establish them as substitutes for the regulatory testing of chemicals and effluents using fish. Toxicology., 224 (2006), 163-183.

De-la-Ossa-Carretero, J., Y. Del-Pilar-Ruso, F. Giménez-Casalduero, J. Sánchez-Lizaso and J.-C. Dauvin. Sensitivity of amphipods to sewage effluents pollution. Estuarine, Coastal and Shelf Science 96 (2012)., 129-138.

Grunow, B. and S. M. Strauch. Status assessment and opportunities for improving fish welfare in animal experimental research according to the 3R-Guidelines. Reviews in Fish Biology and Fisheries., (2023).

Xia, Y.-T., W.-H. Hu, Q.-Y. Wu, T. T.-X. Dong, R. Duan, J. Xiao, S.-p. Li, Q.-W. Qin, W.-X. Wang and K. W.-K. Tsim. The herbal extract deriving from aerial parts of Scutellaria baicalensis shows anti-inflammation and anti-hypoxia responses in cultured fin cells from rabbit fish. Fish & Shellfish Immunology., 106 (2020), 71-78.

Lin, X.-Y., C.-Y. Lu and Y. Ye. Toxicity of crude extracts from several terrestrial plants to barnacle larvae on mangrove seedlings. Ecological Engineering., 35 (2009), 502-510.

\* cited by examiner

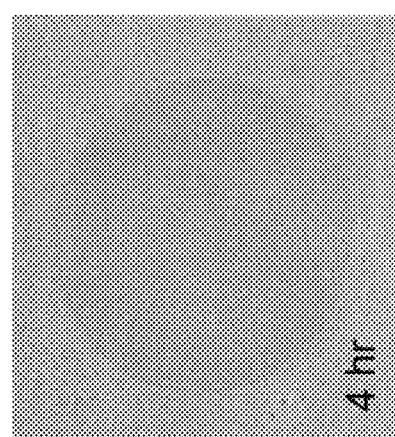
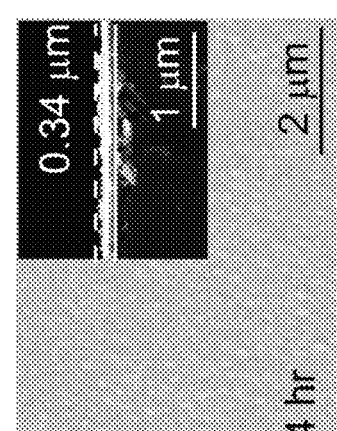
Fig. 6B
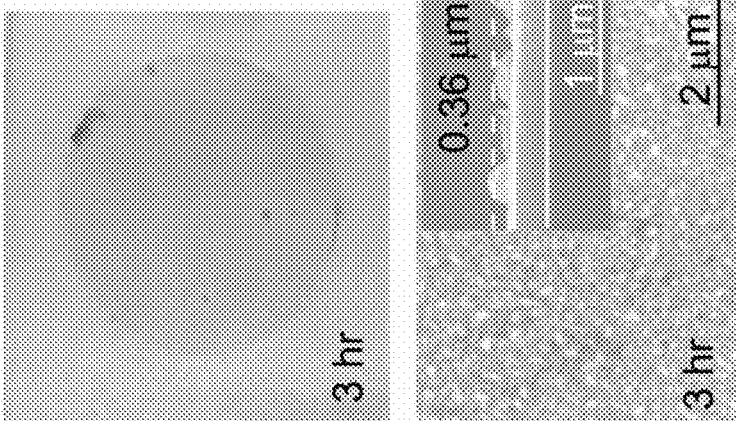
Fig. 6A

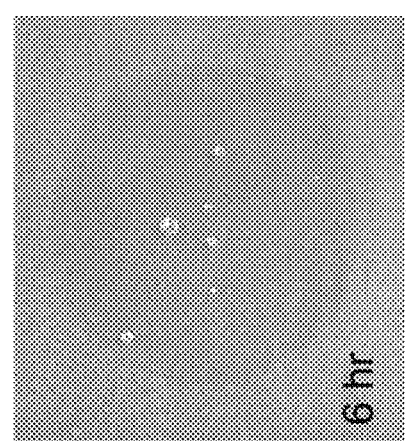
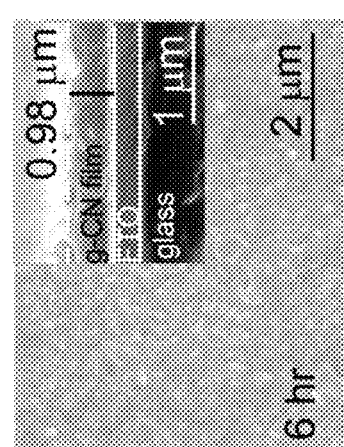
Fig. 6D
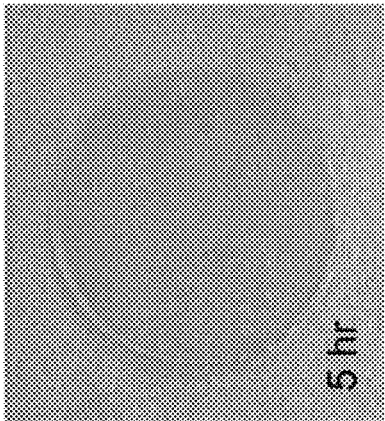
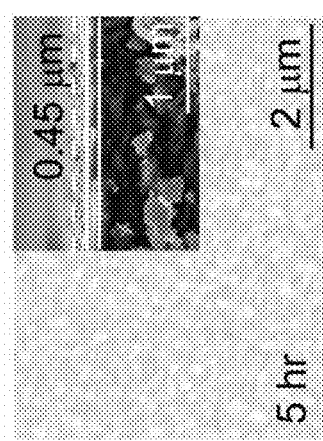
Fig. 6C

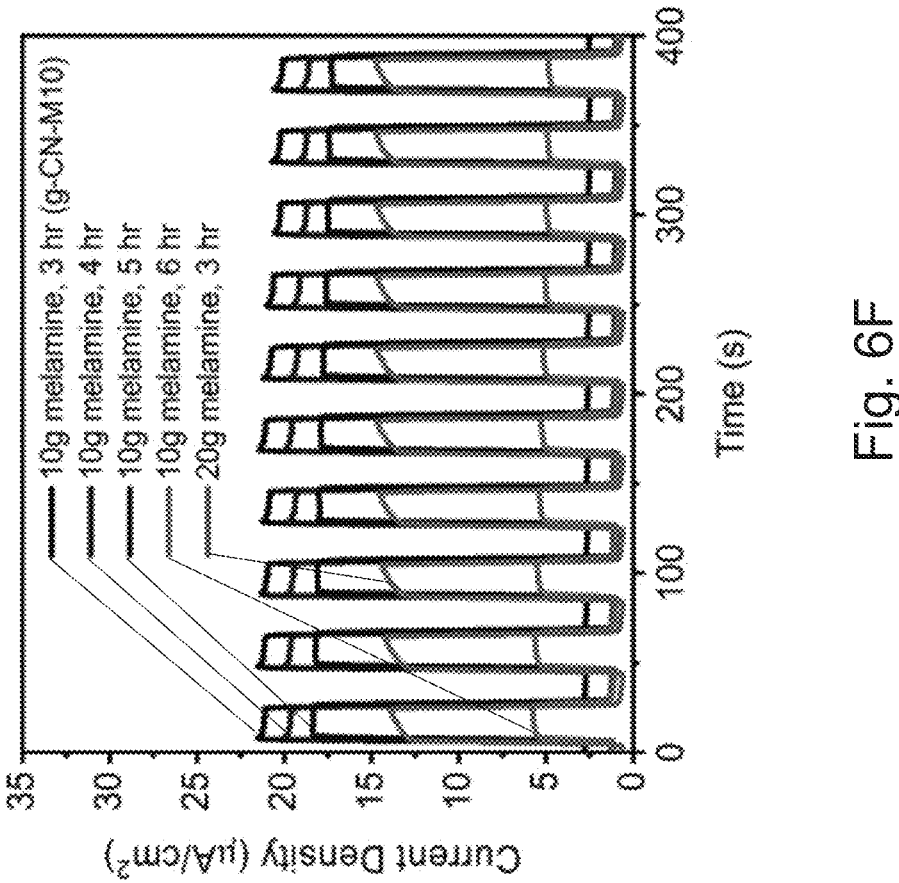
Fig. 6F
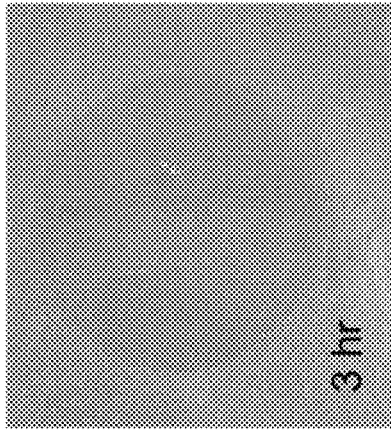
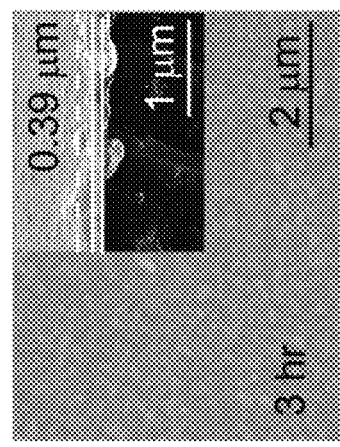
Fig. 6E

| Sample | C(at.%) | N(at.%) | O (at. %) | C/N (at.%) |
|---|---|---|---|---|
| g-CN-M10 | 43.9 | 36.9 | 19.2 | 1.19 |
| g-CN-M3TU0.6 | 46.2 | 41.2 | 12.6 | 1.12 |
| g-CN-M4TU0.6 | 44.5 | 44.4 | 11.1 | 1.00 |
| g-CN-M5TU0.6 | 46.0 | 44.7 | 9.3 | 1.03 |

Fig. 11

| No. | Sample | C (at %) | N (at %) | O (at %) |
|-----|--------|----------|----------|----------|
| 1 | CNM | 50.2 | 36.8 | 13.0 |
| 2 | CNMT1-500 | 45.6 | 48.3 | 6.1 |
| 3 | CNMT1-550 | 43.8 | 45.0 | 11.2 |
| 4 | CNMT2-500 | 44.7 | 48.7 | 6.5 |
| 5 | CNMT2-550 | 45.4 | 47.8 | 6.8 |

Fig. 20

| Samples | TU: Melamine mass ratio | In 0.1M KOH-10% TEOA, μA/cm² | In 0.1M Na₂SO₄-10% TEOA, μA/cm² |
|---|---|---|---|
| g-CN-M1TU0.6 | 0.6 | 68.9 | 51.4 |
| g-CN-M2TU0.6 | 0.3 | 112.3 | 82.5 |
| g-CN-M3TU0.6 | 0.2 | 404.4 | 319.8 |
| g-CN-M4TU0.6 | 0.15 | 130.6 | 107.7 |
| g-CN-M5TU0.6 | 0.12 | 94.8 | 150.9 |
| g-CN-M10 | 0 | 25.2 | 20.3 |

Fig. 25D

| No. | Sample | Precursor | | Temperature (°C) | 0.1M $Na_2SO_4$ solution | |
| | | Melamine (g) | Thiourea (g) | | With TEOA | Without TEOA |
| --- | --- | --- | --- | --- | --- | --- |
| 1 | CNM | 10 | - | 550 | 28.2 $\mu Acm^{-2}$ | 18.4 $\mu Acm^{-2}$ |
| 2 | CNMT1-500 | 3 | 2 | 500 | 790.5 $\mu Acm^{-2}$ | 266.3 $\mu Acm^{-2}$ |
| 3 | CNMT1-550 | 3 | 2 | 550 | 447.5 $\mu Acm^{-2}$ | 139.5 $\mu Acm^{-2}$ |
| 4 | CNMT2-500 | 3 | 3 | 500 | 611.2 $\mu Acm^{-2}$ | 220.6 $\mu Acm^{-2}$ |
| 5 | CNMT2-550 | 3 | 3 | 550 | 393.9 $\mu Acm^{-2}$ | 158.3 $\mu Acm^{-2}$ |
| 6 | CNMT3-500 | 3 | 1 | 500 | 456.8 $\mu Acm^{-2}$ | 210.7 $\mu Acm^{-2}$ |
| 7 | CNMT3-550 | 3 | 1 | 550 | 298.6 $\mu Acm^{-2}$ | 135.2 $\mu Acm^{-2}$ |

Fig. 29D

| Precursor | Photocurrent Density | Sacrificial Agent | Electrolyte | Temperature | Potential | Ref. |
|---|---|---|---|---|---|---|
| Melamine, Thiourea | 790.5 μA/cm² | Yes | 0.1 M Na₂SO₄ - 10% TEOA | 500 °C | 1.23 V vs RHE | This work |
| Melamine, Thiourea | 266.3 μA/cm² | No | 0.1 M Na₂SO₄ | 500 °C | 1.23 V vs RHE | This work |
| Melamine, Thiourea | 470 μA/cm² | Yes | 0.1 M KOH -10% TEOA | 500 °C | 1.23 V vs RHE | *Nat. Commun.* 2020, *11* (1), 1-9 |
| Urea, Thiourea | 200 μA/cm² | No | 1 M Na₂SO₄ | 550 °C | 0.35 V vs RHE | *Environ Sci Pollut Res Int.* 2021, *28*(4):4388-4403 |
| Melamine, Thiourea | 143.44 μA/cm² | Yes | 0.1 M Na₂SO₃ -0.1 M Na₂S | 550 °C | 1.23 V vs RHE | *J. Electroanal. Chem.* 2020, *857.* 113703 |
| Melamine, Thiourea | 22 μA/cm² | No | 0.1 M Na₂SO₄ | 550 °C | 0.5 V vs Ag/AgCl | *Appl. Surf. Sci.* 2016, *389.* 1076-1083 |
| Melamine, Dicyandiamide | ~2 μA/cm² | No | 0.5 M Na₂SO₄ | 550 °C | 5 mV vs RHE | *New J. Chem.* 2017, *41* (20), 11872-11880 |
| Urea, Thiourea | 0.89 μA/cm² | Yes | 0.5 M Na₂SO₄ | 550 °C | 1.5-2V vs RHE | *Appl. Surf. Sci.* 2021, *558* (April), 149900 |
| Urea, Thiourea | ~0.7 μA/cm² | No | 0.5 M Na₂SO₄ | 550 °C | 5 mV vs RHE | *ACS Appl. Mater. Interfaces* 2013, *5* (21), 11392-11401 |
| Melamine, Thiourea | ~0.32 μA/cm² | No | 0.5 M Na₂SO₄ | 550 °C | 1.23 V vs RHE | *J. Mater. Sci.* 2018, *53* (23). 15882-15894 |
| Melamine, Thiourea | ~0.02 μA/cm² | No | 0.5 M Na₂SO₄ | 600 °C | 1.23 V vs RHE | *J. Environ. Chem. Eng.* 2016, *4* (4), 4374-4384 |

FIG. 30

| No. | Sample | Flat band potential (V vs RHE) |
|---|---|---|
| 1 | CNM | -0.61 |
| 2 | CNMT1-500 | -0.86 |
| 3 | CNMT1-550 | -0.74 |
| 4 | CNMT2-500 | -0.79 |
| 5 | CNMT2-550 | -0.67 |

Fig. 37

| Steps | Types | Reactions | $E_a$, kcal/mol | $\Delta H$, kcal/mol |
|---|---|---|---|---|
| 1 | Polycondensation | Melamine + HN=C=NH → IM1 + NH$_3$ | 50.2 | 12.8 |
| 2 | Cycloaddition | IM1 + HN=C=NH → IM2 | 22.3 | -26.6 |
| 3 | H-shift | IM2 → IM3 | 41.6 | -7.8 |
| 4 | Addition | IM3 + HN=C=NH → IM4 | 27.6 | 8.3 |
| 5 | Self-condensation | IM4 → IM5 + NH$_3$ | 27.7 | -29.0 |
| 6 | H-shift | IM5 → IM6 (i.e. Heptazine) | 36.7 | -13.8 |
| 7 | Polycondensation | Heptazine + HN=C=NH → IM7 + NH$_3$ | 49.4 | 34.2 |
| 8 | Cycloaddition | IM7 + HN=C=NH → IM8 | 18.0 | -27.3 |
| 9 | H-shift | IM8 → IM9 | 44.1 | -5.4 |
| 10 | Polycondensation | IM9 + HN=C=NH → IM10 + NH$_3$ | 50.8 | 30.6 |
| 11 | Cycloaddition | IM10 + HN=C=NH → IM11 | 14.9 | 8.3 |
| 12 | H-shift | IM11 → IM12 | 0.2 | -25.4 |
| 13 | H-shift | IM12 → IM13 | 35.1 | -17.4 |
| 14 | Addition | IM13 → IM14 | 39.2 | -2.1 |
| 15 | H-shift | IM14 → IM15 | 49.2 | 40.6 |
| 16 | Self-condensation | IM15 → IM16 + NH$_3$ | 0.4 | -38.6 |
| 1-16 | Melamine + 7HN=C=NH → IM16 (i.e. g-CN) + 5NH$_3$ | | | |

Fig. 40C

| Steps | Types | Reactions | $E_a$, kcal/mol | $\Delta H$, kcal/mol |
|---|---|---|---|---|
| 1 | H-shift | Melamine → IM1 | 52.9 | 19.5 |
| 2 | Polycondensation | Melamine + IM1 → IM2 (Dimer) + NH$_3$ | 34.4 | -3.3 |
| 3 | H-shift | IM2 (Dimer) → IM3 | 49.2 | 20.7 |
| 4 | Polycondensation | Melamine + IM3 → IM4 (Trimer) + NH$_3$ | 34.8 | 30.6 |
| 1-4 | | 3Melamine → Trimer (containing N-C$_3$ bonds) + 2NH$_3$ | | |

Fig. 43B g-CN(H$_3$) $D_{h\text{-}e}$ = 0.02 Å at S$_1$ g-CN(H$_1$) $D_{h\text{-}e}$ = 0.00 Å at S$_1$ g-CN(H$_{10}$) $D_{h-e}$ = 0.20 Å at S$_1$ g-CN(H$_6$) $D_{h-e}$ = 0.07 Å at S$_1$

| | $E_g$ | $E_b$ |
|---|---|---|
| g-CN(H$_1$) | 5.00 | 5.88 |
| g-CN(H$_3$) | 3.91 | 4.03 |
| g-CN(H$_6$) | 3.71 | 3.54 |
| g-CN(H$_{10}$) | 3.50 | 3.40 |

Fig. 45

| Materials | STH efficiency value |
|---|---|
| g-CN | 0.75 % |
| CDots-C$_3$N$_4$ | 2 % |
| mp-CN | 0.12 % |
| Co$_1$-P$_4$-g-C$_3$N$_4$ | 0.16 % |
| 1 wt% Pt–3 wt% IrO$_2$–3D g-C$_3$N$_4$ NS | 0.06 % |
| 0.9 wt% Pt/BDCNN$_{350}$ 3 wt% Co(OH)$_2$/BDCNN$_{425}$ | 1.16 % |
| 1 wt% Pt–Cr$_2$O$_3$/3 wt% Co(OH)$_2$/g-C$_3$N$_4$/rGO/ PDIP | 0.3 % |

Fig. 49

FILM OF GRAPHITIC CARBON NITRIDE FOR PHOTOANODE AND A METHOD FOR FORMING THE SAME

TECHNICAL FIELD

The present invention relates to a method for forming a film of graphitic carbon nitride for example particularly, but not exclusively, a method for forming a film of graphitic carbon nitride by way of thermal vapor condensation; and a film of graphitic carbon nitride formed by the method.

BACKGROUND OF THE INVENTION

In order to resolve the global energy crisis and environmental problems, seeking an alternative pathway to convert solar energy to stable chemical energy fuel, in particular carbon-free hydrogen fuel, via photocatalytic water splitting, has been propelled. In this regard, photoelectrochemical (PEC) water splitting becomes an attractive pursuit to convert solar light and water into chemical fuel cost-effectively. Among the reported photocatalysts, graphitic carbon nitride (g-CN) is considered as one of the promising candidates for PEC water splitting to generate hydrogen energy owing to its suitable bandgap (2.7 eV), low cost, environmental friendliness, etc. Generally, the g-CN may be prepared by pyrolysis of nitrogen-rich precursors, such as cyanamide, dicyandiamide, trithiocyanuric acid, melamine, etc. However, it is believed that the drawbacks of fast charge recombination, restricted visible-light harvesting capacity, and the low surface area still hinder the photocatalyst efficiency of pristine g-CN.

Although various modification approaches such as metal or non-metal doping, supramolecular preorganization, construction of g-CN based heterojunctions or homojunction have been adopted to enhance catalytic activity, it is believed that these approaches may cause detrimental effects on the compatibility and stability of the g-CN due to their diverse physicochemical properties of g-CN with different atomic ratios.

The present invention thus seeks to eliminate or at least mitigate such shortcomings by providing a new or otherwise improved method for preparing g-CN, particularly a method for preparing high PEC performance g-CN for solar energy conversion.

SUMMARY OF THE INVENTION

In a first aspect of the present invention, there is provided a method for forming a film of graphitic carbon nitride (g-CN) by way of thermal vapor condensation comprising the steps of: a) providing a solid-phase thiourea precursor and a solid-phase melamine precursor in a container; b) covering the container with a first substrate; and c) thermally generating a vapor-phase thiourea source and a vapor-phase melamine source from the solid-phase thiourea precursor and the solid-phase melamine precursor in an air environment thereby forming a layer of g-CN on the first substrate.

In an optional embodiment, the solid-phase thiourea precursor and the solid-phase melamine precursor are physically separated by a support substrate.

Optionally, the support substrate is positioned at an angle relative to a side of the container. It is optional that the support substrate comprises a layer of solid-phase thiourea precursor.

In an optional embodiment, the method further comprises the step of forming the layer of solid-phase thiourea precursor.

Optionally, the method further comprises the steps of: heating thiourea solid in deionized water to form a hot saturated thiourea solution; forming a layer of saturated thiourea on the support substrate by at least partially immersing the support substrate in the saturated thiourea solution; and drying the layer of saturated thiourea to obtain the solid-phase thiourea precursor.

It is optional that the step of drying the layer of saturated thiourea solution is conducted under ambient conditions.

Optionally, the thiourea solid in deionized water is heated to a temperature of about 60° C. to about 150° C.

In an optional embodiment, the support substrate is at least partially immersing in the saturated thiourea solution for about 2-15 seconds.

Optionally, the layer of solid-phase thiourea precursor has a thickness of about 1.5 mm.

Optionally, the layer of solid-phase thiourea has a weight of about 0.6 g.

In an optional embodiment, the solid-phase melamine precursor has a weight of about 1 g to about 5 g.

It is optional that step c) includes the steps of: annealing the solid-phase thiourea precursor and the solid-phase melamine precursor to generate the vapor-phase thiourea source comprising active carboiimide species and the vapor-phase melamine source; and allowing the vapor-phase thiourea source and the vapor-phase melamine source to deposit and react to form the layer of graphitic carbon nitride on the first substrate.

Optionally, the annealing step is conducted in a muffle furnace at about 550° C. for about 3 hours, with a heating rate of about 3° C./min.

In an optional embodiment, the method further comprises step d) post-annealing the layer of g-CN formed in step c). Optionally, step d) is conducted in a muffle furnace at about 300° C. for about 30 min, with a heating rate of about 3° C./min.

It is optional that the first substrate comprises a FTO glass. Optionally, the support substrate comprises a glass strip.

In an optional embodiment, the container is polished. Optionally, the method further comprises the step of polishing the container rim successively with an abrasive, such as an abrasive paper (sandpaper) from about 400 Cw to about 1200 Cw.

In an optional embodiment, the method further comprises the step of placing a load on top of the first substrate for minimizing leakage of the vapor-phase thiourea source and a vapor-phase melamine source.

In an optional embodiment, each of the solid-phase thiourea precursor and the solid-phase melamine precursor is in powder form.

Optionally, the method further comprises the steps of: preparing a homogeneous mixture of the solid-phase thiourea precursor and the solid-phase melamine precursor by grinding thiourea solid and melamine solid; and transferring the homogeneous mixture to the container for thermal treatment.

It is optional that the thiourea solid and the melamine solid has a weight ratio of about 1-3:3.

Optionally, step c) comprises the steps of: annealing the solid-phase thiourea precursor and the solid-phase melamine to generate the vapor-phase thiourea source and the vapor-phase melamine source; and allowing the vapor-phase thiourea source and the vapor-phase melamine source to deposit and react to form the layer of graphitic carbon nitride on the first substrate.

It is optional that the annealing step is conducted in a muffle furnace at about 500° C. to about 550° C. for about 3 hours, with a heating rate of about 3° C./min.

In a second aspect of the present invention, there is provided a film of g-CN formed by the method in accordance with the first aspect comprising an atomic ratio of C:N:O of about 2.3-4.9:1.9-4.8:1.

Optionally, the film of g-CN comprises an atomic ratio of C:N of about 1.25 to about 1.45.

It is optional that the film of g-CN comprises a plurality of nanoporous and mesoporous structures. Optionally, the film of g-CN comprises a plurality of nanoflakes on the film surface.

Optionally, the plurality of nanoflakes has a length of about 7 μm to about 13 μm.

In an optional embodiment, the film of g-CN has a thickness of about 2.5 μm to about 4.3 μm.

In an optional embodiment, the film of g-CN has a transient photocurrent density of about 51.4 μA cm$^{-2}$ to about 404 μA cm$^{-2}$ upon chopped simulated AM 1.5G illumination at 1.23V vs. RHE in 0.1 M KOH electrolyte with 10% triethanolamine.

In a third aspect of the present invention, there is provided a film of g-CN formed by the method in accordance with the first aspect comprising an atomic ratio of C:N:O of about 3.9-7.5:4-7.9:1.

In an optional embodiment, the film of g-CN comprises a plurality of nanosheets that are at least partially stacking with each other.

Optionally, the plurality of nanosheets includes nanomesh structures or sheet-like structures.

It is optional that the film of g-CN comprises a plurality of nanoflowers on the film surface.

Optionally, the film of g-CN has a thickness of about 2.81 μm to about 3.21 μm. In an optional embodiment, the film of g-CN has a transient photocurrent density of about 298.6 μA cm$^{-2}$ to about 790.5 μA cm$^{-2}$ upon chopped simulated AM 1.5G illumination at 1.23V vs. RHE in 0.1 M Na$_2$SO$_4$ electrolyte with 10% triethanolamine.

In an optional embodiment, the film of g-CN has a solar-to-hydrogen conversion efficiency of about 0.75% when the film has an atomic ratio of C:N:O of 7.48:7.92:1 upon operation in 0.1 M Na$_2$SO$_4$ electrolyte with 10% triethanolamine.

BRIEF DESCRIPTION OF DRAWINGS

The patent or application file contains at least one drawing executed in color. Copies of this patent or patent application publication with color drawing(s) will be provided by the Office upon request and payment of the necessary fee The invention will now be more particularly described, by way of example only, with reference to the accompanying drawings, in which:

FIG. 6A shows the photograph and the corresponding SEM image of g-CN film prepared from 10 g melamine precursor at 550° C. for 3 hours;

FIG. 6B shows the photograph and the corresponding SEM image of g-CN film prepared from 10 g melamine precursor at 550° C. for 4 hours;

FIG. 6C shows the photograph and the corresponding SEM image of g-CN film prepared from 10 g melamine precursor at 550° C. for 5 hours;

FIG. 6D shows the photograph and the corresponding SEM image of g-CN film prepared from 10 g melamine precursor at 550° C. for 6 hours;

FIG. 6E shows the photograph and the corresponding SEM image of g-CN film prepared from 20 g melamine precursor at 550° C. for 3 hours;

FIG. 6F shows the transient photocurrent density curves of the samples in FIGS. 6A to 6E in 0.1 M KOH solution;

FIG. 11 is a table summarizing the chemical compositions of C and N in the g-CN-M10, g-CN-M3T0.6, g-CN-M4T0.6, and g-CN-M5T0.6 samples;

FIG. 20 is a table summarizing the chemical compositions (at %) of C, N, and O in the CNM, CNMT1-500, CNMT1-550, CNMT2-500, and CNMT2-550 samples obtained from XPS spectra of FIGS. 19A to 19D;

FIG. 25D is a table summarizing the transient photocurrent density of g-CN-M10, g-CN-M3T0.6, g-CN-M4T0.6 and g-CN-M5T0.6 in 0.1M KOH-10% TEOA or 0.1M Na$_2$SO$_4$-10% TEOA;

FIG. 29D is a table summarizing the transient photocurrent density of CNM, CNMT1-500, CNMT1-550, CNMT2-500, CNMT2-550, CNMT3-500, and CNMT3-550 in 0.1M $Na_2SO_4$ solution with or without 10% TEOA;

FIG. 30 is a table comparing the PEC performance of the g-CN of the present invention and the reported g-CN photoelectrodes prepared from melamine and thiourea precursors;

FIG. 37 is a table summarizing the flat band potentials calculated from the Mott-Schottky plots in FIG. 36;

Figures 40A, 40B:
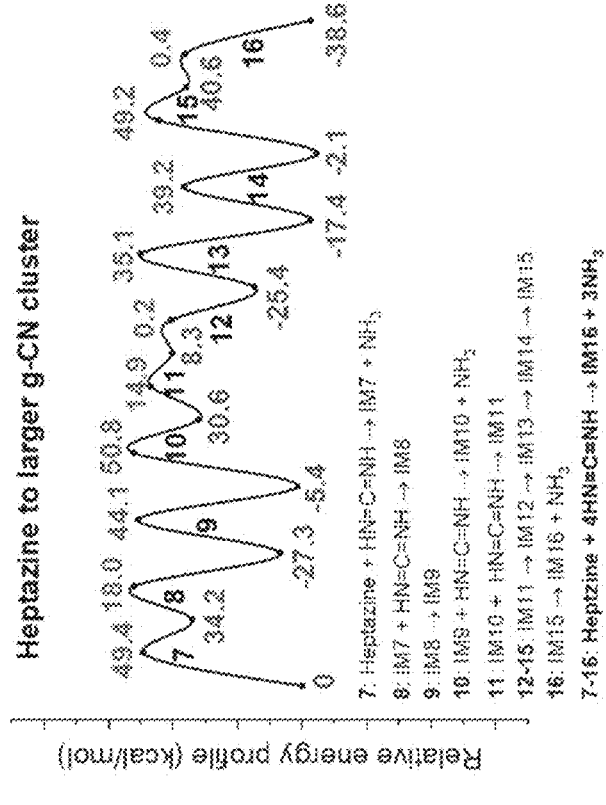
FIG. 40A shows DFT-calculated relative potential energy profiles of carbodiimide (HN=C=NH) involved in the melamine growth into heptazine via 1-6 steps. The red and blue numbers are the activation energies ($E_\alpha$) and reaction heats ($\Delta H$), relative to each previous local minimum. Each step of chemical reactions is listed at the bottom-left corner. The geometrical structures of 16 transition states and 16 intermediates are shown in FIGS. 41A to 41C.
FIG. 40B shows DFT-calculated relative potential energy profiles of carbodiimide (HN=C=NH) involved in heptazine growth into larger-area conjugated cluster via 7-16 steps. The red and blue numbers are the activation energies ($E_\alpha$) and reaction heats ($\Delta H$), relative to each previous local minimum. Each step of chemical reactions is listed at the bottom-left corner. The geometrical structures of 16 transition states and 16 intermediates are shown in FIGS. 41A to 41C.
Figure 41A:
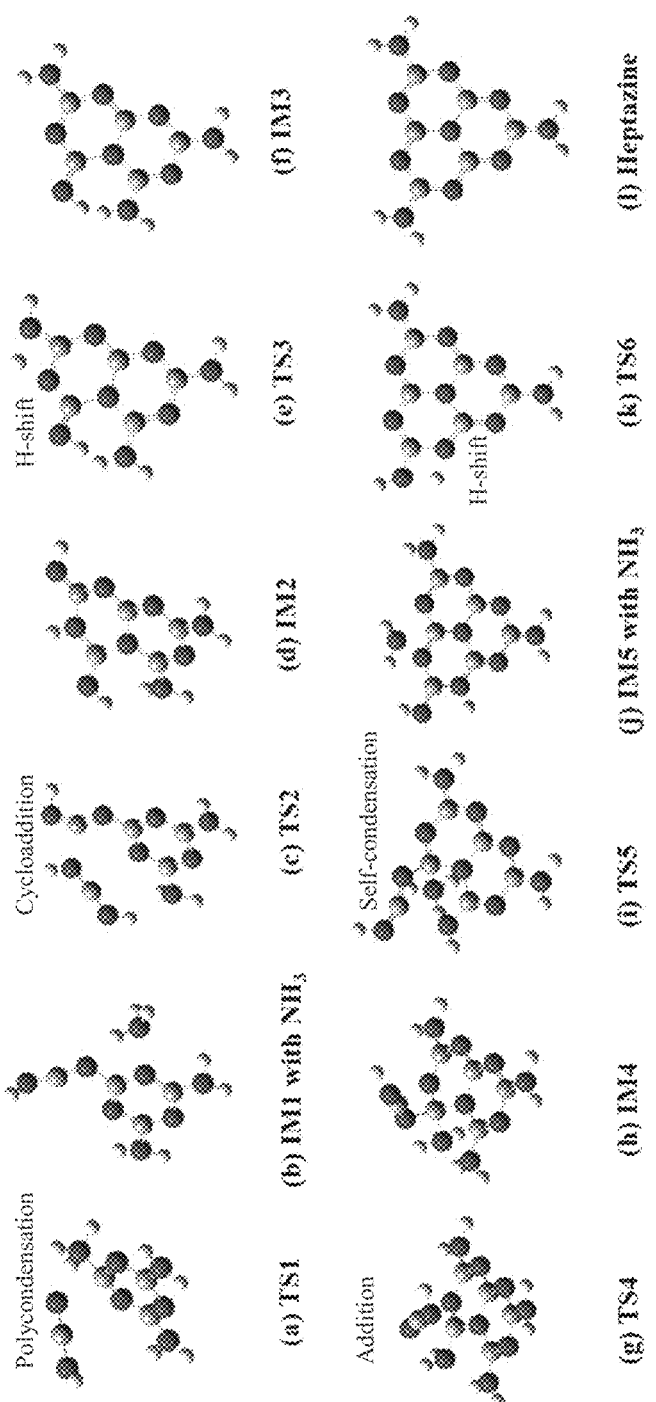
Figure 41B:
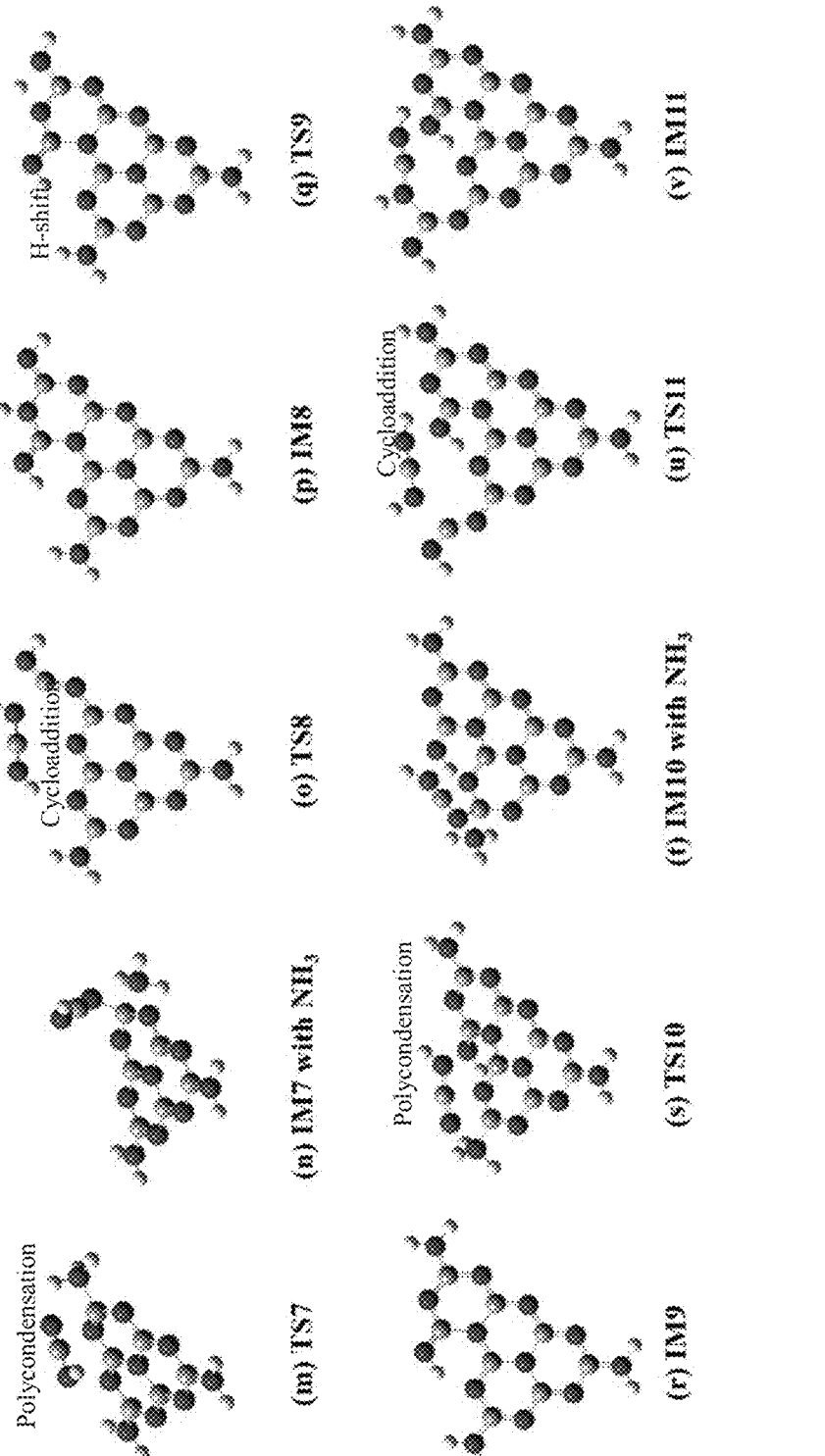
Figure 41C:
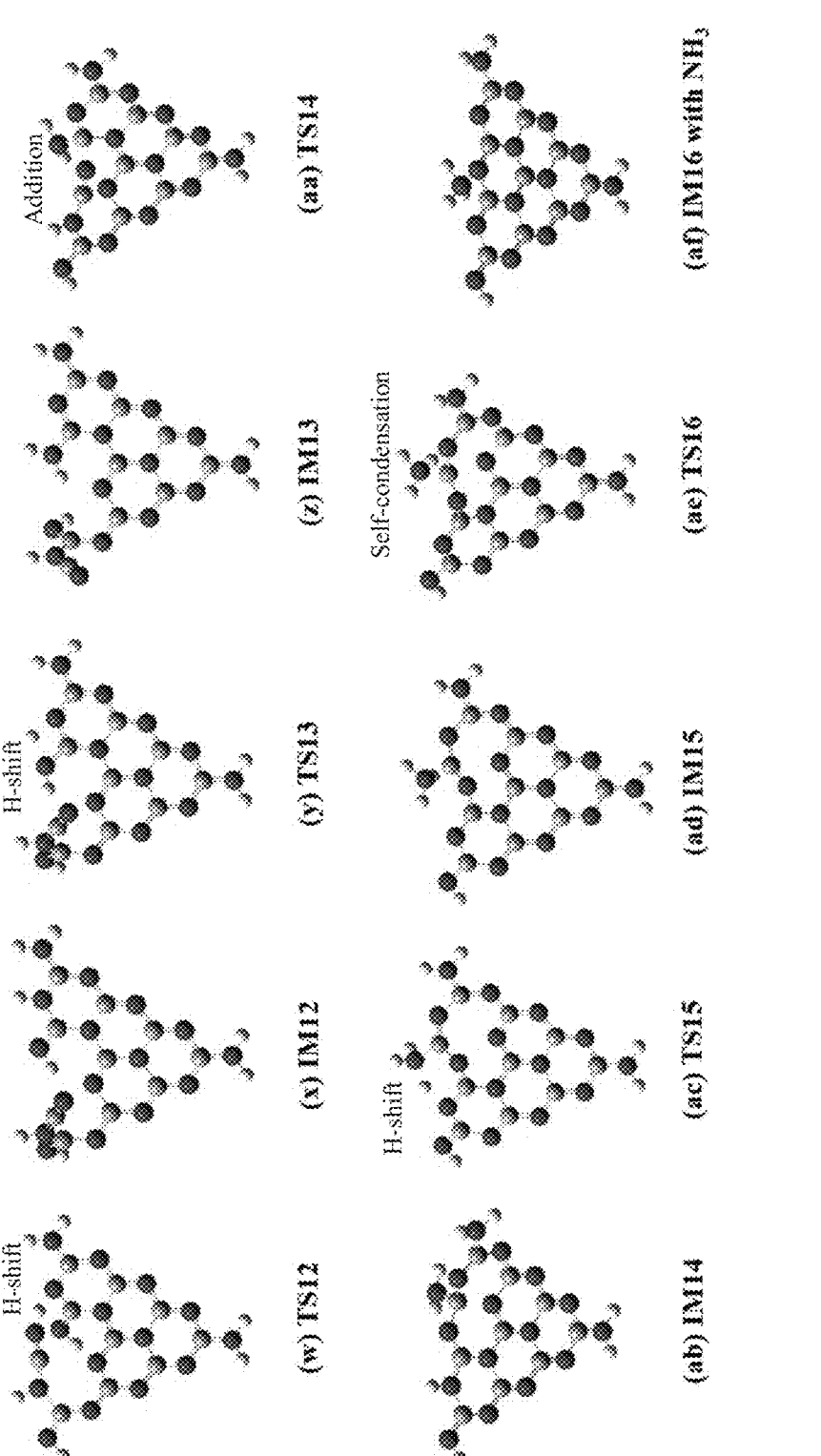
Figure 42B:
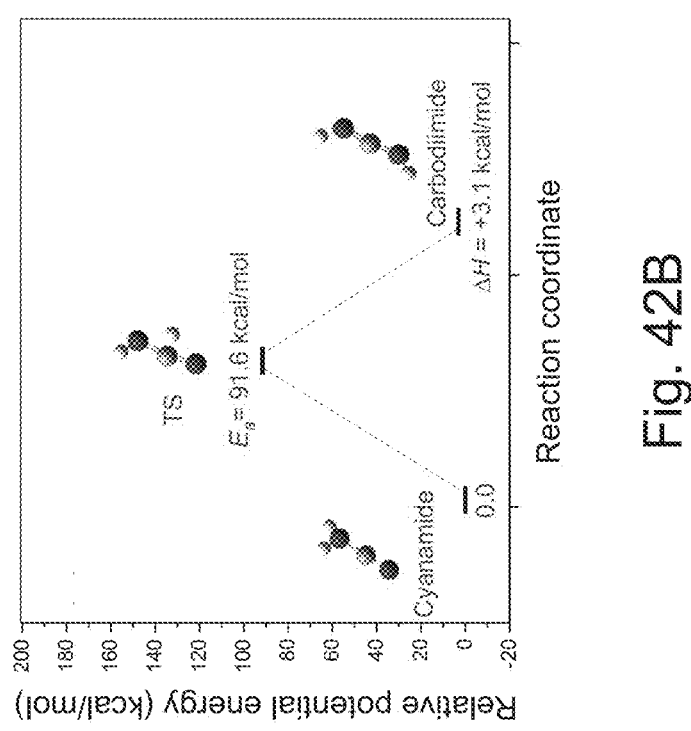
Figure 42A:
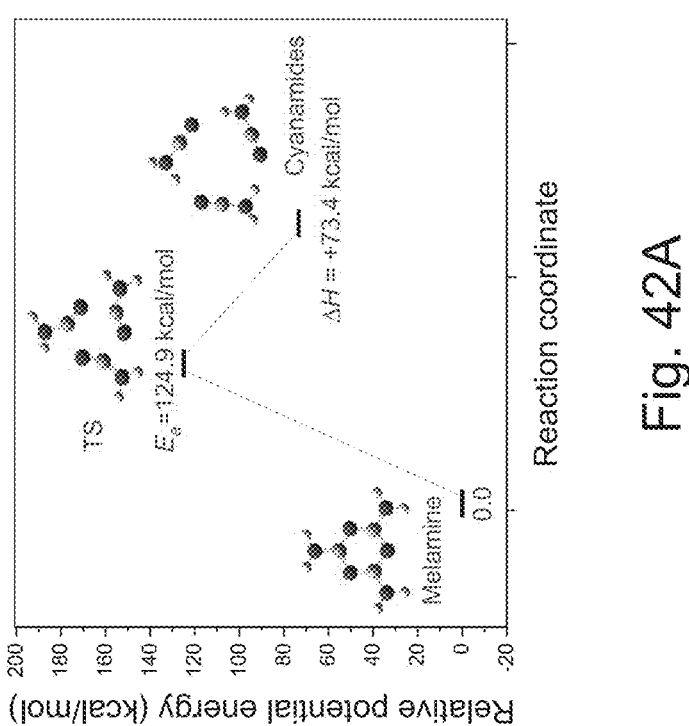
Figure 42D:
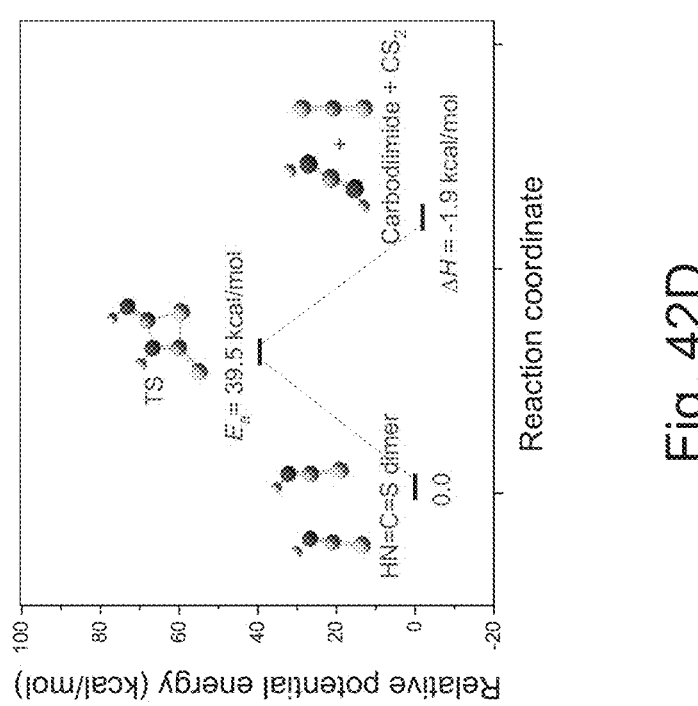
Figure 42C:
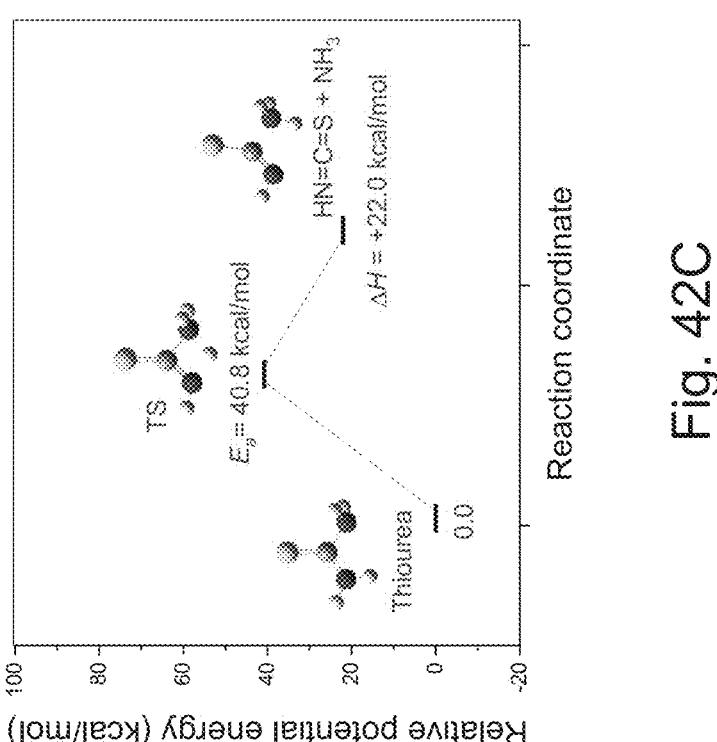
Figure 43A:
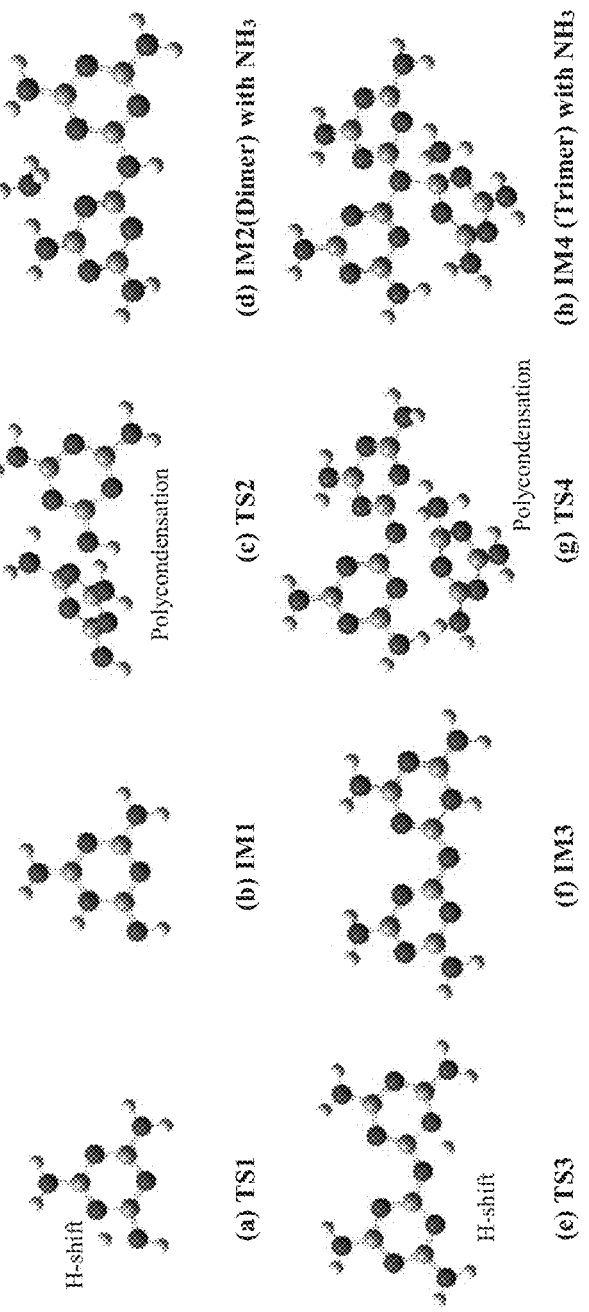
Figure 44B:
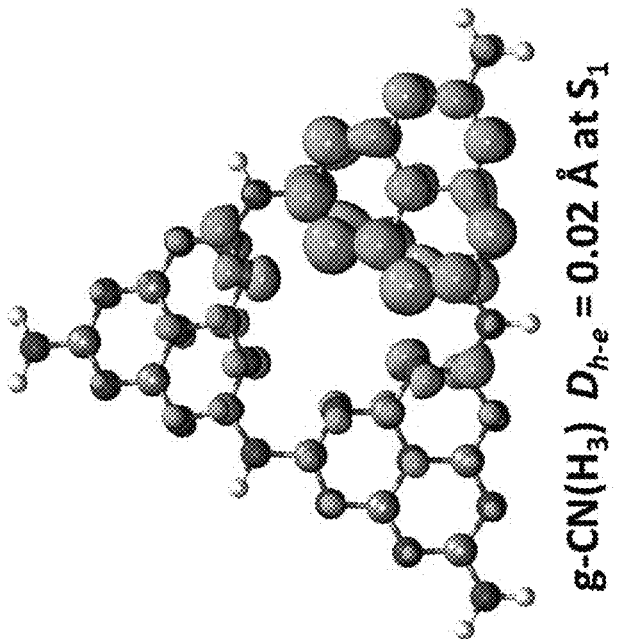
Figure 44A:
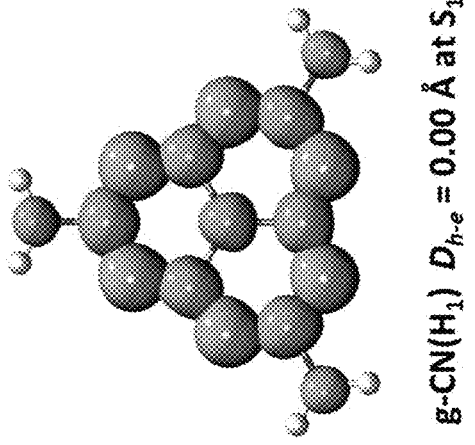
Figures 44C, 44D:
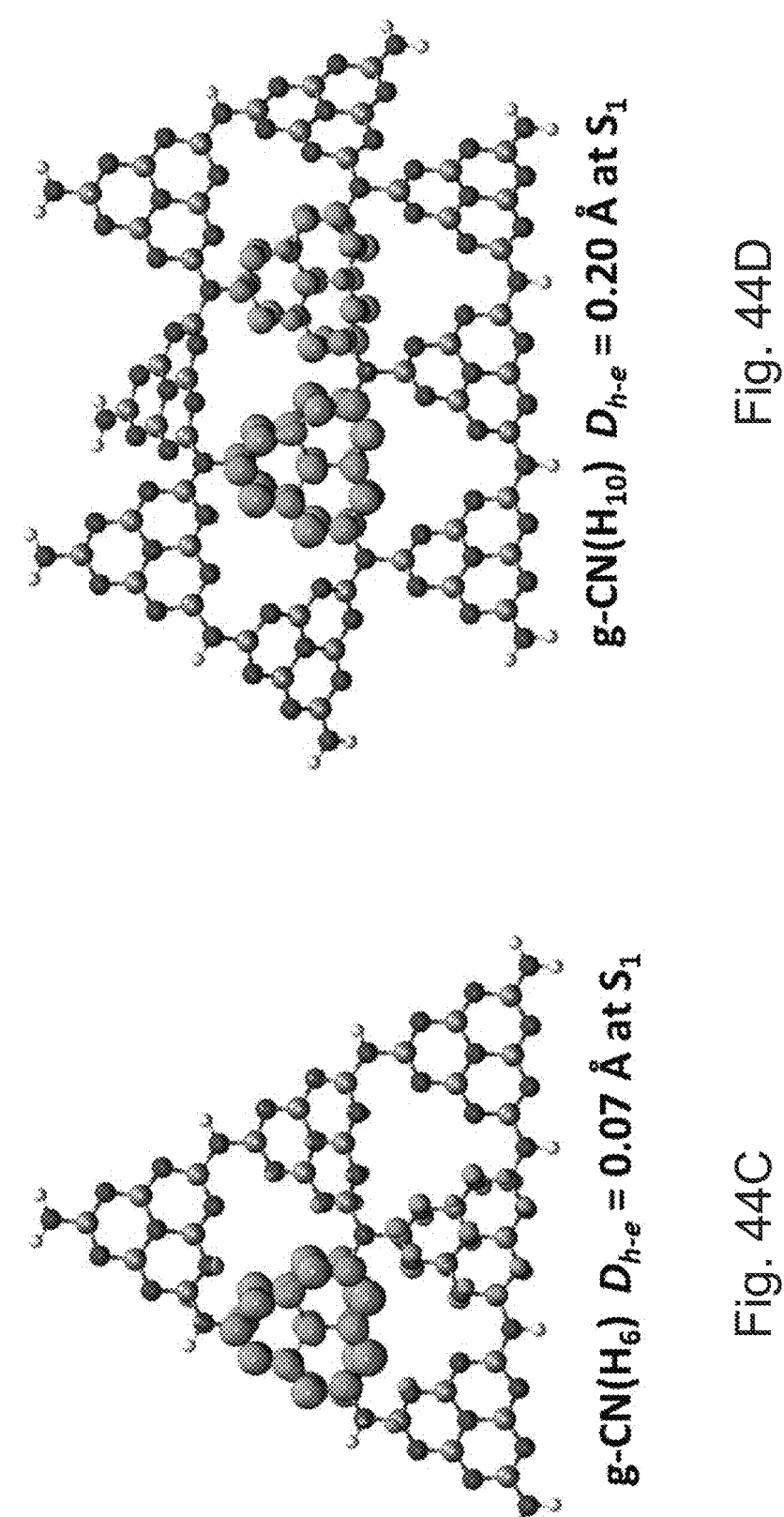
Figure 46B:
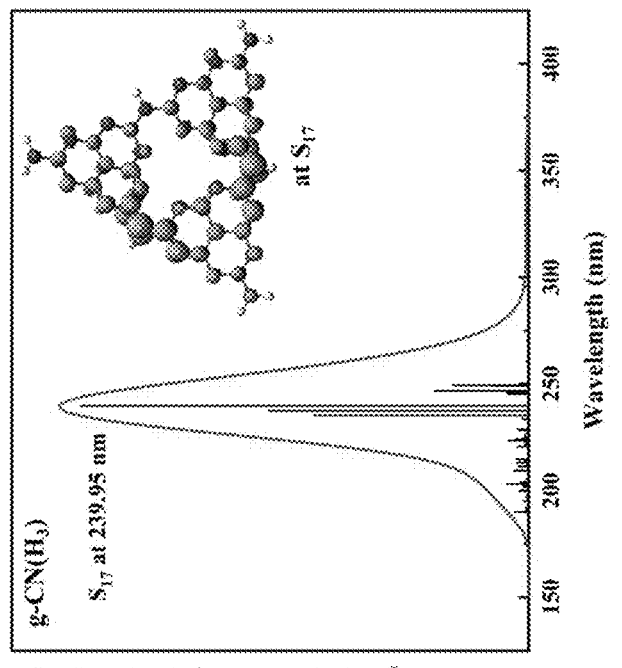
Figure 46A:
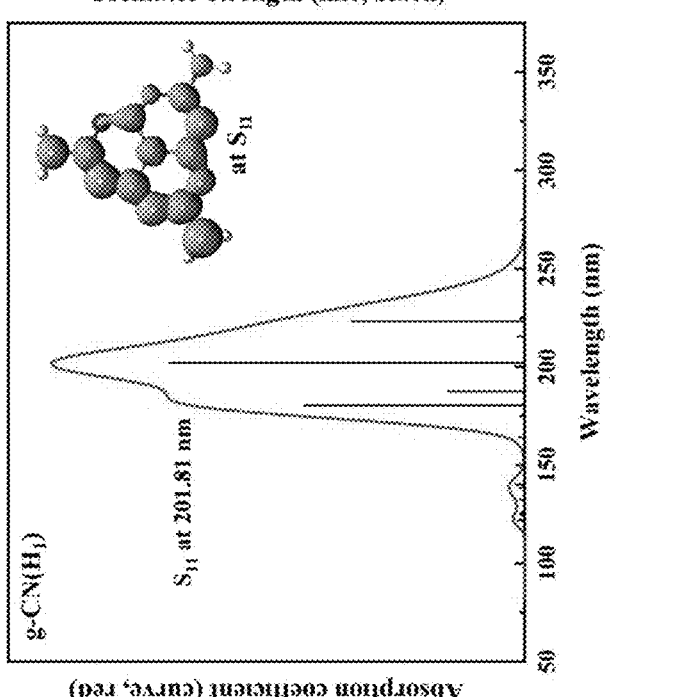
Figure 46D:
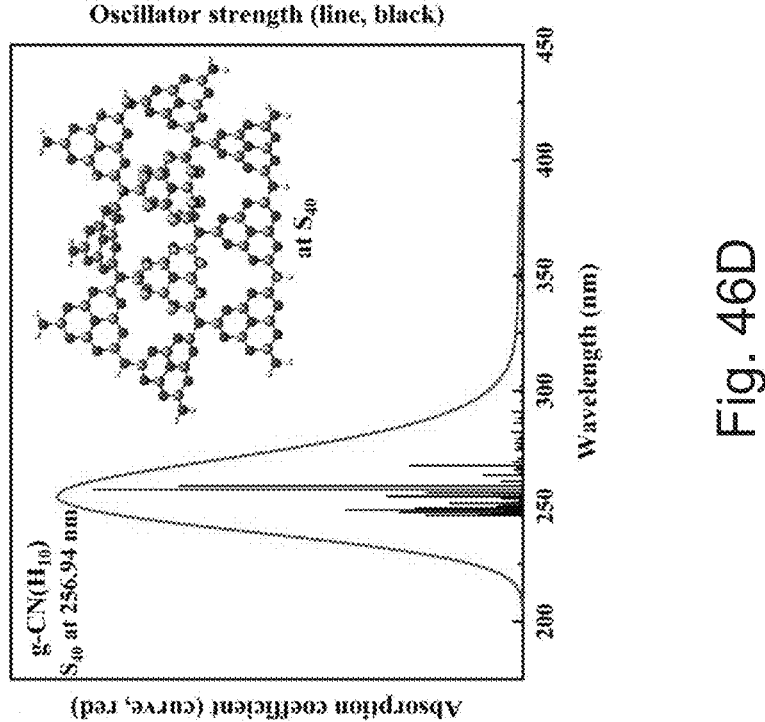
Figure 46C:
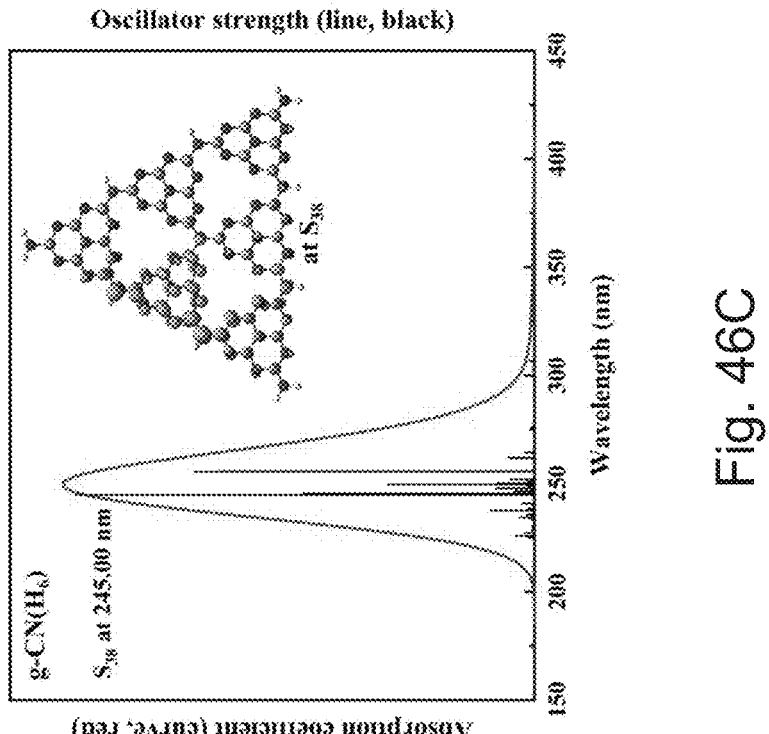
Figure 47B:
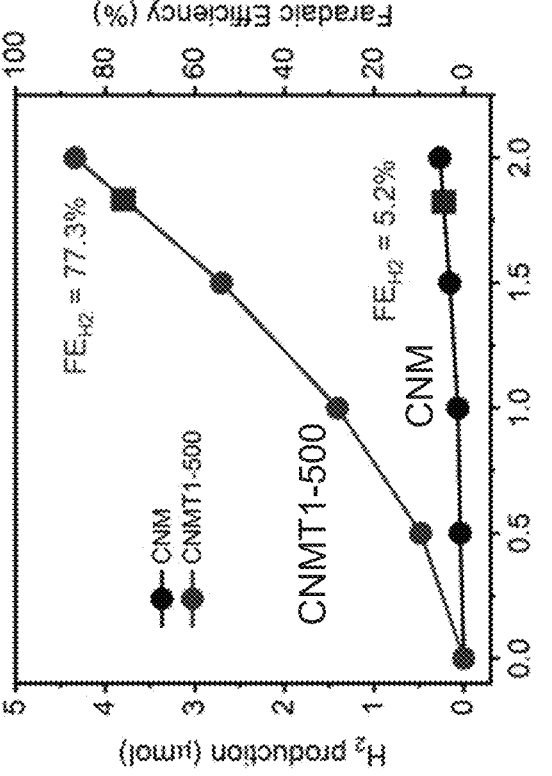
Figure 47A:
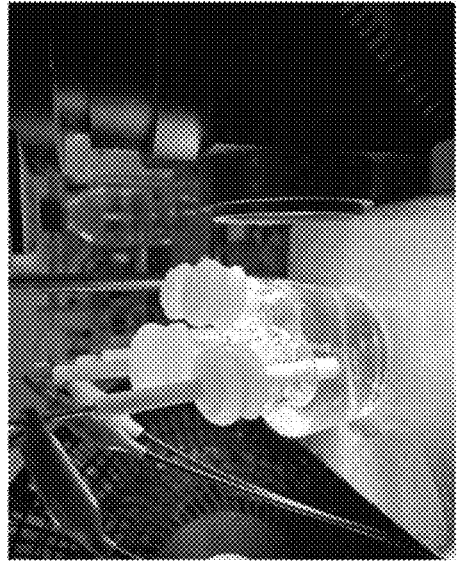
Figure 47D:
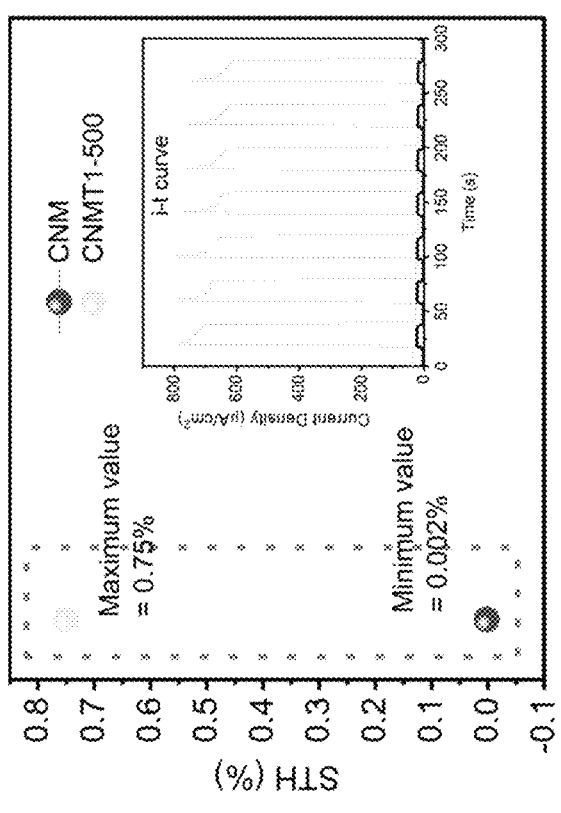
Figure 47C:
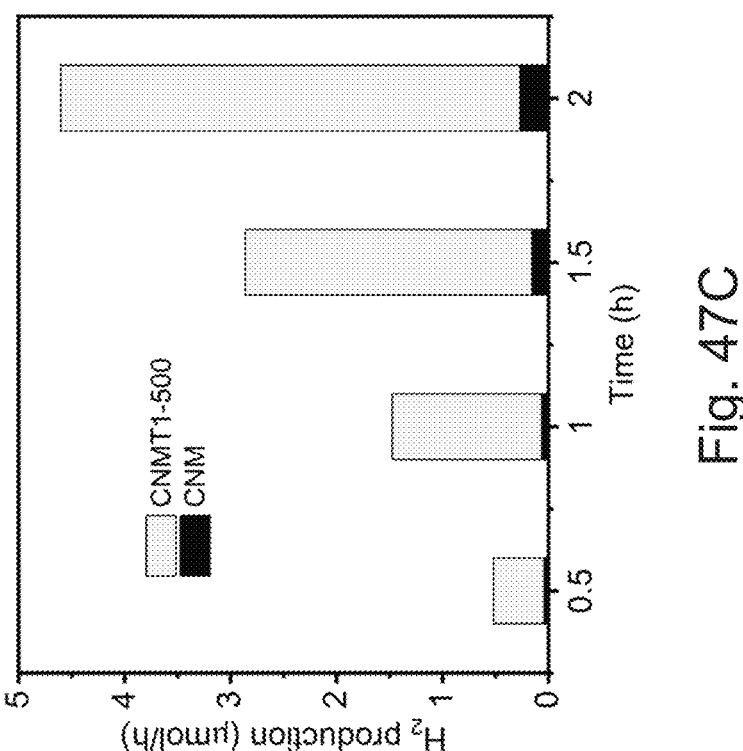
Figure 48:
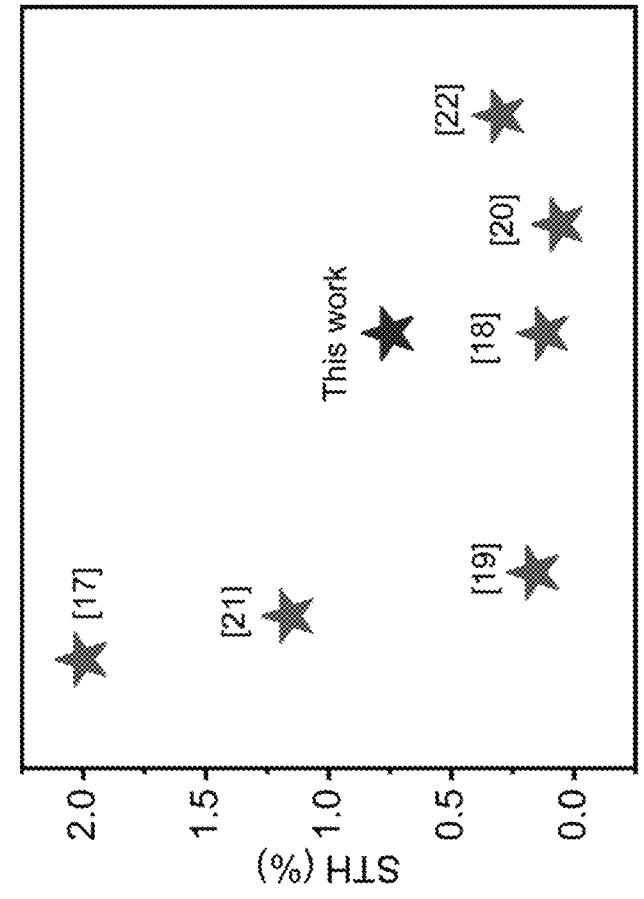

FIG. 40C is a table summarizing the melamine growth into g-CN clusters by DFT calculations, corresponding to the TS1-16 and IM1-16 shown in FIGS. 40A and 40B;

FIG. 41A shows the geometrical structures of transition states (TS) and intermediates (IM) involved in the process of melamine growth into large conjugated g-CN clusters by CAM-B3LYP/6-31G* calculations: (a) TS1, (b) IM1 with $NH_3$, (c) TS2, (d) IM2, (e) TS3, (f) IM3, (g) TS4, (h) IM4, (i) TS5, (j) IM5 with $NH_3$, (k) TS6, (l) Heptazine (i.e. IM6). The grey, blue, and white balls represent C, N, and H atoms;

FIG. 41B shows the geometrical structures of transition states (TS) and intermediates (IM) involved in the process of melamine growth into large conjugated g-CN clusters by CAM-B3LYP/6-31G* calculations: (m) TS7, (n) IM7 with $NH_3$, (o) TS8, (p) IM8, (q) TS9, (r) IM9, (s) TS10, (t) IM10 with $NH_3$, (u) TS11, (v) IM11. The grey, blue, and white balls represent C, N, and H atoms;

FIG. 41C shows the geometrical structures of transition states (TS) and intermediates (IM) involved in the process of melamine growth into large conjugated g-CN clusters by CAM-B3LYP/6-31G* calculations: (w) TS12, (x) IM12, (y) TS13, (z) IM13, (aa) TS14, (ab) IM14, (ac) TS15, (ad) IM15, (ae) TS16, and (af) IM16 with $NH_3$. The grey, blue, and white balls represent C, N, and H atoms;

FIG. 42A shows the relative potential energy profiles of carbodiimide (HN=C=NH) derived from melamine or thiourea (TU) precursor by DFT calculations: melamine decomposition into three cyanamides (N=C—$NH_2$). The structures of reactants, TS, and products were respectively shown nearby the profiles. The grey, blue, white, and yellow balls represent C, N, H, and S atoms, respectively;

FIG. 42B shows the relative potential energy profiles of carbodiimide (HN=C=NH) derived from melamine or thiourea (TU) precursor by DFT calculations: N=C—$NH_2$ thermo-isomerized into HN=C=NH by H-shift. The structures of reactants, TS, and products were respectively shown nearby the profiles. The grey, blue, white, and yellow balls represent C, N, H, and S atoms, respectively;

FIG. 42C shows the relative potential energy profiles of carbodiimide (HN=C=NH) derived from melamine or thiourea (TU) precursor by DFT calculations: TU decomposition into HN=C=S and $NH_3$. The structures of reactants, TS, and products were respectively shown nearby the profiles. The grey, blue, white, and yellow balls represent C, N, H, and S atoms, respectively;

FIG. 42D shows the relative potential energy profiles of carbodiimide (HN=C=NH) derived from melamine or thiourea (TU) precursor by DFT calculations: HN=C=S dimer polycondensed into HN=C=NH and $CS_2$. The structures of reactants, TS, and products were respectively shown nearby the profiles. The grey, blue, white, and yellow balls represent C, N, H, and S atoms, respectively;

FIG. 43A shows the geometrical structures of transition states (TS) and intermediates (IM) involved in the formation process of N—$C_3$ coordination bonds in g-CN film by CAM-B3LYP/6-31G* calculations: (a) TS1, (b) IM1, (c) TS2, (d) IM2 (Dimer) with $NH_3$, (e) TS3, (f) IM3, (g) TS4, (h) IM4 (Trimer) with $NH_3$. The grey, blue, and white balls represent C, N, and H atoms. The TS1-4 and IM1-4 correspond to steps 1-4 of the chemical reactions listed in FIG. 43B, respectively;

FIG. 43B is a table summarizing for the N—C$_3$ coordination bond formation in g-CN by DFT calculations;

FIG. 44A shows the spatial distributions of photo-induced hole and electron at the first excited state for g-CN(H$_1$). The distances (D$_{h-e}$ in Å) between the centres of photo-induced hole and electron are marked. Isovalue=0.002 a.u., hole in pink and electron in green;

FIG. 44B shows the spatial distributions of photo-induced hole and electron at the first excited state for g-CN(H$_3$). The distances (D$_{h-e}$ in Å) between the centres of photo-induced hole and electron are marked. Isovalue=0.002 a.u., hole in pink and electron in green;

FIG. 44C shows the spatial distributions of photo-induced hole and electron at the first excited state for g-CN(H$_6$). The distances (D$_{h-e}$ in Å) between the centres of photo-induced hole and electron are marked. Isovalue=0.002 a.u., hole in pink and electron in green;

FIG. 44D shows the spatial distributions of photo-induced hole and electron at the first excited state for g-CN(H$_{10}$). The distances (D$_{he}$ in Å) between the centres of photo-induced hole and electron are marked. Isovalue=0.002 a.u., hole in pink and electron in green;

FIG. 45 is a table summarizing the fundamental energy gaps (E$_g$ in eV) at the B3LYP/6-31G(d,p) level and estimates of the electron-hole pair binding energies (E$_b$ in eV) at the ωb97xd/6-31G(d,p) level;

FIG. 46A shows the UV-vis absorption spectra of g-CN (H$_1$). The excited state with largest oscillator strength is marked with the spatial distributions of photo-induced hole and electron shown. Isovalue=0.002 a.u., hole in pink and electron in green;

FIG. 46B shows the UV-vis absorption spectra of g-CN (H$_3$). The excited state with largest oscillator strength is marked with the spatial distributions of photo-induced hole and electron shown. Isovalue=0.002 a.u., hole in pink and electron in green;

FIG. 46C shows the UV-vis absorption spectra of g-CN (H$_6$). The excited state with largest oscillator strength is marked with the spatial distributions of photo-induced hole and electron shown. Isovalue=0.002 a.u., hole in pink and electron in green;

FIG. 46D shows the UV-vis absorption spectra of g-CN (H$_{10}$). The excited state with largest oscillator strength is marked with the spatial distributions of photo-induced hole and electron shown. Isovalue=0.002 a.u., hole in pink and electron in green;

FIG. 47A shows the photograph of experimental setup for H$_2$ evolution test, which is carried out via three-electrode configuration system under AM 1.5G 1 sun illumination (100 mW/cm$^{-2}$);

FIG. 47B shows hydrogen gas measurements of CNM and CNMT1-500 photoanodes and corresponding Faradaic efficiency (square);

FIG. 47C shows the comparison of H$_2$ evolution between CNM and CNMT1-500 under the same experimental conditions;

FIG. 47D shows the solar-to-hydrogen (STH) efficiency for CNM and CNMT1-500. Inset: transient photocurrent density measurements for CNM and CNMT1-500 films via three-electrode photoelectrochemical configuration;

FIG. 48 shows the performance comparison of STH efficiency for solar water splitting for some reported photoanodes and the g-CN film of the present invention; and FIG. 49 is a table summarizing the STH efficiency of reported g-CN based photocatalysts and comparison with the g-CN of the present invention. All works were done in laboratory but mp-CN is performed by the large scale photoreactor under natural sunlight.

DETAILED DESCRIPTION OF OPTIONAL EMBODIMENT

As used herein, the forms "a", "an", and "the" are intended to include the singular and plural forms unless the context clearly indicates otherwise.

The words "example" or "exemplary" used in this invention are intended to serve as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

As used herein, the phrase "about" is intended to refer to a value that is slightly deviated from the value stated herein. For example, "about 100° C." may be meant that any values from 100.2 . . . 100.5 . . . 101 . . . 101.2° C.; "about 5 seconds" may be meant that any values from 4.9 . . . 4.95 . . . 5 . . . 5.01 . . . 5.05 . . . 5.1 seconds; "about 1.5 mm" may be meant that any values from 1.48 . . . 1.49 . . . 1.5 . . . 1.51 . . . 1.52 mm.

Without intending to be limited by theory, the inventors have, through their own research, trials, and experiments, devised a method for forming a film of graphitic carbon nitride (g-CN), particularly by way of thermal vapor condensation. It is believed that the method of present disclosure would provide a low-cost and highly efficient way of fabrication of large-scale and uniform g-CN film with desired thickness and surface morphology. For example, in an embodiment, the amount of raw materials for said fabrication may be greatly reduced by 10 times. It is also believed that the g-CN films as prepared by the method of the present invention would be a promising candidate for photoelectrochemical (PEC) devices, green energy hydrogen fuel production via photocatalysis, electrocatalysis, lithium-ion batteries, light-emitting diodes (LEDs), chemical sensors, antimicrobial, etc. For example, in some embodiments, the as prepared g-CN film may have an enhanced photocurrent density of about 404.4 µA cm 2 to about 790.5 µA cm$^{-2}$. In some other embodiments, the as-prepared g-CN film may have a solar-to-hydrogen efficiency of about 0.75%.

According to the invention, there is provided a method for forming a film of g-CN by way of thermal vapor condensation. As used herein, the terms "thermal vapor condensation (TVC)" or "thermal condensation" generally denotes a kind of chemical vapor deposition method involving facile heating of (raw) precursor materials in an atmosphere of air for generating vapor-phase precursors to perform multistep gaseous polycondensation reactions. In particular, it is appreciated that TVC as described herein should be distinguished from other thermal disposition processes that require heating the raw materials in an atmosphere of substantially inert gas (e.g. N$_2$) or inert gas (e.g. Ar, He, etc.) and/or decomposing the raw materials for subsequent reaction, such as pyrolysis.

The method may comprise the steps of: a) providing a solid-phase thiourea precursor and a solid-phase melamine precursor in a container; b) covering the container with a first substrate; and c) thermally generating a vapor-phase thiourea source and a vapor-phase melamine source from the solid-phase thiourea precursor and the solid-phase melamine precursor in an air environment thereby forming a layer of g-CN on the first substrate.

In an embodiment, the solid-phase thiourea precursor and the solid-phase melamine precursor may be physically separated by a support substrate. The support substrate may be, for example, positioned at an angle relative to a side of the container. In some embodiments, the support substrate may be positioned at an angle relative to the base (bottom side) of the container, such as from about 30° to about 160°. In some particular embodiments, the support substrate may be positioned at an angle relative to the base (bottom side) of the container of less than 90° such as 30° to 60° (i.e., the support substrate is at a tilted position relative to the bottom side of the container), such that that the solid-phase thiourea precursor may be positioned over the solid-phase melamine precursor or vice versa. It is believed that by positioning the support substrate at an angle described herein, such as at a tilted position might avoid blocking the vapor-phase thiourea source or vapor-phase melamine source generated in step c) from reaching the first substrate, as well as avoiding pressure build up within the container as a result of such blockage.

In a particular embodiment, the support substrate may comprise a layer of solid-phase thiourea precursor, such as a layer of solid-phase thiourea precursor disposed on one of the lateral sides/surfaces of the support substrate. In some more particular embodiments, the support substrate may comprise a layer of solid-phase thiourea precursor formed/disposed on the top and/or bottom side(s) of the support substrate.

In an embodiment, the layer of solid-phase thiourea precursor may be formed on the support substrate by the steps of: heating thiourea solid in deionized water to form a hot saturated thiourea solution; forming a layer of saturated thiourea on the support substrate by at least partially immersing the support substrate in the saturated thiourea solution; and drying the layer of saturated thiourea to obtain the solid-phase thiourea precursor.

In an example embodiment, the hot saturated thiourea solution may be prepared by heating, for example, 18 g of thiourea solid in 20 ml deionized water to a temperature of about 60° C. to about 150° C., particularly, about 120° C. Then, the support substrate may be at least partially immersed in the saturated thiourea for about 2-15 seconds to form a layer of saturated thiourea thereon, followed by drying the layer of saturated thiourea under ambient conditions for, such as 5 mins to obtain the solid-phase thiourea precursor. In particular, the inventors have unexpected devised that by at least partially immersing the support substrate in the saturated thiourea for about 5 seconds, it would consistently obtain a layer of solid-phase thiourea precursor with a thickness of about 1.5 mm, or in other words, with a weight of about 0.6 g.

The support substrate may be of any shape that could fit into the container and may be made of any suitable material that would not react with the solid-phase thiourea precursor and would not decompose upon the subsequent thermal treatment of the present method. For example, in a specific embodiment, the support substrate may be a glass strip.

In some embodiments, the amount (weight) of the solid-phase melamine may be adjusted from about 1 g to about 5 g. That said, in some embodiments, the weight (or mass) ratio of the solid-phase thiourea precursor to the solid-phase melamine precursor may be from about 0.12 to about 0.6 (or from 1:1.67 to 1:8.33).

In some embodiments, the container may be polished for facilitating the capture of vapor-phase thiourea source and vapor-phase melamine source upon the g-CN formation. In some particular embodiments, the container may be a ceramic crucible and its rim may be polished by using an abrasive, such as an abrasive paper (sandpaper), particularly an abrasive paper with electrochemically coated silicon carbide thereon. The meshes of the abrasive paper may be of about 400 Cw to about 1200 Cw. As used herein, "Cw" is a unit of mesh which is defined by sand per unit length.

Preferably, the abrasive paper may be applied successively to polish the ceramic crucible. For example, in an embodiment, the rim may be polished successively with sandpaper of 400 Cw, 800 cW, and 1200 Cw.

In step b), the container may be covered with a first substrate. It is appreciated that the first substrate may act as a support for which the thermally generated vapor-phase thiourea source and the vapor-phase melamine source may deposit thereon for g-CN formation. The first substrate may be of any shape/dimension that is sufficient to cover the (top) opening of the container. Preferably, the first substrate may be made of any suitable material that will not react with the vapor-phase thiourea source and the vapor-phase melamine source and/or will not decompose upon the thermal treatment. Preferably, the first substrate may be a conductive material such as a FTO glass and the like.

Optionally or additionally, the top of the first substrate may be placed with a load for minimizing leakage of the vapor-phase thiourea source and the vapor-phase melamine source upon thermal treatment, thereby facilitating the formation of uniform and homogeneous g-CN film. For example, in an embodiment where the container is a ceramic crucible and the first substrate is a FTO glass, a ceramic plate of, such as about 90.5 g may be placed on top of the FTO glass before commencing the thermal treatment in step c).

Step c) includes the steps of: annealing the solid-phase thiourea precursor and the solid-phase melamine precursor to generate the vapor-phase thiourea source comprising active carboiimide species and the vapor-phase melamine source; and allowing the vapor-phase thiourea source and the vapor-phase melamine source to deposit and react to form the layer of g-CN on the first substrate. In particular, the annealing step may be conducted in an atmosphere of air in a muffle furnace at about 550° C. for about 3 hours, with a heating rate of about 3° C./min.

It is believed that by conducting the annealing step in an atmosphere of air not only simplifies the equipment requirements for g-CN synthesis as compared with the case requiring $N_2$ atmosphere, but also facilitates the g-CN polymerization (g-CN film formation). In particular, the inventors have unexpectedly found that the above annealing step/conditions may lead to the generation of small and active carboiimide species from the solid-phase thiourea precursor to be more preferred over the solid-phase melamine precursor, and the carboiimide species may be anchored on the vapor-phase melamine source one-by-one, leading to the formation of heptazine or even larger-area conjugated structures that is capable for more active carboiimide species to further anchor thereon, forming graphite-like structures.

In an embodiment, the method may further comprise step d) post-annealing the layer of g-CN formed in step c). It is believed that by conducting the post-annealing step, it may improve the film quality/performance of the layer of g-CN formed in step c) such as uniformity, UV-Vis absorption, transient photocurrent density, photostability, etc. Details of the improved film quality/performance as a result of the post-annealing step will be discussed in the later part of the present disclosure. In a particular embodiment, step d) may be conducted in a muffle furnace at about 300° C. for about 30 min, with a heating rate of about 3° C./min.

Optionally or additionally, in step d), the first substrate may be placed with a load as described herein on top of the first substrate.

In some alternative embodiments, each of the solid-phase thiourea precursor and the solid-phase melamine precursor may be in powder form.

In these embodiments, the method may comprise the steps of: preparing a homogeneous mixture of the solid-phase thiourea precursor and the solid-phase melamine precursor by grinding thiourea solid and melamine solid; and transferring the homogeneous mixture to the container for thermal treatment. In particular, the thiourea solid and the melamine solid may have a weight (mass) ratio of about 1-3:3 such as 1:3, 1.2:3, 1.5:3, 1.8:3, 2:3, 2.1:3, 2.5:3, 3:3 and the like.

In an embodiment where the thiourea solid and the melamine solid have a weight ratio of 2:3 (or equivalent to 1:1.5), the respective powder form of precursors may be prepared by grinding 2 g of thiourea solid using an agate motor, followed by mixing with 3 g of melamine solid and further grinding for, such as 20 minutes to obtain a homogeneous mixture. This homogeneous mixture may then be transferred to the container such as a ceramic crucible, particularly a ceramic crucible that is polished as described herein and covered with the first substrate for thermal treatment. As used herein, the term "mixture" generally denotes a material made up of two or more different chemical substances which are not chemically bonded (i.e. the two or more different chemical substances are physically mixed to form the material). It is appreciated that the term "mixture" should be distinguished from the term "composite" used in the art which generally involves creating a new (distinct) material by merging two or more constituent materials.

Similarly, after covering the container with the first substrate in step b), it is optional or additional that a load such as a ceramic plate as described herein may be placed on top of the first substrate for minimizing the leakage of the vapor-phase thiourea and melamine sources.

In these embodiments, step c) may comprise the steps of: annealing the solid-phase thiourea precursor and the solid-phase melamine to generate the vapor-phase thiourea source and the vapor-phase melamine source; and allowing the vapor-phase thiourea source and the vapor-phase melamine source to deposit and react to form the layer of g-CN on the first substrate. In particular, the annealing step may be conducted in a muffle furnace at about 500° C. to about 550° C. for about 3 hours, with a heating rate of about 3° C./min.

According to the invention, it further pertains to a film of g-CN formed by the method as described herein. In some embodiments, where the post-annealing step is conducted, the film of g-CN may comprise an atomic ratio of C:N:O of about 2.3-4.9:1.9-4.8:1, such as 2.31-4.89:1.92-4.79:1, 2.29:–4.91:1.89-4.81:1 and the like. In particular, the film of g-CN may have an atomic ratio of C:N of about 1.25 to about 1.45. The g-CN film as prepared in these embodiments may comprise a plurality of nanoporous and mesoporous structures. In particular, these g-CN film may further comprise a plurality of nanoflakes on the film surface, which is believed to be the constituting units for the nanoporous and mesoporous structures. In some embodiments, the plurality of nanoflakes may have a length of about 7 μm to about 13 μm, such as 7.4 μm, 7.9 μm, 8.1 μm, 9.3 μm, 10.4 μm, 11.9 μm, 12.5 μm, 13.4 μm and the like. Furthermore, the g-CN film as prepared in these embodiments may have a thickness of about 2.5 μm to about 4.3 μm, such as 2.5 μm, 2.6 μm, 3 μm, 3.3 μm, 3.6 μm, 4 μm, 4.2 μm, 4.3 μm and the like.

In some other embodiments, where the film of g-CN may be formed from the respective powder form of the solid-phase thiourea precursor and the solid-phase melamine precursor, the film of g-CN may comprise an atomic ration of C:N:O of about 3.9-7.5:4-7.9:1, such as 3.91:4.01:1, 6.88:7.49:1, 6.68:7.03:1, 7.48:7.92:1 and the like. The g-CN film as prepared in these embodiments may comprise a plurality of nanosheets that are at least partially stacking with each other. Optionally or additionally, the g-CN film as prepared in these embodiments may comprise a plurality of nanoflowers on the film surface. In particular, the plurality of nanosheets may include nanomesh structures or sheet-like structures. It is believed that the nanomesh structures may facilitate the photocatalytic activity of the g-CN film as those structures would provide a readily accessible channel for reactant adsorption and/or active sites for reaction. Furthermore, the g-CN film as prepared in these embodiments may have a thickness of about 2.81 μm to about 3.21 μm, such as 2.81 μm, 2.85 μm, 2.88 μm, 2.90 μm, 2.93 μm, 3.01 μm, 3.10 μm, 3.21 μm and the like.

It is believed that the g-CN film as prepared by the method as described herein is capable of undergoing photoelectrochemical (PEC) reaction. In particular, it is believed that with the thickness of micrometer scale, it might facilitate sunlight absorption of the g-CN films for generating more charge carriers, thereby it might have a better carrier mobility and PEC performance. For example, in some embodiments, the film of g-CN may have a transient photocurrent density of about 51.4 μA cm$^{-2}$ to about 404 μA cm$^{-2}$ upon chopped simulated AM 1.5G illumination at 1.23V vs. RHE in 0.1 M KOH electrolyte with 10% triethanolamine. In some other embodiments, the film of g-CN may have a transient photocurrent density of about 298.6 p A cm$^{-2}$ to about 790.5 μA cm$^{-2}$ upon chopped simulated AM 1.5G illumination at 1.23V vs. RHE in 0.1 M Na$_2$SO$_4$ electrolyte with 10% triethanolamine. In some further embodiments, the film of g-CN may be capable of generating hydrogen gas by way of photoelectrocatalytic water splitting. For example, in an embodiment where the film of g-CN may have an atomic ratio of C:N:O of 7.48:7.92:1, the film may have a solar-to-hydrogen conversion efficiency of about 0.75% upon operation in 0.1 M Na$_2$SO$_4$ electrolyte with 10% triethanolamine. Details of the PEC performance of the g-CN films of the present invention will be discussed in the later part of the disclosure.

Hereinafter, the present invention is described more specifically by way of examples, but the present invention is not limited thereto.

EXAMPLES

Materials

All chemicals were purchased from Sigma-Aldrich Co. LLC including thiourea (CH$_4$N$_2$S), melamine (C$_3$H$_6$N$_6$), sodium sulphate (Na$_2$SO$_4$), potassium hydroxide (KOH), triethanolamine (TEOA), acetone (C$_3$H$_6$O), ethanol (C$_2$H$_6$O), isopropanol (C$_3$H$_8$O), and FTO glass (50×50×2.2 mm$^3$, 8 Ωsq$^{-1}$), which are used without further treatment. Before use, the FTO glass is cleaned by ultrasonication with deionized water, acetone, ethanol, and isopropanol for 20 minutes each. The rim of the ceramic crucible was polished with abrasive paper electrochemically coated with silicon carbide (400, 800 and 1200 Cw, 230 mm×280 mm) in advance, to facilitate the deposition of the chemical vapor during the g-CN synthesis.

Characterization

Structural analyses are investigated using the powder X-ray diffraction (XRD) method with Cu $K_\alpha$ radiation ($\lambda$=1.5406 Å) in Bruker D2 Phaser with Lynxeye detector. In all samples, the XRD patterns are measured with the function of 2θ from 10° to 80° in a step size of 0.02°. Fourier transform infrared spectra (FTIR) were obtained using a Perkin Elmer spectrum II spectrometer in a reflection mode. High-magnification surface morphology of thin films is conducted using JEOL scanning electron microscopy (SEM). The morphology was further characterized using a JEOL JEM 2100F field-emission scanning transmission electron microscope (TEM). X-ray photoelectron spectroscopy (XPS) data and surface film composition were recorded by a Thermo Fisher Scientific USA Model ESCALAB 250XI spectrometer with Al $K_\alpha$ radiation. The C Is peak calibrated the peak positions at 284.5 eV. The $Ar^+$ sputtering rate for the XPS depth profile was 2.1 nm $min^{-1}$. Ultraviolet-visible (UV-Vis) spectra were recorded on a PerkinElmer Lambda 1050+UV/VIS/NIR Wide Band Spectrometer. The calculated UV-Vis spectrophotometer may be used to clarify the microstructure and energy-level configuration of fabricated g-CN films. Photoluminescence spectra (PL) were obtained from Time Resolved Fluorescence-Edinburgh Instruments FLS980.

Photoelectrochemical Performance Measurements

The photoelectrochemical (PEC) performance of the fabricated g-CN films was characterized by using a three-electrode electrochemical workstation (CHI 760E, Shanghai Chenhua Limited, China) with the g-CN film as the working electrode, an Ag/AgCl electrode as the reference electrode, and platinum foil as the counter electrode. The light-chopped linear sweep voltammetry (LSV) curves recorded under a 150 W Xe lamp light source (Newport) with an AM 1.5G filter and an intensity of 100 mW $cm^{-2}$. Before checking the PEC performance, the films were cut and sealed with epoxy resin to make an effective conductive area between the photoelectrode and electrolyte round about 0.5 $cm^2$. Four different electrolytes were used, including 0.1M $Na_2SO_4$ with (pH 10.36) or without (pH 7.4) 10% triethanolamine (TEOA) (a sacrificial reagent), and 0.1M KOH with (pH 12.5) or without (pH 12.8) 10% TEOA. The referenced potentials vs. Ag/AgCl can be converted into the RHE scale using the Nernst equation at 25° C.:

$$E_{RHE} = E_{Ag/AgCl} + 0.059 \times pH + 0.197 \tag{1}$$

All 1 $cm^2$ g-CN based photoanodes were irradiated from the sample side (front illumination).

Hydrogen gas production from solar water splitting was determined by gas chromatograph in 50 mL 0.1M $Na_2SO_4$ solution with 10% TEOA with the same system of PEC measurement. The external applied potential of about 0.42 V (calculated from equation (1)) was provided using electrochemical workstation (CHI 760E).

Nyquist plots were attained at open circuit voltage conditions in a frequency range from 0.1 Hz to 100 kHz and with AC voltage of 10 mV. Mott-Schottky plots involved measuring the space charge layer capacitances ($C_{sc}$) of g-CN films upon applied bias according to:

$$\frac{1}{C_{sc}^2} = \frac{2}{\varepsilon_r \varepsilon_o A^2 e N_d}\left(E - E_{fb} - \frac{kT}{e}\right) \tag{2}$$

Where $\varepsilon_r$, $\varepsilon_0$, e, and A are the relative permittivity of the semiconductor, the vacuum permittivity, the charge of an electron, and the effective surface area of the semiconductor, respectively, whereas $N_d$ is the free carrier density, E stands for the applied potential and $E_{jb}$ is the flat band potential, k denotes the Boltzmann constant, and Tis the absolute temperature. Mott-Schottky plots were developed in the dark with a sinusoidal modulation at a frequency of 3000 Hz.

$H_2$ gas production of g-CN photoanodes was measured in three-electrode configurations for 2 hours using a gas chromatograph. Additionally, the ideal gas production can be calculated based on Faraday's law of water electrolysis using the following equation (3):

$$FE_{H_2} = \frac{\alpha n(mol)F}{Q(C)} \times 100\% \tag{3}$$

where, $\alpha$ is the number of electrons transferred (2 for $H_2$). n is the actual amount of $H_2$ (mol), F is the faraday constant of about 96485 C $mol^{-1}$, and Q is the total charge.

The solar-to-hydrogen (STH) efficiency can be calculated from the current I through the system as follows:

$$STH - \frac{I\left(mAcm^{-2}\right) \times 1.23V \times FE_{H_2}}{P_{light}\left(mAcm^{-2}\right)} \times 100\% \tag{4}$$

where, I is the measured current in a three-electrode configuration, $FE_{H2}$ is the faradaic efficiency of hydrogen production, and Plight is the power density of incident light (100 mA $cm^{-2}$ in this work).

Example 1A

Fabrication of g-CN Film, g-CN-MxT0.6 (x=1-5)

It is believed that melamine may serve as a substrate to anchor small species to grow into larger-area conjugated structures. Also, it is believed that the chemical reactions between different mass ratios of the two precursors: melamine and thiourea (TU), may affect the polymerization of g-CN, which in turn affecting the microstructure as well as the PEC performance of the g-CN film.

Figure 1:
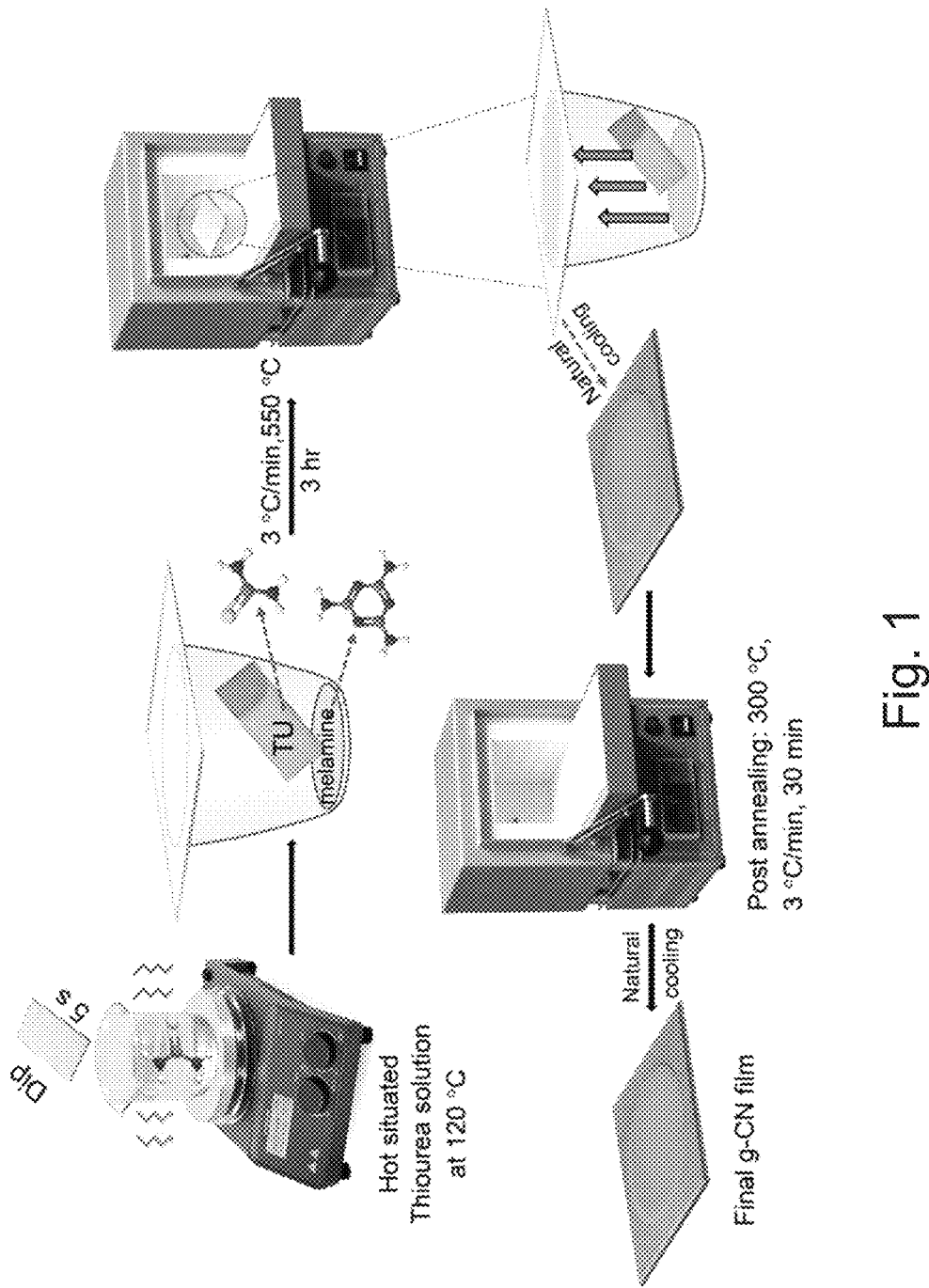
FIG. 1 shows a schematic diagram illustrating the preparation of a g-CN film derived from melamine and thiourea precursors by TVC method in accordance with an embodiment of the invention.
Figure 2:
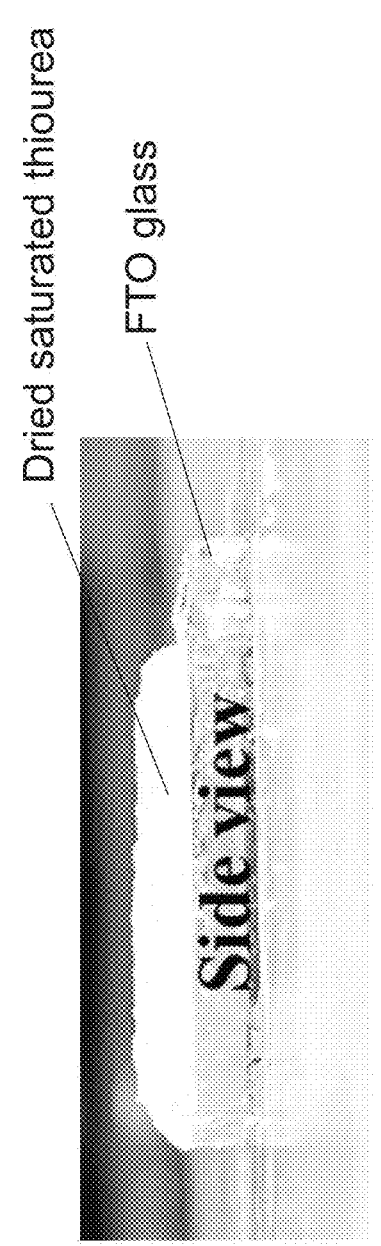
FIG. 2 shows a photograph illustrating the side view of a FTO glass deposited with a solid thiourea precursor by drying a layer of saturated thiourea.

In this embodiment, the g-CN film, g-CN-MxT0.6 (x=1-5), is prepared by the method as illustrated in FIG. 1. Specifically, 18 g TU was stirred in 20 ml deionized water, and then was gradually heated until 120° C. to obtain a completely transparent hot saturated solution. A piece of strip glass was immersed into the hot saturated TU solution for 5s to deposit TU in an area of 1×1.5 $cm^2$ (equivalent to ~0.6 g) and then dried for 5 mins at room temperature. Then, this TU-coated glass (FIG. 2) was placed obliquely in a 25 ml ceramic crucible containing 1, 2, 3, 4, or 5 g of melamine respectively at the bottom. The mass ratio of melamine to TU is 3:0.6, 4:0.6, or 5:0.6, respectively. The top of the crucible was covered with a 5×5 $cm^2$ FTO glass to deposit the g-CN film. Optionally, a ceramic plate weighing about 90.5 g is placed on the FTO glass for minimizing vapor loss upon subsequent calcinating process. Next, this crucible was calcinated in an atmosphere of air with ambient pressure (i.e., not filling with any specific gas(es) such as nitrogen, argon and the like) in a muffle furnace (Carbolite) from room temperature to 550° C. at a heating rate of 3° C. min$^{-1}$, kept at 550° C. for 3 hr, and then naturally cooled to room temperature. In particular, it is believed that with the use of air atmosphere instead of, such as N$_2$ or other inert gas atmosphere, as well as the muffle furnace for calcination may simplify the equipment requirement and reduce the fabrication cost upon large-scale fabrication/production of the g-CN-MxT0.6 film.

To improve the film quality, the fabricated g-CN film was post-annealed at 300° C. for 30 min at the same heating rate, and then naturally cooled to room temperature again. Finally, a very uniform, yellowish, and stable g-CN film can be obtained. For comparison, a g-CN-M3T0.6 film without post-annealing (i.e. g-CN-M3T0.6') was also prepared.

The fabricated films were named as g-CN-M1T0.6, g-CN-M2T0.6, g-CN-M3T0.6, g-CN-M4T0.6, and g-CN-M5T0.6, since they were respectively derived from 1, 2, 3, 4, and 5 g of melamine and 0.6 g of TU. As a blank reference, the g-CN film prepared from 10 g melamine without TU is named g-CN-M10.

Example 1B

Fabrication of g-CN Film, CNMT-x-t (x=1-3, t=500 or 550)

In this embodiment, melamine was used as the precursor for growing the (pristine) g-CN film on FTO glass denoted as CNM. The mela/thio-g-CN (denoted as CNMT-x-t, where x represents the precursors proportion, and t denotes the (annealing) temperature) films were created from melamine and thiourea powders via the thermal vapor condensation (TVC) method.

Figure 3:
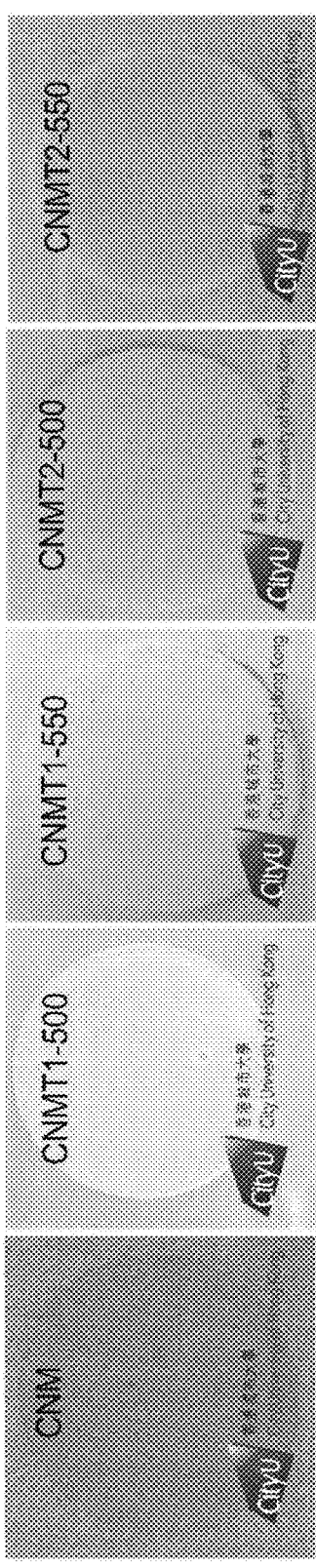
FIG. 3 shows the photographs of g-CN film (CNM, CNMT1-500, CNMT1-550, CNMT2-500, CNMT2-550) fabricated in accordance with an embodiment of the invention.

Specifically, for the pristine g-CN, 10 g of melamine was placed in the finely polished crucible, and treated FTO glass was placed over it. A ceramic plate weighing about 90.5 g is placed on the FTO glass before subsequent calcinating process. Afterward, the crucible was calcinated in a muffle furnace (Carbolite) at 550° C. for 3 hours with a temperature rate of 3° C./min. The resultant g-CN was named CNM. To prepare the mela/thio-g-CN, three amounts of thiourea (1 g, 2 g or 3 g) were ground using an agate motor to get a fine powder. Then it was mixed with 3 g of melamine, and the grinding was continued for extra 20 minutes to get a homogeneous powder, then it was moved to the ceramic crucible and covered by FTO glass. A ceramic plate weighing about 90.5 g is placed on the FTO glass before subsequent calcinating process. Then the as-prepared setup was calcinated at two different temperatures (500° C. and 550° C.) for 3 hours each (temperature increasing rate: 3° C./min). The corresponding films were assigned to be CNMT1-500, CNMT1-550, CNMT2-500, CNMT2-550, and CNMT3-550. The weight ratio 1:1.5 of thiourea and melamine stands for 1, and 1:1 stands for 2, and 1:3 stands for 3. The appearance of the as-prepared CNM, CNMT1-500, CNMT1-550, CNMT2-500, and CNMT2-550 are shown in FIG. 3.

Example 2A

Structural Characterization of g-CN-MxT0.6

Figures 4A, 4B, 4C, 4D, 4E:
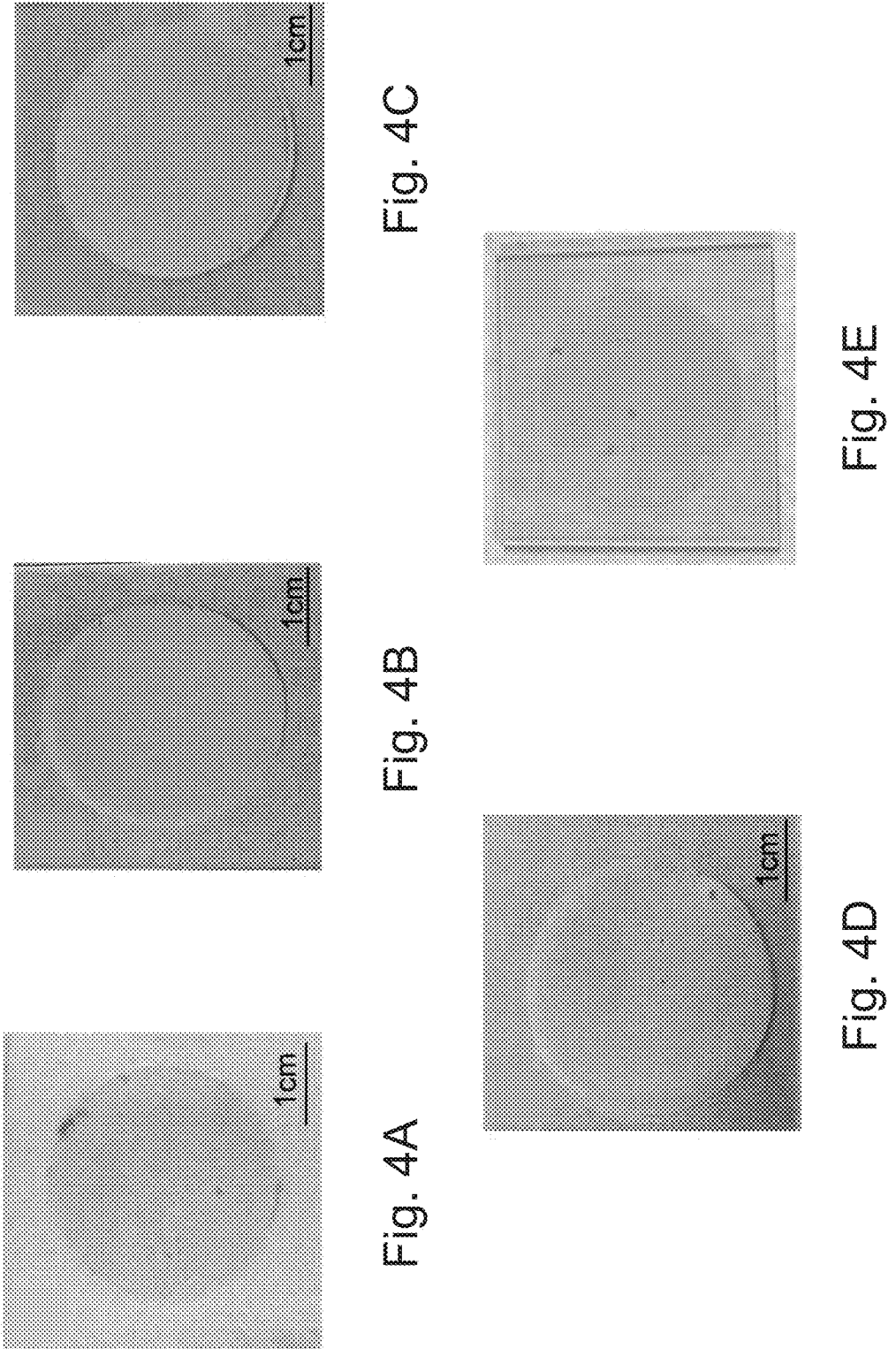
FIG. 4A shows the photograph of g-CN-M10 film deposited on FTO glass.
FIG. 4B shows the photograph of g-CN-M3T0.6 film deposited on FTO glass.
FIG. 4C shows the photograph of g-CN-M4T0.6 film deposited on FTO glass.
FIG. 4D shows the photograph of g-CN-M5T0.6 film deposited on FTO glass.
FIG. 4E shows the photograph of g-CN-M3T0.6' film (i.e., g-CN-M3T0.6 without post-annealing) deposited on FTO glass.
Figure 5B:
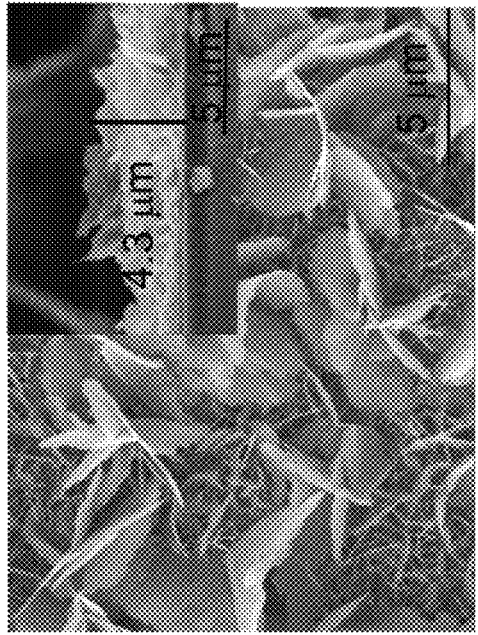
FIG. 5B shows the SEM image of g-CN-M3T0.6 with the insert being the cross-sectional image.
Figure 5A:
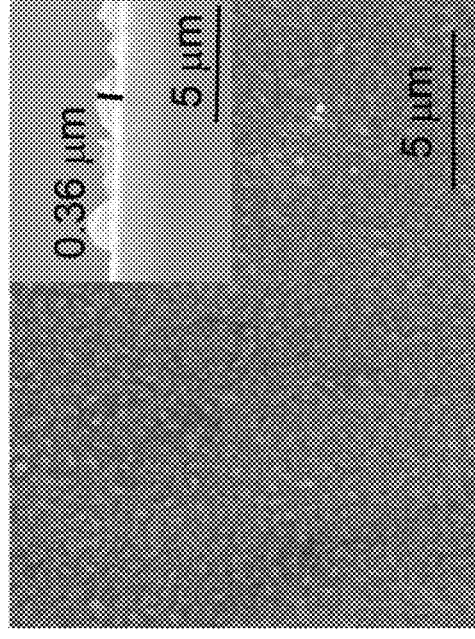
FIG. 5A shows the SEM image of g-CN-M10 with the insert being the cross-sectional image.
Figure 5D:
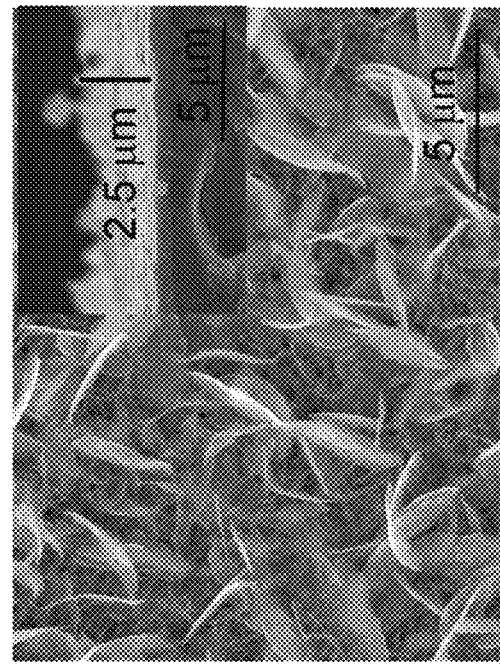
FIG. 5D shows the SEM image of g-CN-MST0.6 with the insert being the cross-sectional image.
Figure 5C:
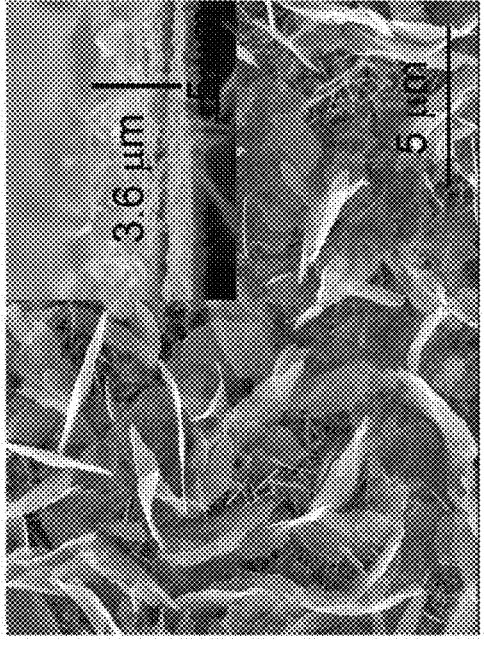
FIG. 5C shows the SEM image of g-CN-M4T0.6 with the insert being the cross-sectional image.

The pinhole-free and uniform-colour distribution on four films of g-CN-M10, g-CN-M3T0.6, g-CN-M4T0.6, g-CN-M5T0.6 (FIGS. 4A to 4D) indicates a completely continuous and homogeneous surface nature. In contrast, some pinholes are observed on the g-CN-M3T0.6' film (FIG. 4E), which has not post-annealed, suggesting the importance of post-annealing step for improving the quality of g-CN-MxT0.6 film. The thinner g-CN-M10 does not look as yellowish as the others. From the cross-sectional images of SEM (FIGS. 5A to 5D), the thicknesses of g-CN-M10, g-CN-M3T0.6, g-CN-M4T0.6, g-CN-M5T0.6 films are estimated to be 0.36, 4.3, 3.6, 2.5 μm, respectively. It appears that the significant difference in film thickness of g-CN may be derived from the use of melamine precursor alone and melamine-thiourea precursor.

To allow the comprehensive comparison of the film thickness, longer condensation time and more precursor amount were further attempted to get thicker g-CN film from melamine. As shown in FIGS. 6A to 6F, it is realized that the g-CN film derived from melamine cannot be prepared to be as thick as that from melamine-thiourea precursor. Among all the g-CN films derived from melamine precursor, g-CN-M10 presents the best PEC performance (FIG. 6F). It suggests that the noncovalent adsorption of g-CN-M10 on FTO is so poor that the g-CN film prepared using 10 g melamine is much thinner than those using 3, 4, 5 g melamine and 0.6 g TU.

Figure 7A:
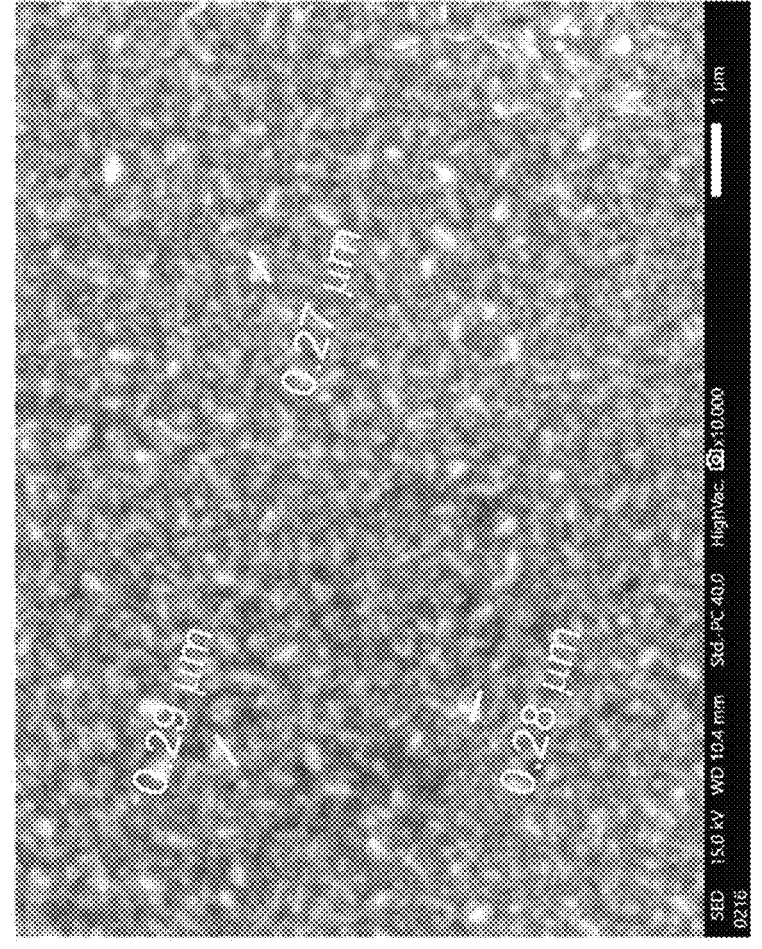
FIG. 7A shows the SEM image of g-CN-M10 with a scale bar of 1 μm.
Figure 7B:
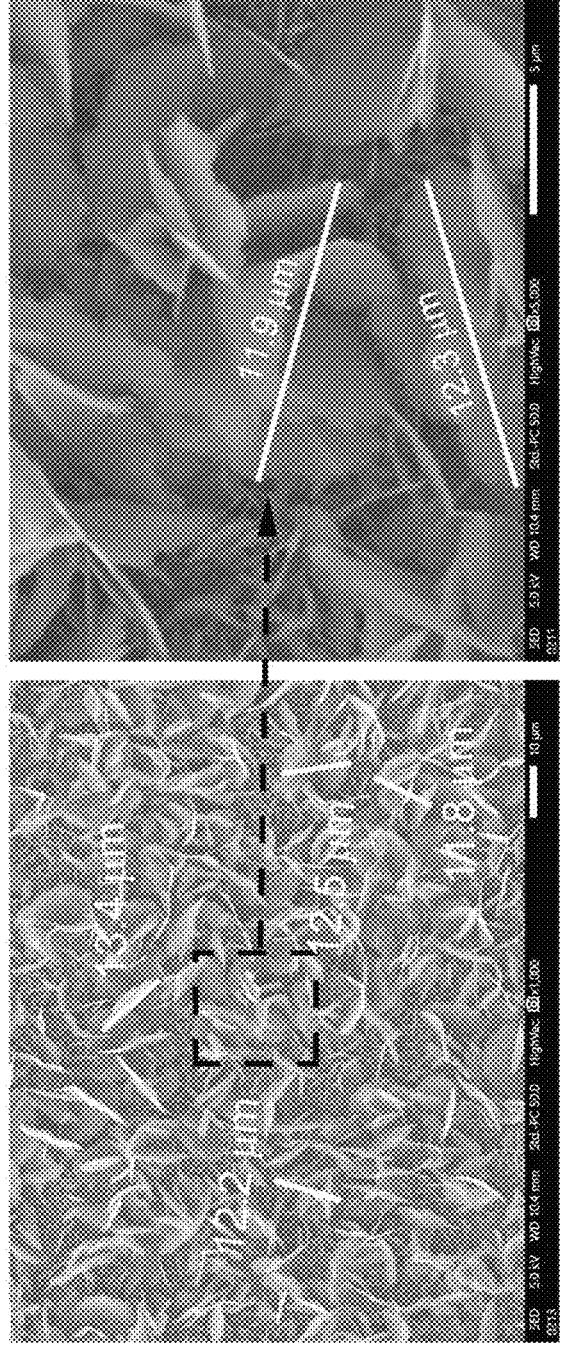
FIG. 7B shows the SEM images of g-CN-M3T0.6 with a scale bars of 10 μm and 5 μm.
Figure 7D:
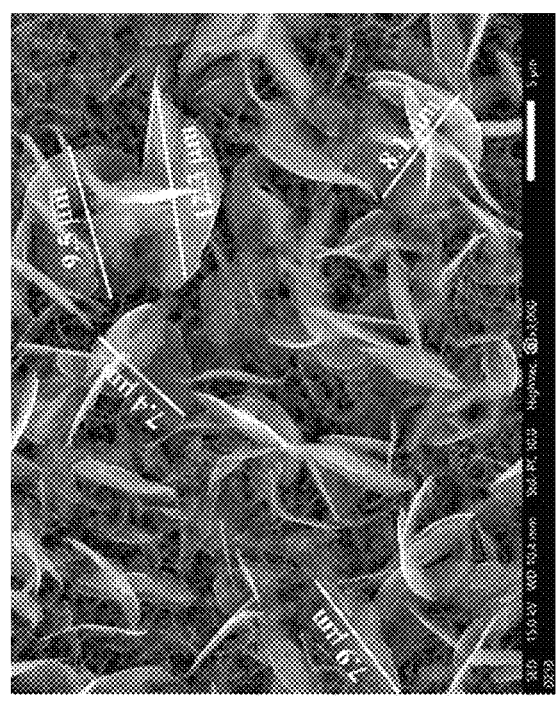
FIG. 7D shows the SEM images of g-CN-MST0.6 with a scale bar of 5 μm.
Figure 7C:
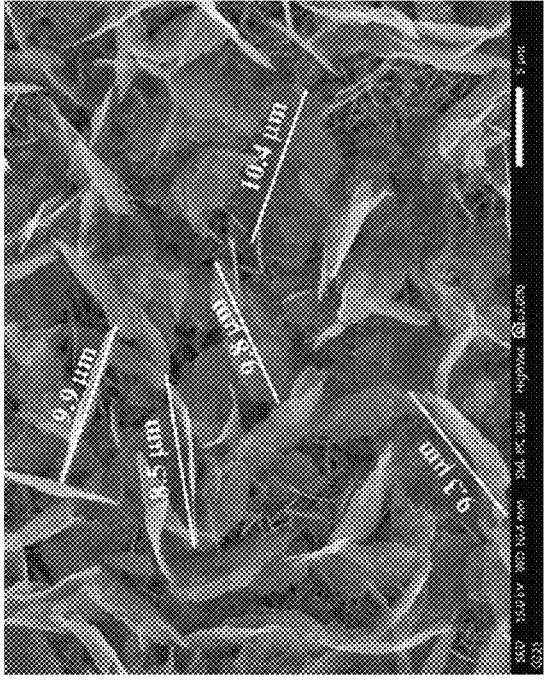
FIG. 7C shows the SEM images of g-CN-M4T0.6 with a scale bar of 5 μm.

The particle size of g-CN-M10 film (FIG. 7A) is ~0.3 μm, much smaller than that of g-CN-M3T0.6 (FIG. 7B), in which 12-13 μm nanoflakes well adhere to FTO substrates. The lengths of nanoflakes of g-CN-M4T0.6 and g-CN-M5T0.6 (FIGS. 7C and 7D) are mostly less than 10 μm when larger amount of melamine powders react with 0.6 g TU. It is believed that the poorer polymerization of g-CN-M10 may lead to smaller particle sizes. Therefore, the larger nanoparticles generate the stronger noncovalent interaction (e.g., I-x stacking) between the polymer fragments and between the fragment and FTO glass, to prevent the deposited film from falling to the crucible bottom so as to remain the thicker film on FTO glass. Such a striking difference in morphologies of g-CN films derived from individual melamine and melamine-TU precursors suggests different reaction mechanisms may be present in these two cases.

Figure 8B:
FIG. 8B shows the TEM image of g-CN-M3T0.6.
Figure 8A:
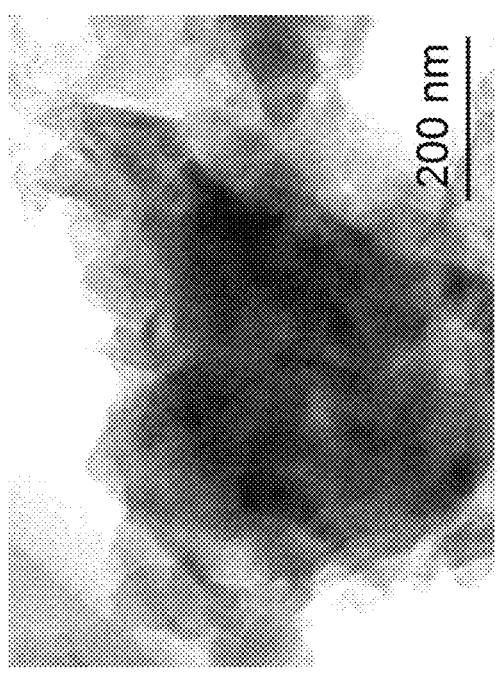
FIG. 8A shows the TEM image of g-CN-M10.
Figure 8D:
FIG. 8D shows the TEM image of g-CN-M5T0.6, with the nanoporous and mesoporous structures emphasized.
Figure 8C:
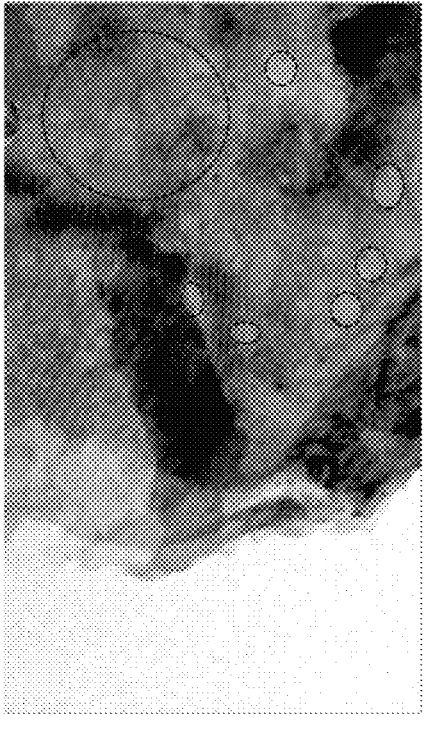
FIG. 8C shows the TEM image of g-CN-M4T0.6, with the nanoporous and mesoporous structures emphasized.
Figure 8F:
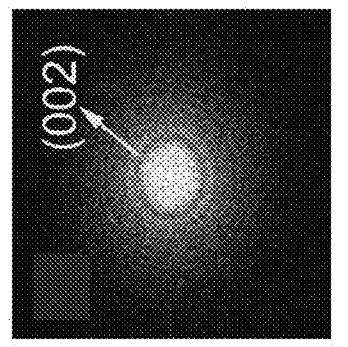
FIG. 8F shows the Fast Fourier transform pattern of g-CN-M3T0.6.
Figure 8G:
FIG. 8G shows the average interlayer distance estimated in g-CN-M3T0.6.
Figure 8E:
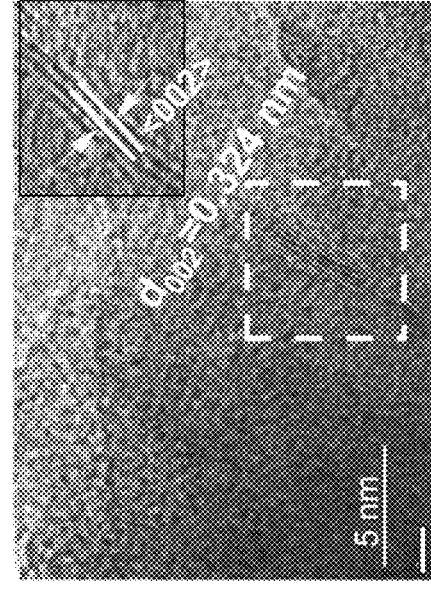
FIG. 8E shows the HRTEM image of g-CN-M3T0.6 with the insert being the magnified image of the selected area (dashed square) and the assignment of lattice fringes.

As shown in the TEM images (FIGS. 8A to 8D), the g-CN structures of the three g-CN-M3T0.6, g-CN-M4T0.6, g-CN-M5T0.6 films mostly end in curly edges, which are actually part of the nanoflakes observed in SEM images. In particular, the surface of g-CN-M3T0.6 (FIG. 8B) is enriched in nanoporous and mesoporous structures, which are more than g-CN-M4T0.6 (FIG. 8C) and g-CN-M5T0.6 (FIG. 8D) films. It is believed that nanopores are active sites that can enhance light harvesting and provide a ready channel for the adsorptions of outer species to achieve the chemical reactions gratifying PEC capabilities. The further magnification of the thickest g-CN-M3T0.6 film by the high-resolution TEM image (FIG. 8E) clearly displays the side view of π-π stackings of (002) planes (i.e. the conjugated structures in g-CN), corresponding to the diffraction circle given in the fast Fourier transform pattern (FIG. 8F). The (002) interplanar spacing in the lattice fringe is estimated to be 0.324 nm (FIG. 8G), in agreement with previous studies.

Figure 9A:
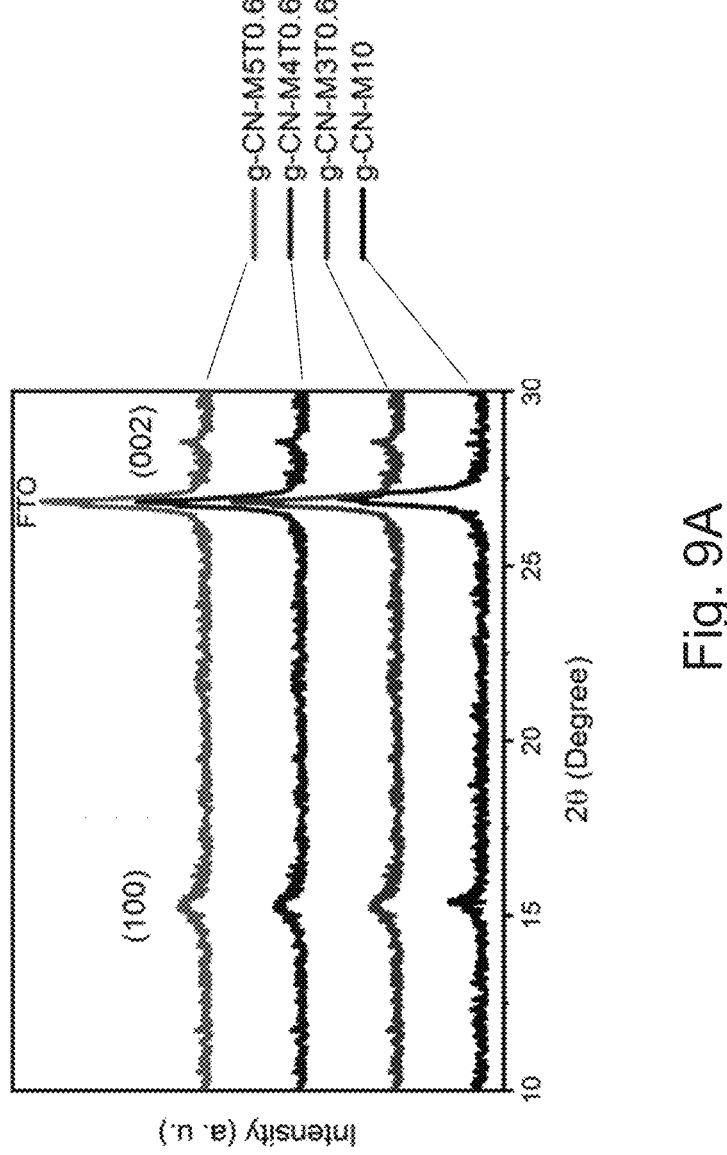
FIG. 9A shows the XRD patterns of g-CN-M10, g-CN-M3T0.6, g-CN-M4T0.6, and g-CN-M5T0.6 samples.

The X-ray diffraction (XRD) patterns (FIG. 9A) show the (002) peaks at ~27.8° and (100) peaks at ~15.1° for all samples, which are assigned to the interlayer stacking of conjugated structures and the in-plane structural motif repeat of the g-CN unit. The (100) and (002) peak intensities in g-CN-M3T0.6, g-CN-M4T0.6, g-CN-M5T0.6 samples are all comparable, demonstrating that there are substantial g-CN polymers containing larger conjugated structures sticking on the FTO glass. By contrast, the (100) and (002) peak intensities of g-CN-M10 are lower than the other three samples, showing that there are fewer g-CN crystalline fragments in g-CN-M10. This may be attributed to the poor crystallinity and thinner film thickness of g-CN-M10 derived from melamine precursor.

Figure 9B:
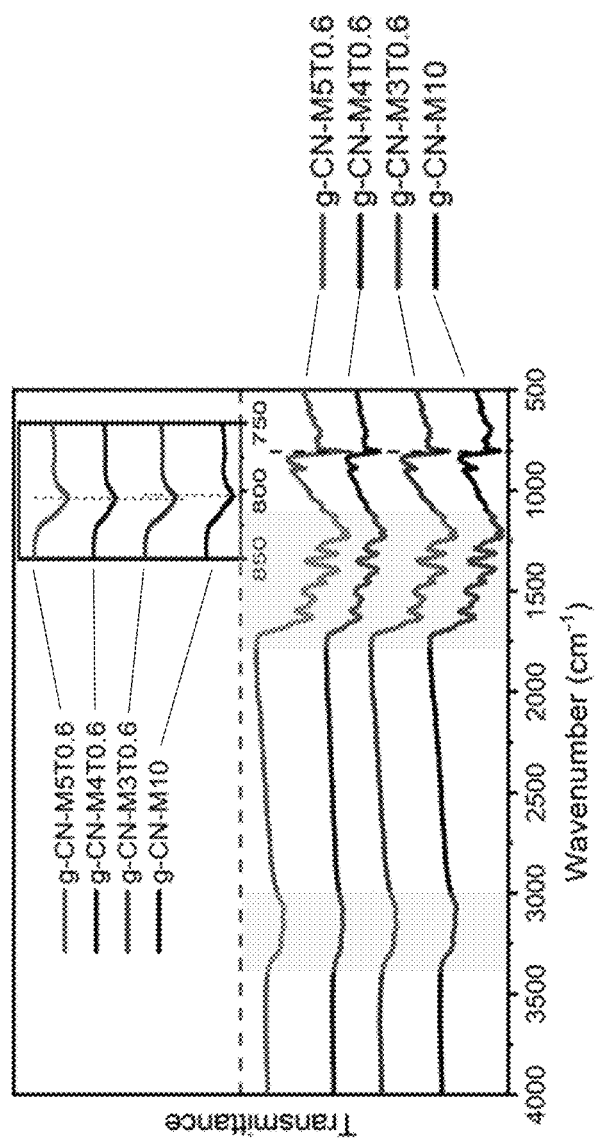
FIG. 9B shows the FTIR spectra of g-CN-M10, g-CN-M3T0.6, g-CN-M4T0.6, and g-CN-MST0.6 samples.

The chemical functional groups in four g-CN samples are characterized by FTIR spectra (FIG. 9B). The representative peak appearing at 805 cm$^{-1}$ is ascribed to the typical out-of-plane breathing vibration of s-triazine units, confirming the intact skeleton structure of g-CN. Notably, the 805 cm$^{-1}$ peaks (FIG. 9B, insert) of g-CN-M3T0.6, g-CN-M4T0.6, g-CN-M5T0.6 relative to g-CN-M10 are blue-shifted, which is attributed to the more s-triazine units in three samples resulting in stronger vibration resonance. The prominent bands at 1200-1620 cm$^{-1}$ corresponding to the typical stretching vibrations of C—N bonds in heterocyclic units, and the peaks at 2900-3300 cm$^{-1}$ associated with the O—H stretching, N—H and C—H vibrating in the uncondensed-NH$_2$ groups.

Figure 10:
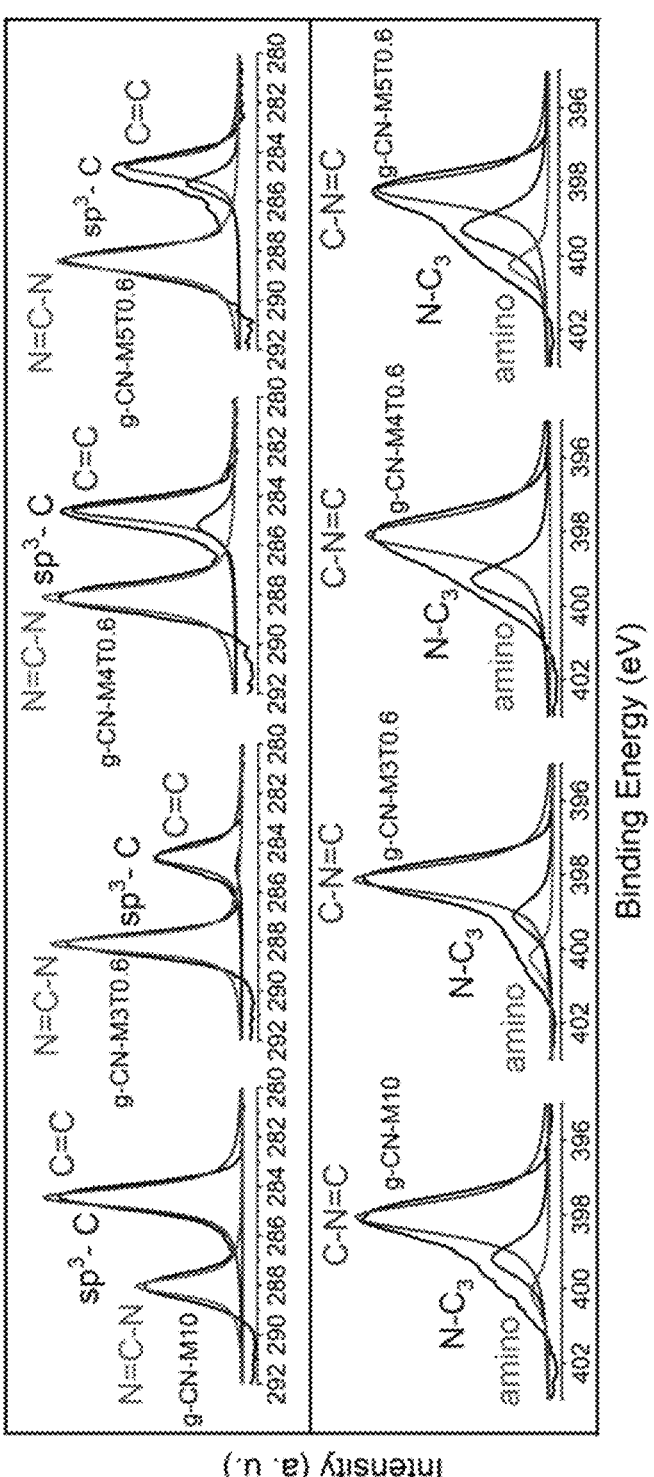
FIG. 10 shows the C 1s (top) and N 1s (bottom) core level XPS spectra of g-CN-M10, g-CN-M3T0.6, g-CN-M4T0.6, and g-CN-M5T0.6 samples.

In the C 1s (FIG. 10, top) of X-ray photoelectron spectroscopy (XPS), two major peaks located at 288.5 and 284.6 eV are assigned to the conjugated N=C—N bonds in the g-CN backbone and the sp$^2$ contaminations of C=C bonds (e.g. N-missing from C=N—C), and a minor peak located at 285.3 eV is assigned to the contaminations of sp$^3$-C (e.g. C—C). In comparison, the intensities of N=C—N peaks in g-CN-M3T0.6, g-CN-M4T0.6, and g-CN-MST0.6 are remarkably higher than their respective contaminant peaks, which proves that there are substantial conjugated structures in the g-CN derived from melamine and TU precursors. In particular, the peak intensities of C=C and sp$^3$-C contaminations in g-CN-M3T0.6 are the weakest relative to its N=C—N peak, indicating that its g-CN conjugated structure is the most ideal. The stronger peak intensity of C=C bonds in g-CN-M10 than its C=N—C peak indicates that the g-CN derived from melamine has the worst polymerization.

FIG. 11 shows the chemical compositions of C and N in four samples, which shows that all g-CN films are C-rich. The g-CN-M3T0.6 derived from the least amount of melamine (only 3 g) has the highest N concentration, i.e., fewest N defects inside, consistent with the C Is of XPS (weakest C=C peak). It is believed that the chemical reactions in the case of g-CN-M3T0.6 would be most favourable for achieving a large-area conjugated structure, which may facilitate a best charge carrier mobility in a PEC cell.

Figure 12:
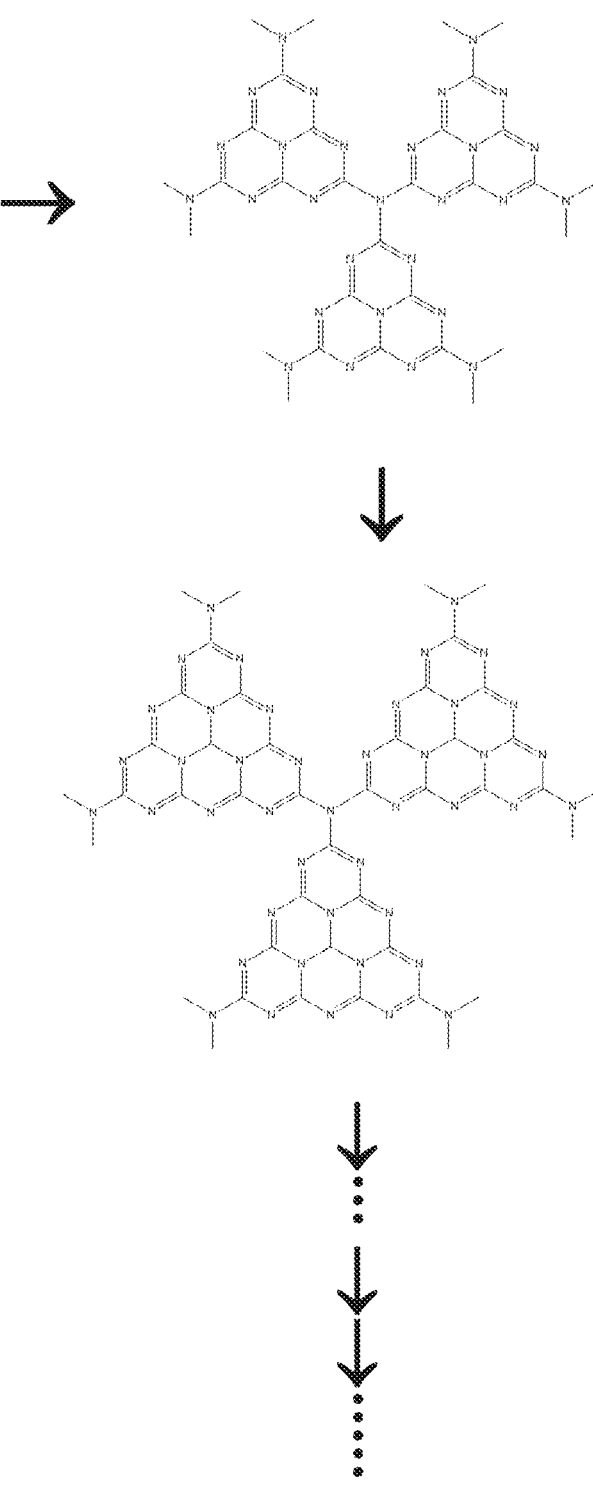
FIG. 12 is a schematic diagram illustrating the potential g-CN allotropes with conjugated structure units from small to large (i.e. with the increase of polymerization degree) approaching graphite-like structure, derived from melamine and thiourea utilizing the TVC method in accordance with an embodiment of the invention.

In the N Is spectra (FIG. 10, bottom), three XPS peaks at 398.2, 399.4, 400.7 eV are ascribed to sp$^2$-N in C=N—C bonds, the tertiary-N in N—C$_3$ group, and the amino groups (e.g. C—NH—C/C—NH$_2$), respectively. The existence of C=N—C and N—C$_3$ bonds usually suggests the existence of triazine and/or tri-s-triazine units. Again, g-CN-M3T0.6 has the greatest difference between its C=N—C and N—C$_3$ peaks among four samples, indicating that the largest-area conjugated structure may be formed in g-CN-M3T0.6 with the highest polymerization degree and getting closer to the graphite-like CN structure (FIG. 12).

Example 2B

Structural Characterization of CNMT-x-t

Figure 13B:
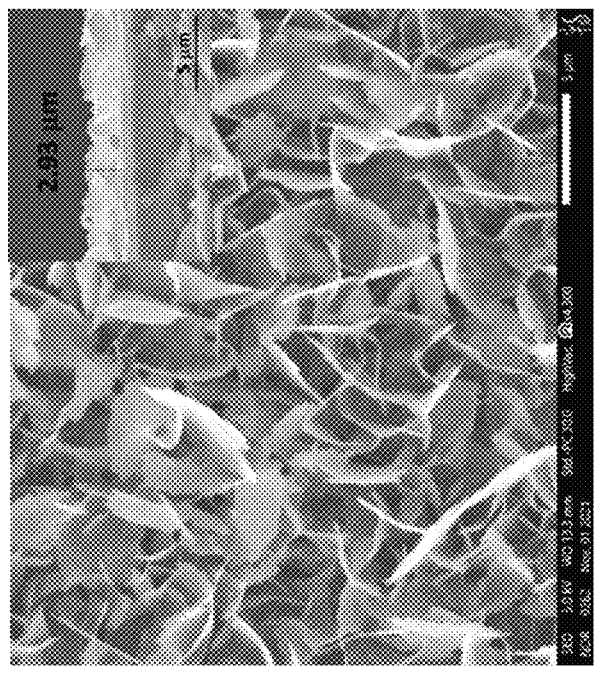
FIG. 13B shows the SEM image of CNMT1-500 with the insert being the cross-sectional image.
Figure 13A:
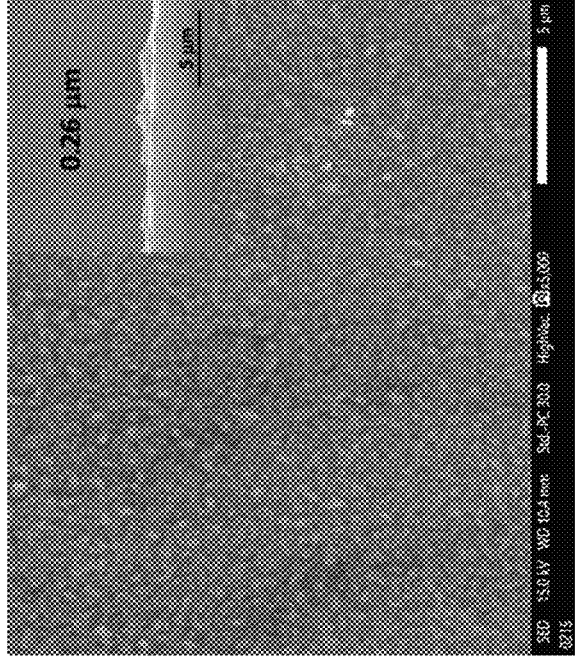
FIG. 13A shows the SEM image of CNM with the insert being the cross-sectional image.
Figure 13D:
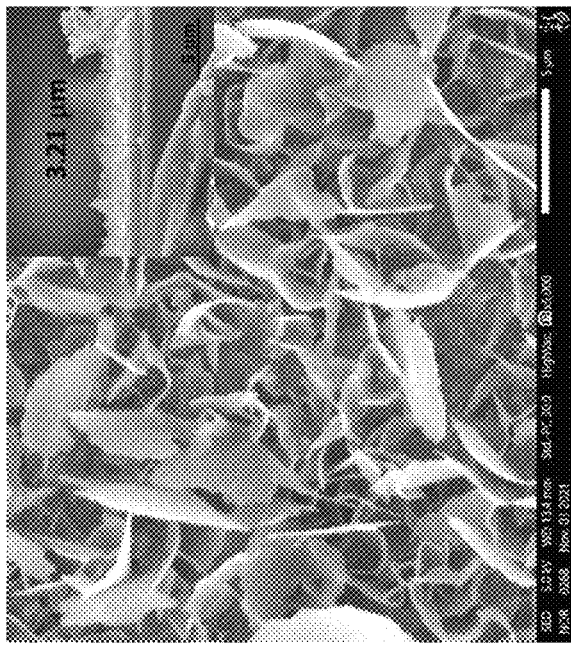
FIG. 13D shows the SEM image of CNMT2-500 with the insert being the cross-sectional image.
Figure 13C:
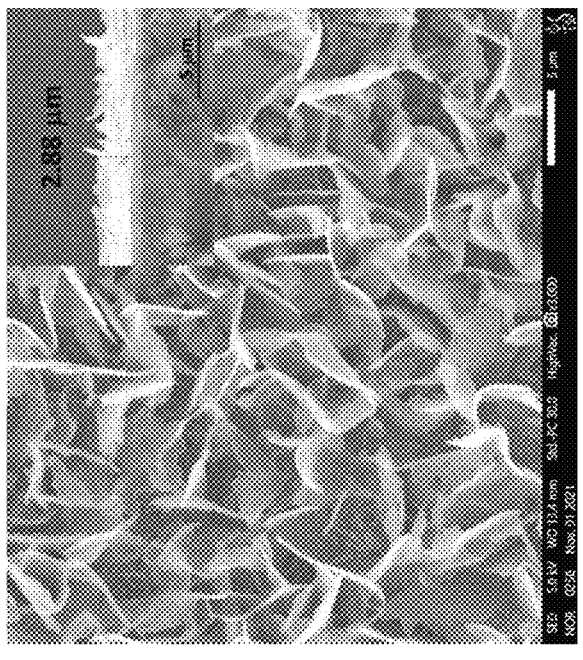
FIG. 13C shows the SEM image of CNMT1-550 with the insert being the cross-sectional image.
Figure 13E:
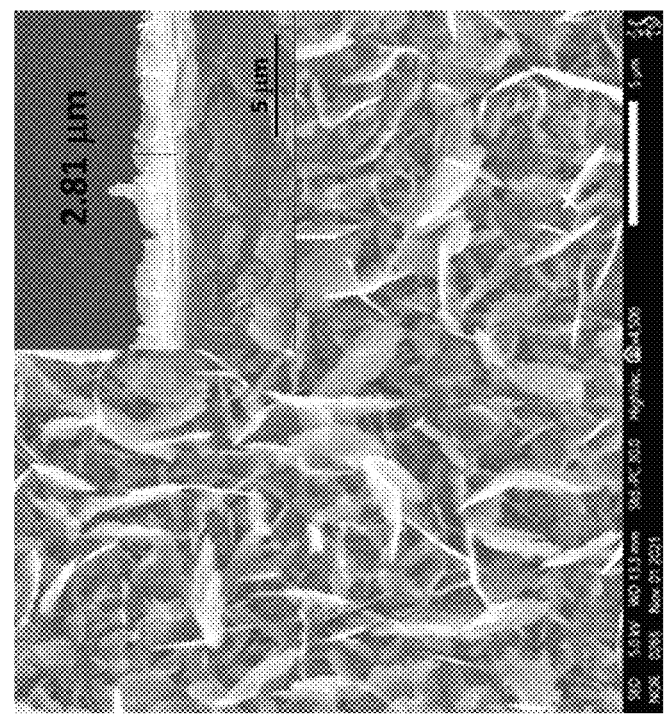
FIG. 13E shows the SEM image of CNMT2-550 with the insert being the cross-sectional image.

The SEM images (FIGS. 13A to 13E) illustrate the morphology of CNM and the fabricated CNMT films, which are uniform and pinhole-free. Extensive nanoflowers are uniformly planted on the surfaces of CNMT films (FIGS. 13B to 13E), whereas the CNM film consists of continuous nanoparticles (FIG. 13A). The size of nanoflowers is significantly enlarged compared with the nanoparticles of CNM film. It is believed that the large surface area may lead to increased photocatalytic activity and light absorption. For the CNMT2-550 (FIG. 13E), it appears that there are fewer nanoflowers than other CNMT films, and it is believed it might affect the PEC performance.

Figure 14:
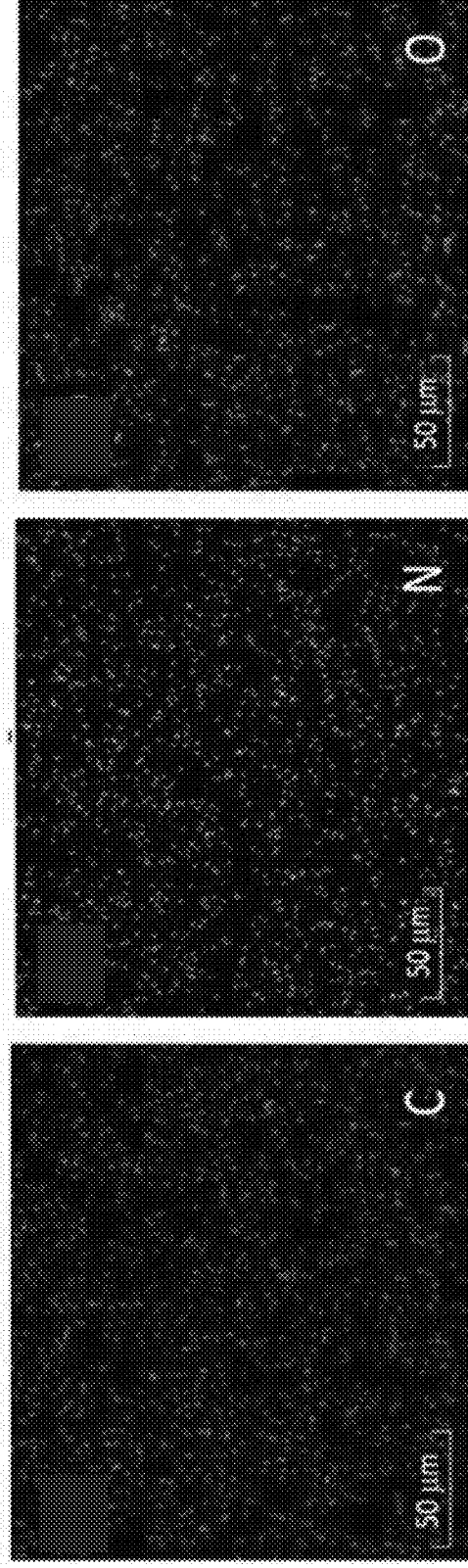
FIG. 14 shows the elemental mapping of CNMT1-500.

Cross-sectional SEM images (FIGS. 13B to 13E, inserts) show a uniform thickness of the films attached to the FTO glass surface. The film thicknesses of CNM and CNMT1-500, CNMT1-550, CNMT2-500, and CNMT2-550 are 0.26 μm, 2.93 μm, 2.88 μm, 3.21 μm, and 2.81 μm, respectively. Evidently, CNMT films are thicker, around 11 times than CNM films. On the one hand, it can be seen that the thickness values of the as-synthesized mela/thio-g-CN films are nearly the same, implying that the different weight ratios of precursors and temperatures do not influence the film thickness. The element mapping (FIG. 14) confirms that the CNMT1-500 film is uniformly distributed with C, N, and O elements.

Figure 15B:
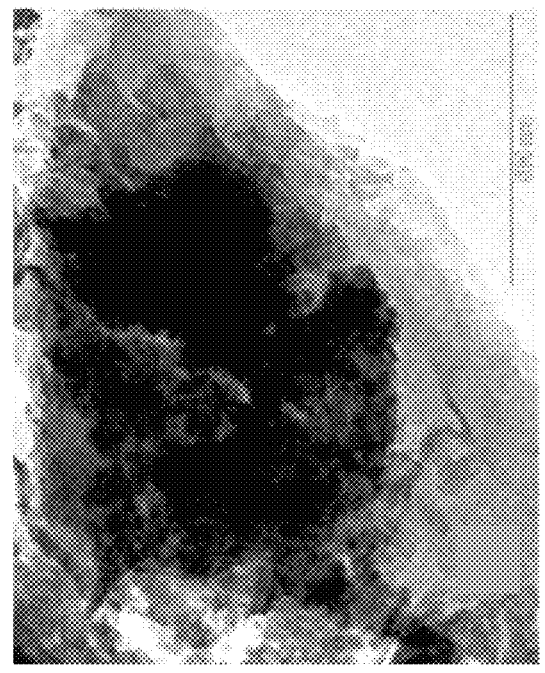
FIG. 15B shows the TEM image of CNM.
Figure 15A:
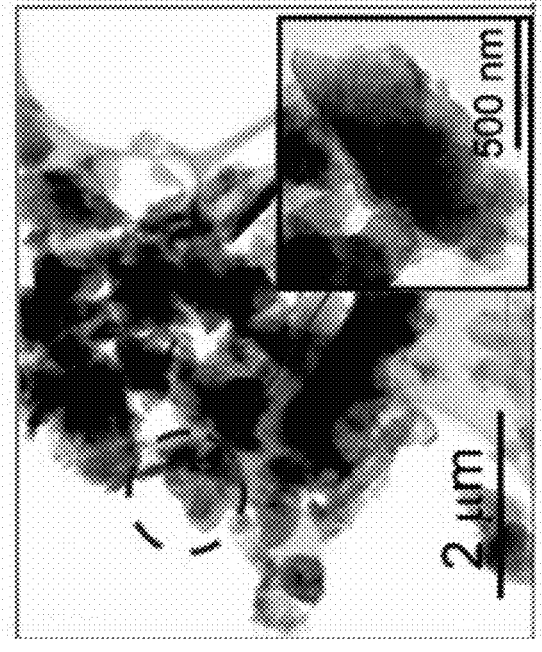
FIG. 15A shows the TEM image of CNMT1-500.
Figure 15D:
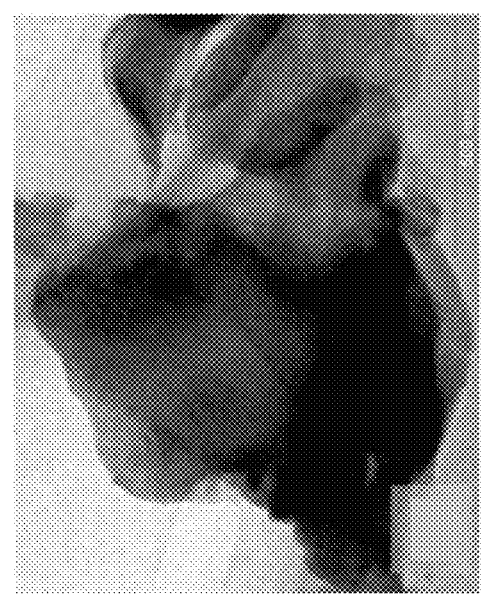
FIG. 15D shows the TEM image of CNMT2-500.
Figure 15C:
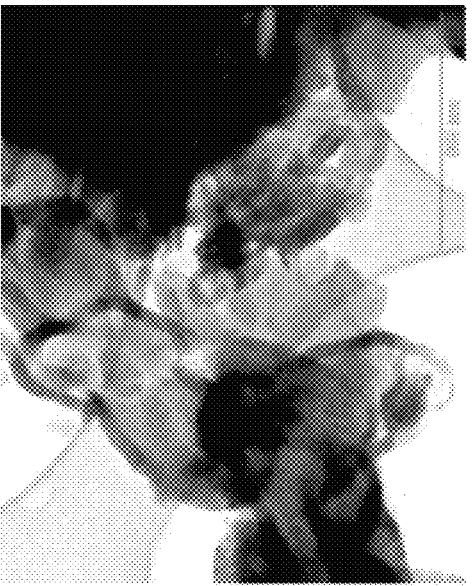
FIG. 15C shows the TEM image of CNMT1-550.
Figure 15E:
FIG. 15E shows the TEM image of CNMT2-550.
Figure 16B:
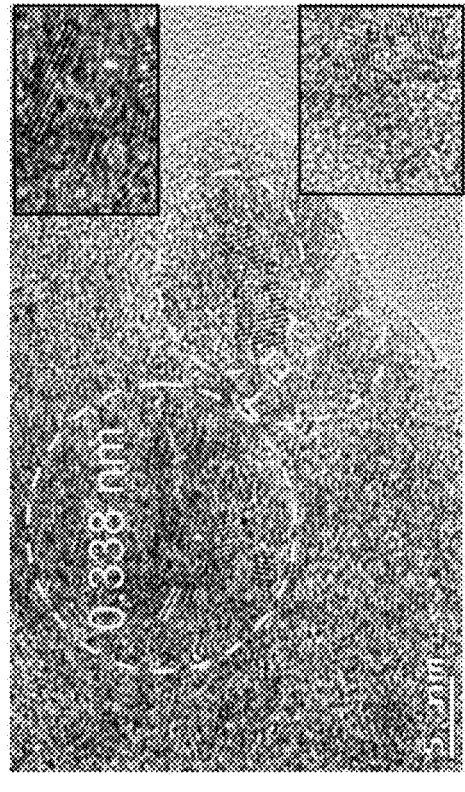
FIG. 16B shows the magnified HRTEM image of the selected area of FIG. 16A, with the inserts being the magnified images of the circular selected area illustrating interlayer fringes of CNMT1-500.
Figure 16A:
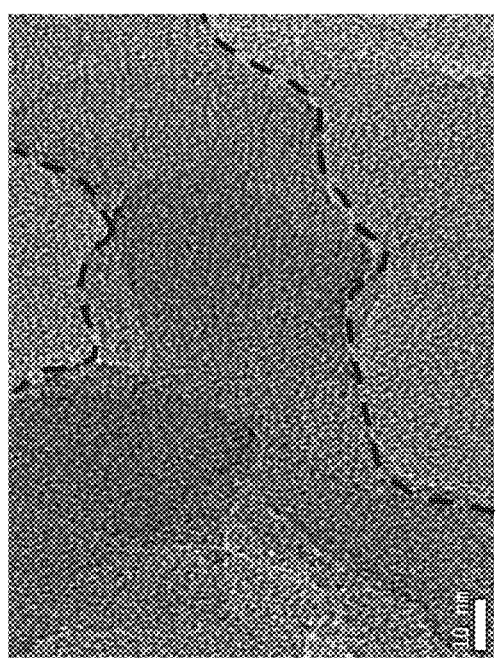
FIG. 16A shows the HRTEM image of CNMT1-500.

TEM analysis was conducted to characterize the morphologies further and confirm the formation of two kinds of g-CN films from different precursors. The morphology of synthesized CNMT1-500, CNM, CNMT1-550, CNMT2-500, and CNMT2-550 (FIGS. 15A to 15E) end with curly edges, consistent with SEM results. In detail, the nanosheet of CNMT1-500 (FIG. 15A) consists of wrinkle-like nanomesh structure. It is believed that such structure is beneficial for photocatalytic activity because it provides a ready access channel for reactant adsorption and more surface active sites for reaction, and thus an enhanced photocurrent density (see discussion below). The CNM film (FIG. 15B) was composed of much denser and thicker layers, whereas CNMT1-550, CNMT2-500, and CNMT2-550 (FIGS. 15C to 15E) show thinner sheet-like structures. It is believed that the distinctive morphologic difference is because of the different molecular structures of melamine and thiourea. It is also believed that the heteroatoms in melamine and the additional sulphur in thiourea may stimulate the processing of carbon nitride condensation and the formation of nanostructures. The appearance of newly formed mela/thio-g-CN CNMT1-500 film is shown in the HRTEM image (FIG. 16A), demonstrating the sheet stacking structure and confirming the well-intact interfacial contact between the two g-CN layers. The clear lattice fringe with a d-spacing of 0.338 nm corresponding to the (002) plane is observed (FIG. 16B).

Figure 17:
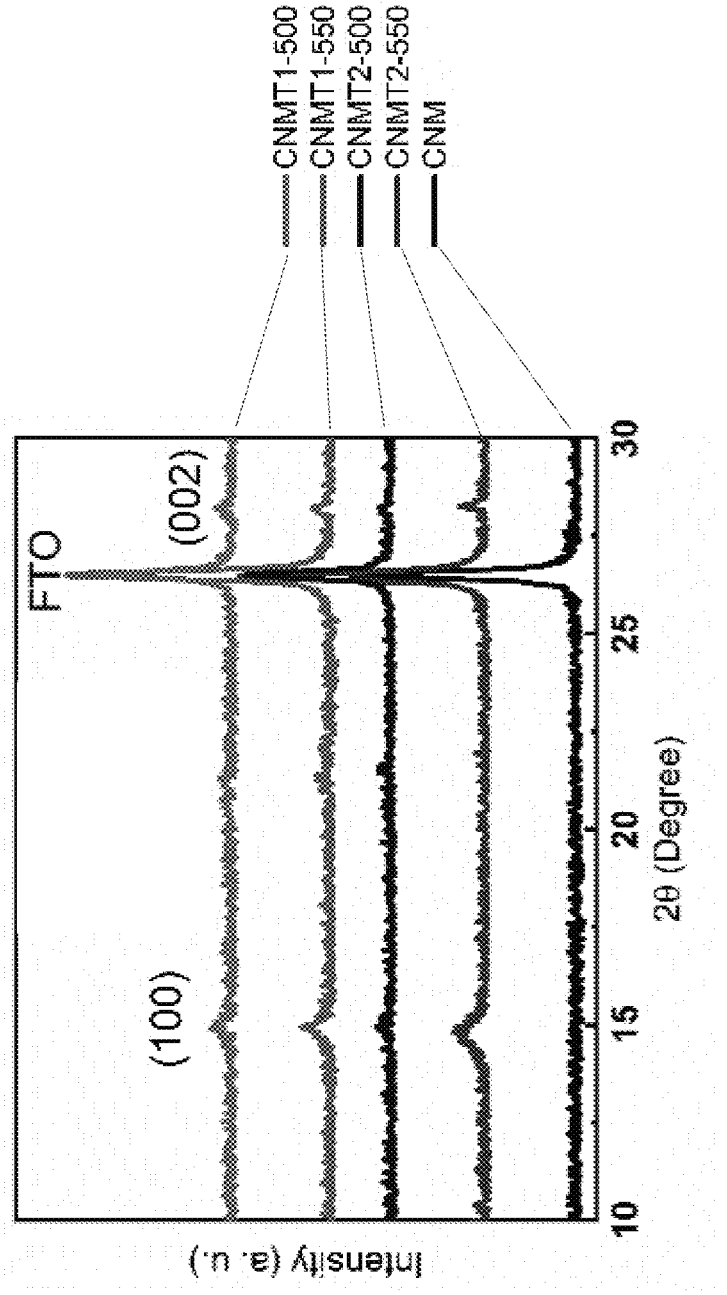
FIG. 17 shows the XRD patterns of CNM, CNMT1-500, CNMT1-550, CNMT2-500, and CNMT2-550.

The diffraction patterns of CNM, CNMT1-500, CNMT1-550, CNMT2-500, and CNMT2-550 films were characterized by XRD (FIG. 17). The characteristic peak of all mela/thio-g-CN samples exhibits a distinct peak at 28.1°, attributed to the (002) plane of g-CN. Whereas owing to the weak signal, the peak of the CNM sample can't be observed, which may be caused by the thinness of the film as described in SEM results (FIG. 13A, insert). Particularly, CNMT films possess a stronger signal indicating the higher crystallinity and larger polymerization degree derived from the reaction of melamine and thiourea. Meanwhile, CNMT1-500 shows the highest intensity peak among the candidates, implying the highest degree of crystallinity. Another reflection peak at 14.9° is attributed to the in-plane heptazine repeating units corresponding to the (100) plane. Interestingly, the intensities of (100) peaks seem stronger than those of (002), suggesting that CNMT films might consist of the higher percentage of tri-s-triazine units.

Figure 18:
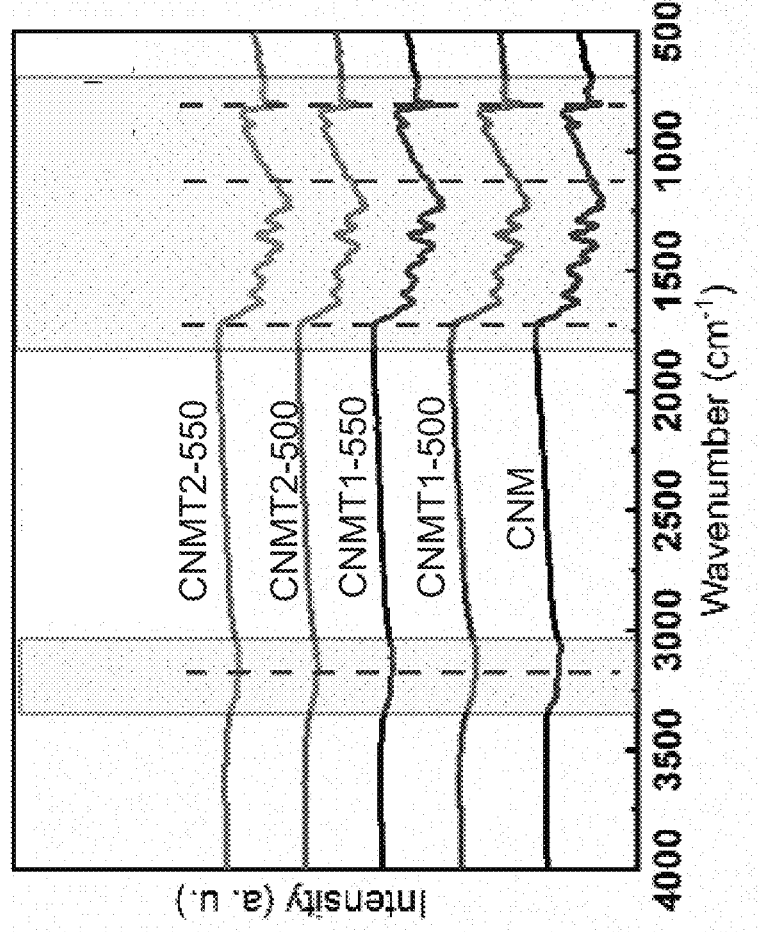
FIG. 18 shows the FTIR spectra of CNM, CNMT1-500, CNMT1-550, CNMT2-500, and CNMT2-550.

The FTIR analysis of all samples was performed to reveal the structure variation (FIG. 18). In detail, the peak at around 810 cm$^{-1}$ originates from the out-of-plane bending vibration of the heptazine ring system. The second absorption bands, observed at 900 cm$^{-1}$ to 1800 cm$^{-1}$, are assigned to the typical C—N(—C)—C vibration in the heterocycle or bridging C—NH—C units. Finally, the broadband between 3000

$cm^{-1}$ and 3500 $cm^{-1}$ is attributed to the stretching vibration of amino (—NH) and/or hydroxyl (—OH) groups. All the IR bands of the CNM are in good accordance with the CNMT samples, which manifests that the chemical structures of mela/thio-g-CN candidates are nearly identical to that of CNM. Therefore, it can be concluded from the XRD and FTIR studies that the new g-CN films (CNMT films) prepared from two precursors retain the internal crystal structure of g-CN from melamine.

Figure 19A:
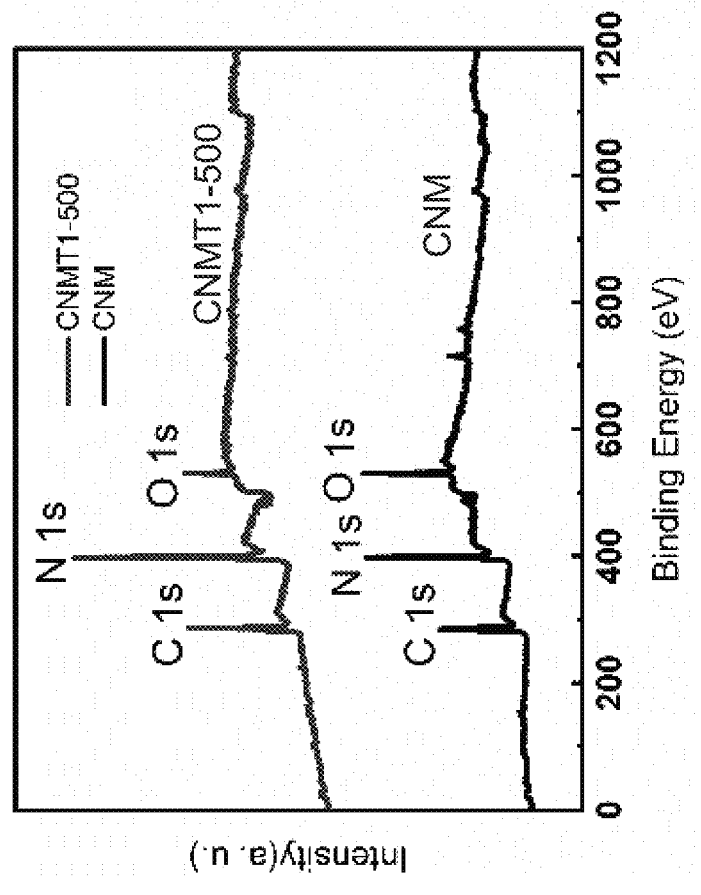
FIG. 19A shows the XPS spectra survey of CNM and CNMT1-500.
Figure 19C:
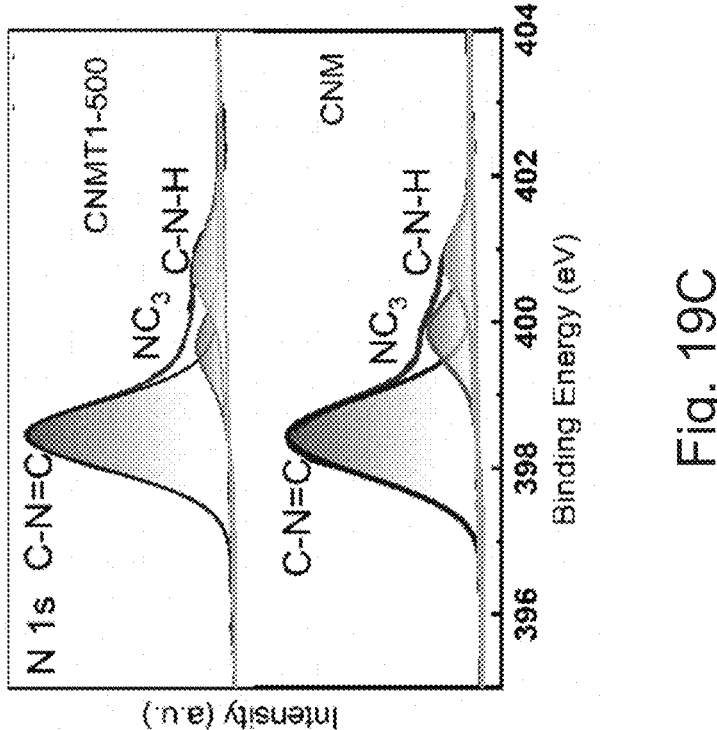
FIG. 19C shows the XPS spectra of N 1s of CNM and CNMT1-500.
Figure 19B:
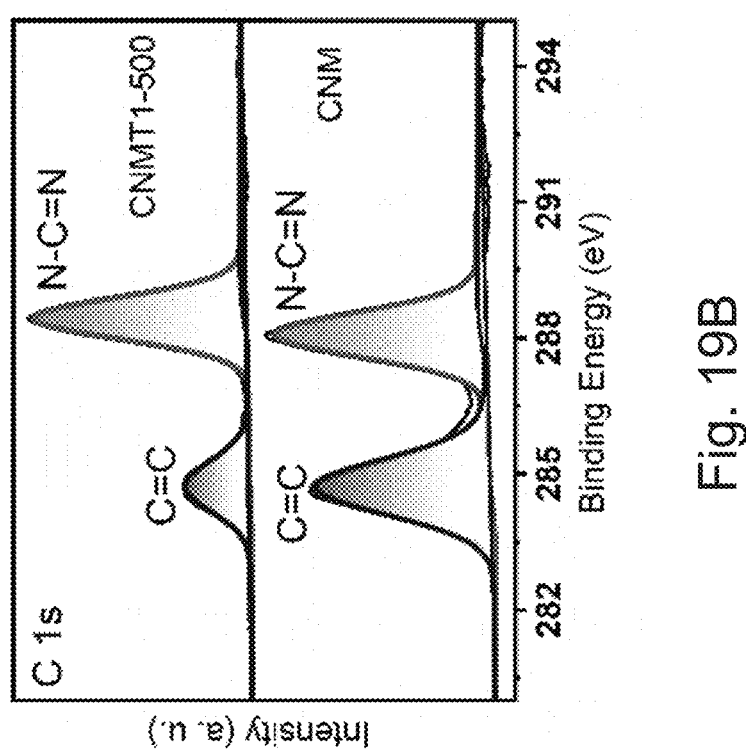
FIG. 19B shows the XPS spectra of C 1s of CNM and CNMT1-500.
Figure 19D:
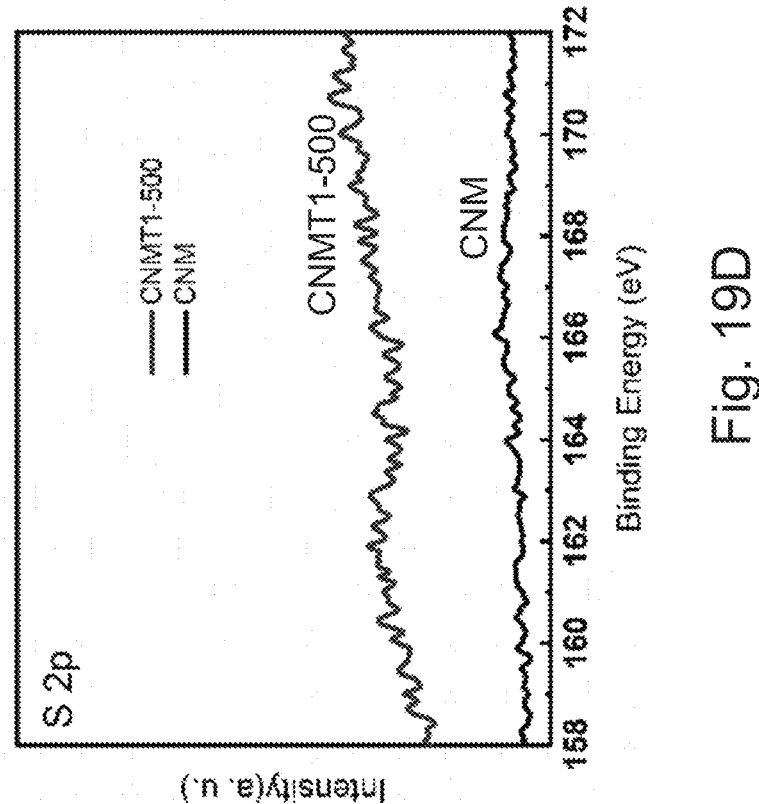
FIG. 19D shows the XPS spectra of S 2p of CNM and CNMT1-500.

X-ray photoelectron spectroscopy (XPS) was also investigated to understand the elemental chemical composition and oxidation states in the fabricated films. The as-synthesized films are mainly composed of carbon, nitrogen, and oxygen elements (FIG. 19A). High-resolution Cls and Nls spectra were carried out in order to gain a clear insight about the bonding properties in CNM and CNMT1-500 films. The Cls and Nls spectra were deconvoluted into various lines corresponding to different binding energy (FIGS. 19B and 19C). The C Is spectra show two peaks located at 288.1 cV and 284.6 eV, which belong to graphitic carbon N—C=N and C—C bond coordination. Compared with the CNM, the (C—C) units of adventitious carbon species in the spectrum of CNMT1-500 have been reduced at the signal at 284.6 eV, suggesting that a lower portion of C—C bonds is observed with inferior carbon content, presumably in the form of C=C bonds besides the presence of g-CN domains. Moreover, the N—C=N peak in CNMT1-500 moves to higher binding energy from 288.1 eV to 288.4 eV, indicating the slightly changed local arrangement of C atoms. In the N Is spectra (FIG. 19C), three prominent peaks can be convoluted at 398.4 eV, 399.3 eV, and 400.6 eV. These peaks can be assigned to $sp^2$ C—N=C bonds, the tertiary nitrogen N—$C_3$ groups, and the amino groups (C—NH—C and C—$NH_2$), respectively, while a peak at 403.9 eV is assigned to charging effects, redistribution of extra electrons and carbon configuration transfer. No predominant sulphur(S) peaks can be detected in S 2p spectra (FIG. 19D) for CNM and CNMT1-500. This indicates the complete release of sulphur from thiourea during the heating treatment. The composition of every element in all synthesized samples is presented in FIG. 20. A small amount of adventitious oxygen was also detected due to oxygen functional groups. The nitrogen peak is more intense in the CNMT1-500 spectrum than in CNM (FIGS. 19A and 20). Therefore, according to the overall XPS results, it can be concluded that nitrogen-rich g-CN was formed without doping any elements in this work.

Example 3A

Photophysical Properties of g-CN-MxT0.6

Figure 21A:
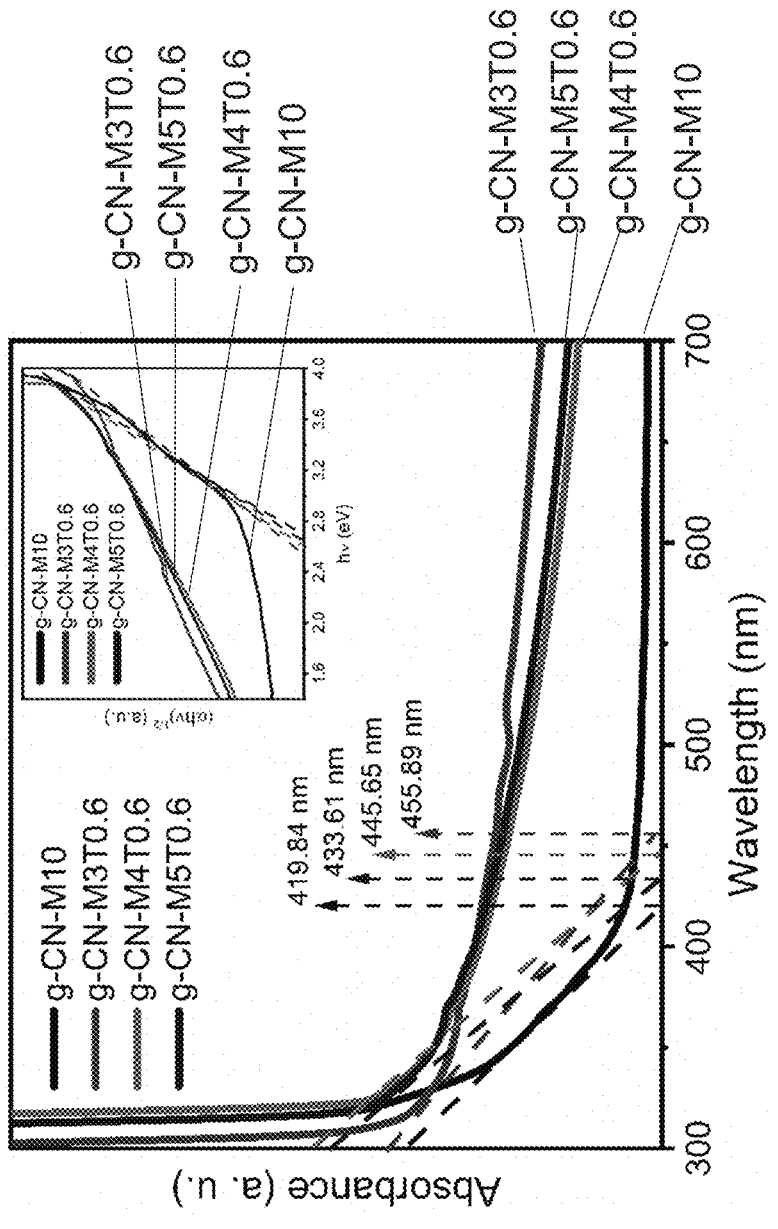
FIG. 21A shows the UV-Vis absorption spectra of g-CN-M10, g-CN-M3T0.6, g-CN-M4T0.6, and g-CN-M5T0.6.
Figure 21B:
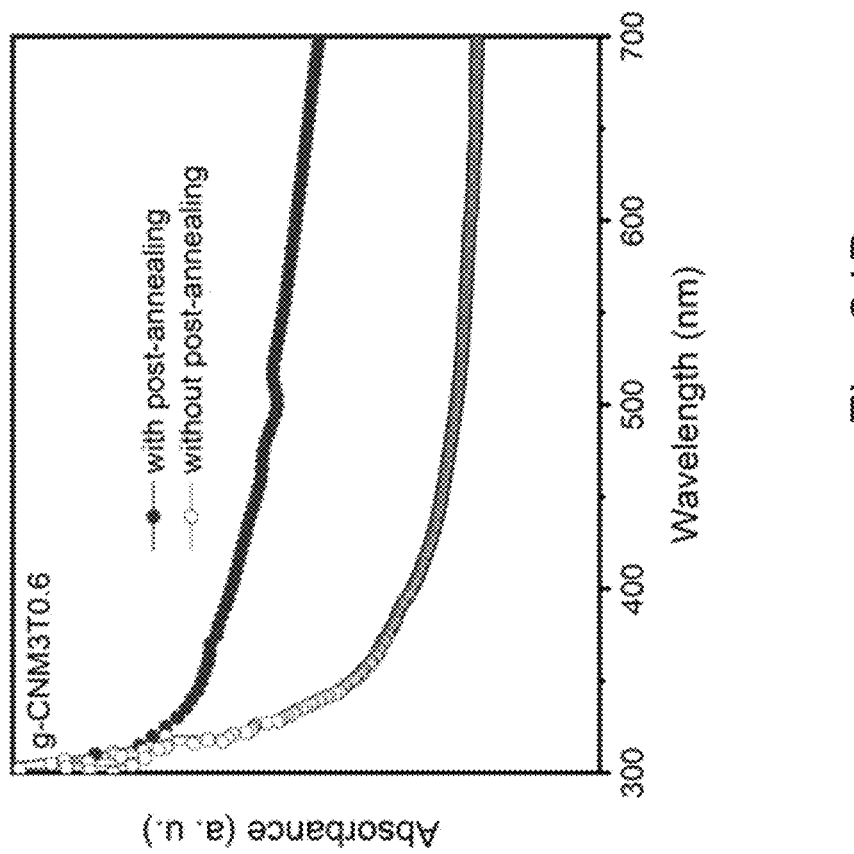
FIG. 21B shows UV-Vis absorption spectra of g-CN-M3T0.6 and g-CN-M3T0.6'.

In the UV-vis absorption spectra (FIG. 21A), the absorption edges of g-CN-M10, g-CN-M5T0.6, g-CN-M4T0.6, g-CN-M3T0.6 are respectively estimated to be 419.84, 433.61, 445.65, and 455.89 nm, which shows that g-CN-M3T0.6 has the best photon harvesting capacity. Upon further comparing the UV-Vis absorption spectra of g-CN-M3T0.6 with that of g-CN-M3T0.6', it is found that both samples respond to nearly the same absorption edge, but the g-CNM3T0.6 (with post-annealing) is capable of absorbing more light (FIG. 21B). As calculated from the intercept of the tangents in the Tauc plot (FIG. 21A, insert), the polymer-size-dependent bandgaps of g-CN-M10, g-CN-M5T0.6, g-CN-M4T0.6, g-CN-M3T0.6 films are respectively estimated to be 2.70, 2.68, 2.61, 2.54 eV.

Figure 22A:
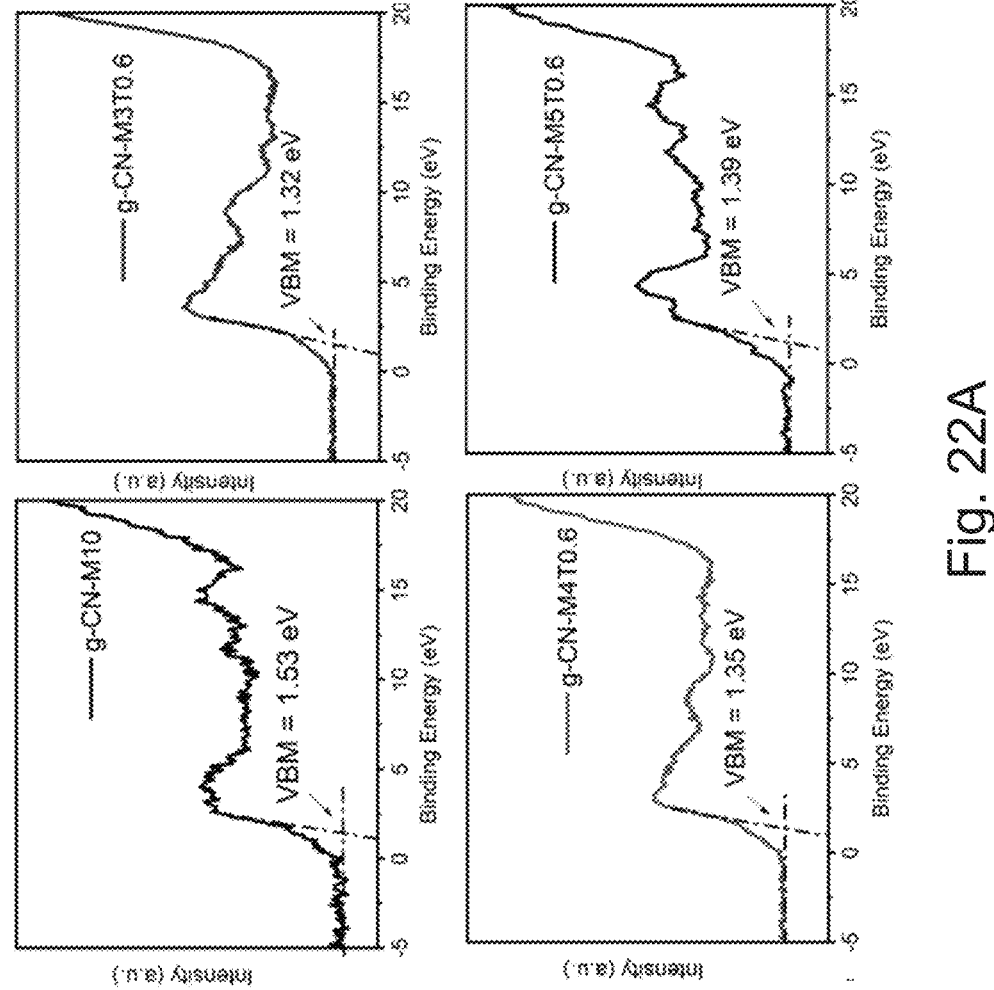
FIG. 22A shows the valence-band XPS spectra of g-CN-M10, g-CN-M3T0.6, g-CN-M4T0.6, and g-CN-M5T0.6. The valence band maximum (VBM) values are measured by XPS valence spectroscopy, which are respectively 1.53, 1.32, 1.35, and 1.39 eV for g-CN-M10, g-CN-M3T0.6, g-CN-M4T0.6, and g-CN-M5T0.6.
Figure 22B:
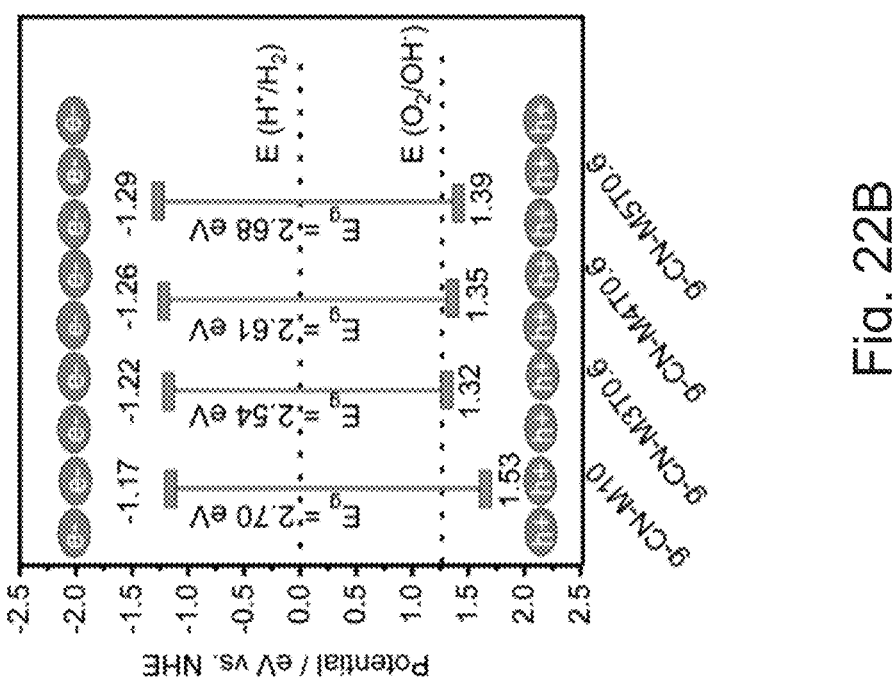
FIG. 22B shows band structure diagram of g-CN-M10, g-CN-M3T0.6, g-CN-M4T0.6, and g-CN-MST0.6. Combined the VBM with the extrapolated optical $E_g$ values and the general formula of $E_{CBM} = E_{VBM} - E_g$, the conduction band minimum (CBM) values of g-CN-M10, g-CN-M3T0.6, g-CN-M4T0.6, and g-CN-M5T0.6 are derived to be −1.17, −1.22, −1.26, and −1.29 eV, respectively.
Figure 23:
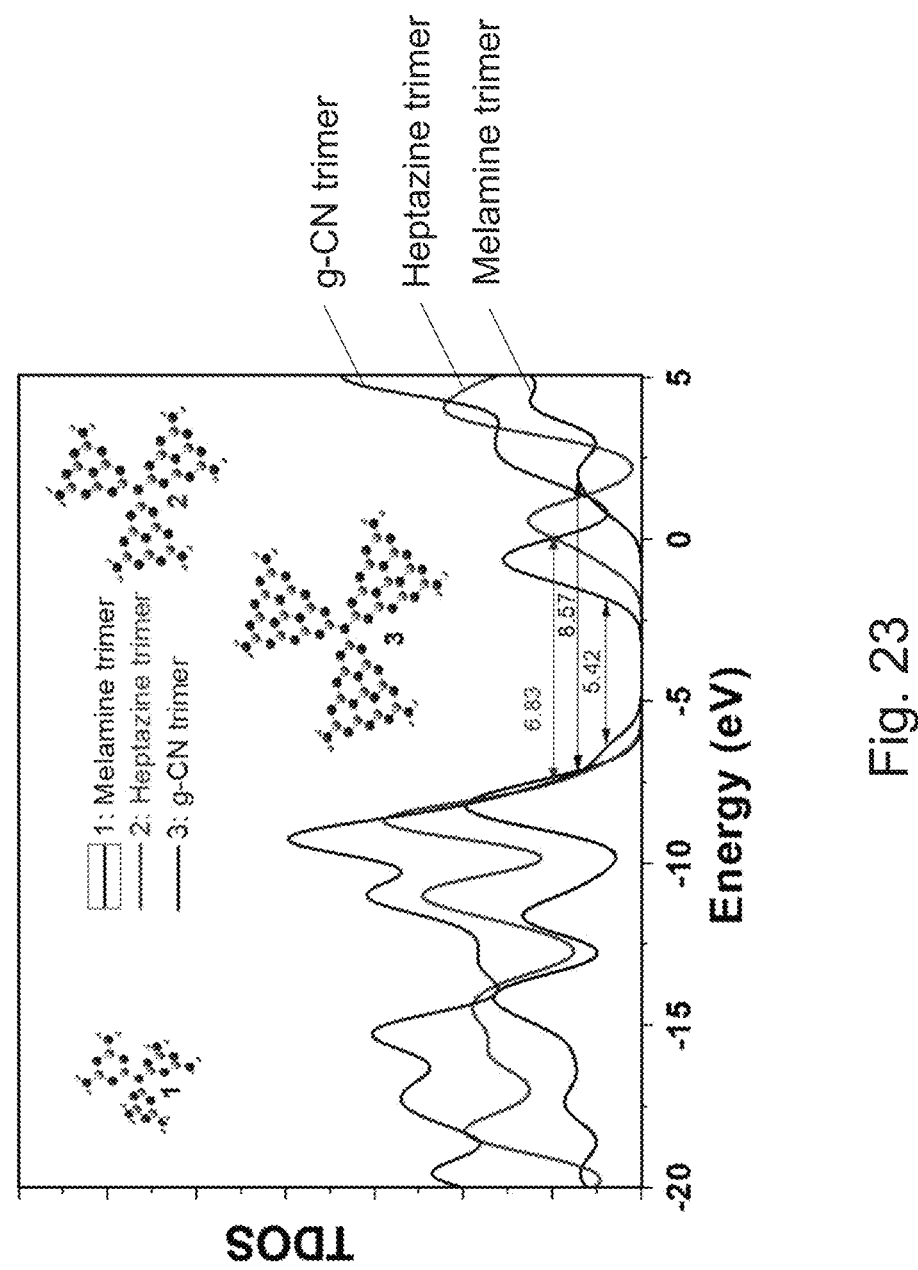
FIG. 23 shows the total density of states (TDOS) of a trimer composed of three melamines, heptazines, or larger conjugated clusters, which were calculated by CAM-B3LYP/6-31G* and then analyzed by a multifunctional wave-function analyzer. The optimized structures of three trimers are shown beside TDOS curves. The size-dependant energy gap ($E_g$) values are respectively labeled and colored as calculated from the energy level difference between the highest occupied molecular orbital and the lowest unoccupied molecular orbital.

Combined with the valence-band XPS spectra (FIG. 22A), the band alignment diagram (FIG. 22B) of four g-CN samples is deduced, which shows that the valence band top and conduction band bottom of g-CN-M3T0.6 relative to the oxidation ($O_2/H_2O$) and reduction ($H^+/H_2$) potentials are most favourable for water splitting. It is believed that the TU addition to melamine as precursors promotes the polymerization degree of g-CN with larger-area conjugated structures leading to the favourable electronic structure, i.e. the size-dependent energy gap (FIG. 23). The 1:5 ratio of TU to melamine in g-CN-M3T0.6 is believed to facilitate more efficient polymerization reactions under the TVC conditions.

Example 3B

Photophysical Properties of CNMT-x-t

The UV-vis spectra of the as-developed CNMT-x-t photocatalyst samples (FIG. 24A) disclose a long absorption tail extending beyond 700 nm. With an increased optical density of all samples, the optical edges lead to red shift. And CNMT1-500 shows the highest absorption intensity. The red shift of the light absorption may be due to the enhanced condensation degree of the precursor, reflecting a thermally induced thinner nanosheet structure than the CNM sample, as is evidenced in TEM images (FIGS. 15A to 15E). When the temperature was further raised to 550° C. from 500° C., a blue shift in absorption edge was observed, possibly resulting from a robust quantum confinement effect. Therefore, the mela/thio-g-CN film prepared at 500° C. had a higher ability to absorb visible light, leading to better photoactivity than other samples.

Further, to determine the migration and separation of photo-excited charge carriers, the steady-state photoluminescence (PL) emission spectra of the samples were characterized. All candidates show a luminescence peak centered at around 450 nm (FIG. 24B), attributed to the radiative recombination rate of electrons and holes. Evidently, dramatic PL intensity quenching for CNMT films occurs compared with the CNM film, which denotes that the intrinsic radiative recombination rate of photogenerated electron-hole pairs in these CNMT candidates has been substantially inhibited. In contrast, a higher fluorescence intensity represents the faster recombination rate of the photocarriers. Moreover, PL emission peaks of CNMT1-550 and CNMT2-550, compared with the other two CNMT films, are weaker because the generation of cyanuric acid may modify their chemical structure. As a result, structural imperfection may facilitate electron transfer and delocalization, reducing the emission spectrum's intensity. Overall, the newly synthesized CNMT construction from two nitrogen-rich precursors by the TVC method exhibits a much lower photocarrier recombination rate than the CNM.

Example 4A

Photoelectrochemical Properties of g-CN-MxT0.6

Figure 25A:
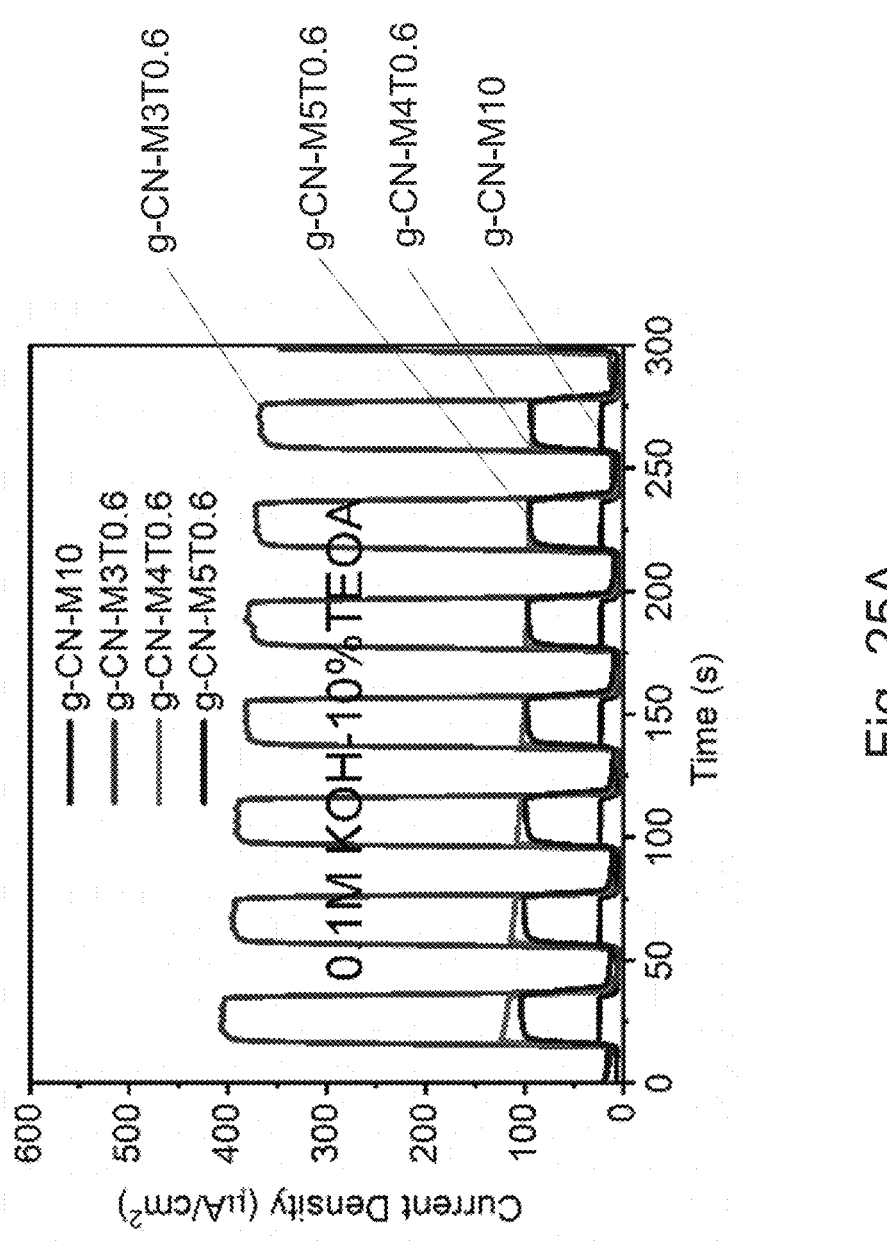
FIG. 25A shows the transient photocurrent density in 0.1M KOH-10% TEOA for g-CN-M10, g-CN-M3T0.6, g-CN-M4T0.6 and g-CN-M5T0.6.
Figure 25B:
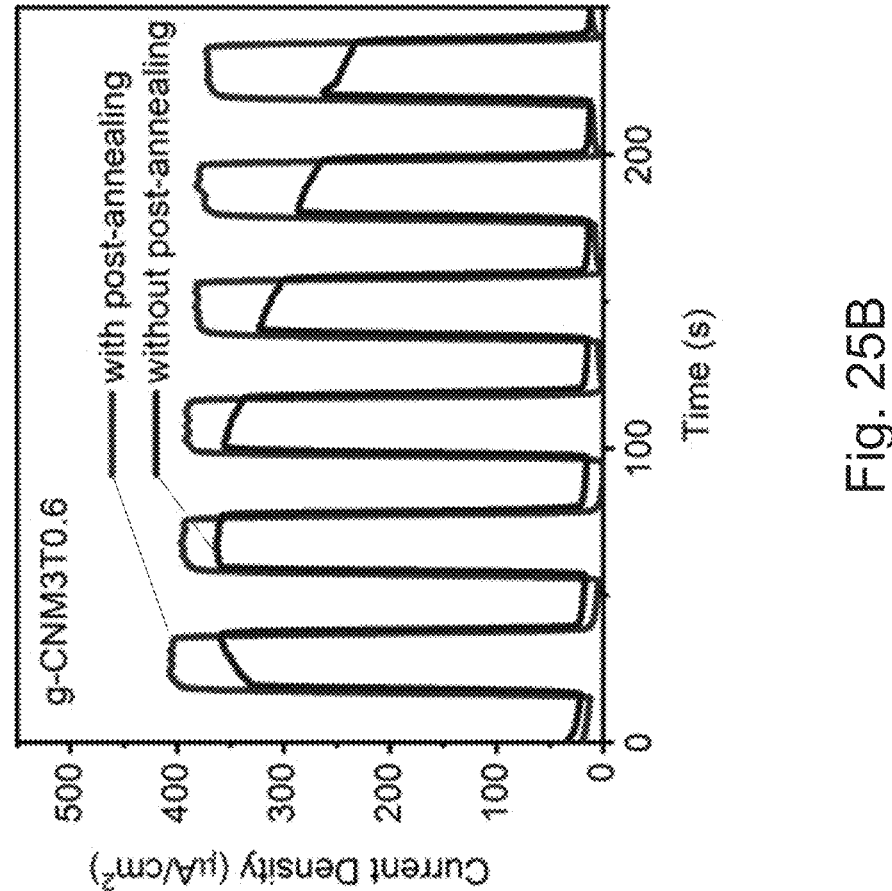
FIG. 25B shows the transient photocurrent density in 0.1M KOH-10% TEOA for g-CN-M3T0.6 and g-CN-M3T0.6' (without post-annealing)

The photocurrent, which is believed to be one of the main indicators of photoelectrochemical (PEC) properties, has be investigated since it is believed to be relevant to the flow of charge carriers generated by the photocatalysts upon light irradiation. The transient photocurrent density (FIG. 25A) of g-CN-M3T0.6 under the chopped light illumination in the 0.1M KOH-10% triethanolamine (TEOA) electrolyte reaches 404.4 $\mu A$ $cm^{-2}$ at 1.23 V vs. RHE, 16 times of that in the g-CN-M10 film (25.2 $\mu A$ $cm^{-2}$), 3 times of that in the g-CN-M4T0.6 (130.6 $\mu A$ $cm^{-2}$), and 4 times of that in the g-CN-MST0.6 (94.8 $\mu A$ $cm^{-2}$). In addition, the transient photocurrent density of g-CN-M3T0.6 is found to be higher than that of g-CN-M3T0.6' (FIG. 25B), which has not been subjected to post-annealing during the fabrication process.

Figure 25C:
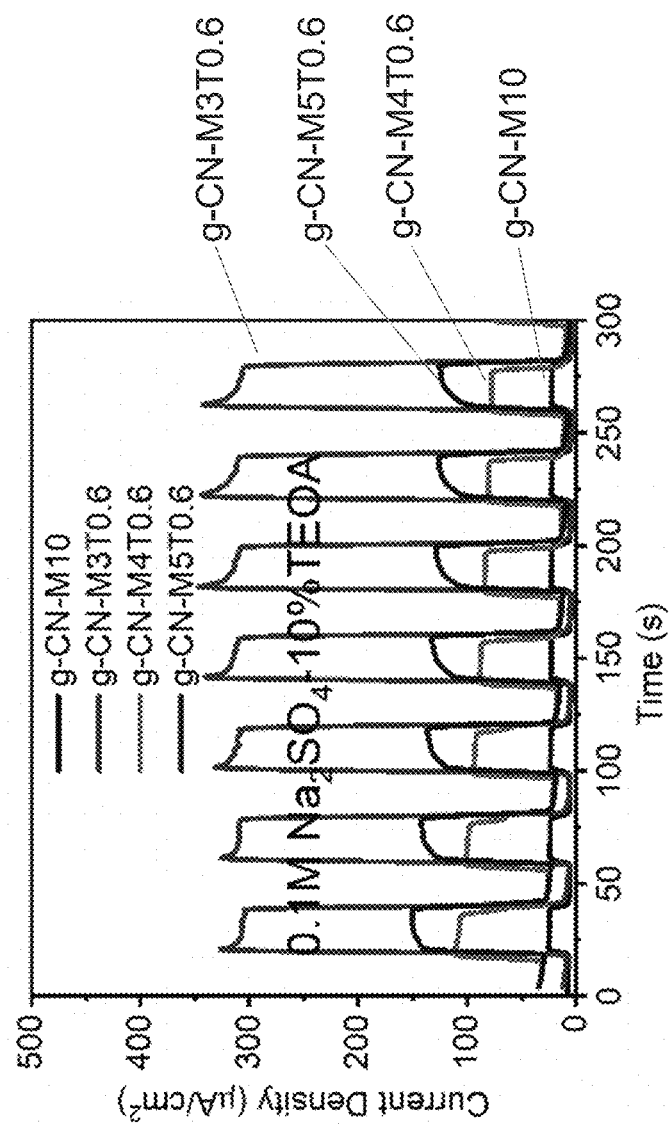
FIG. 25C shows the transient photocurrent density in 0.1M Na$_2$SO$_4$-10% TEOA for g-CN-M10, g-CN-M3T0.6, g-CN-M4T0.6 and g-CN-M5T0.6.
Figure 25E:
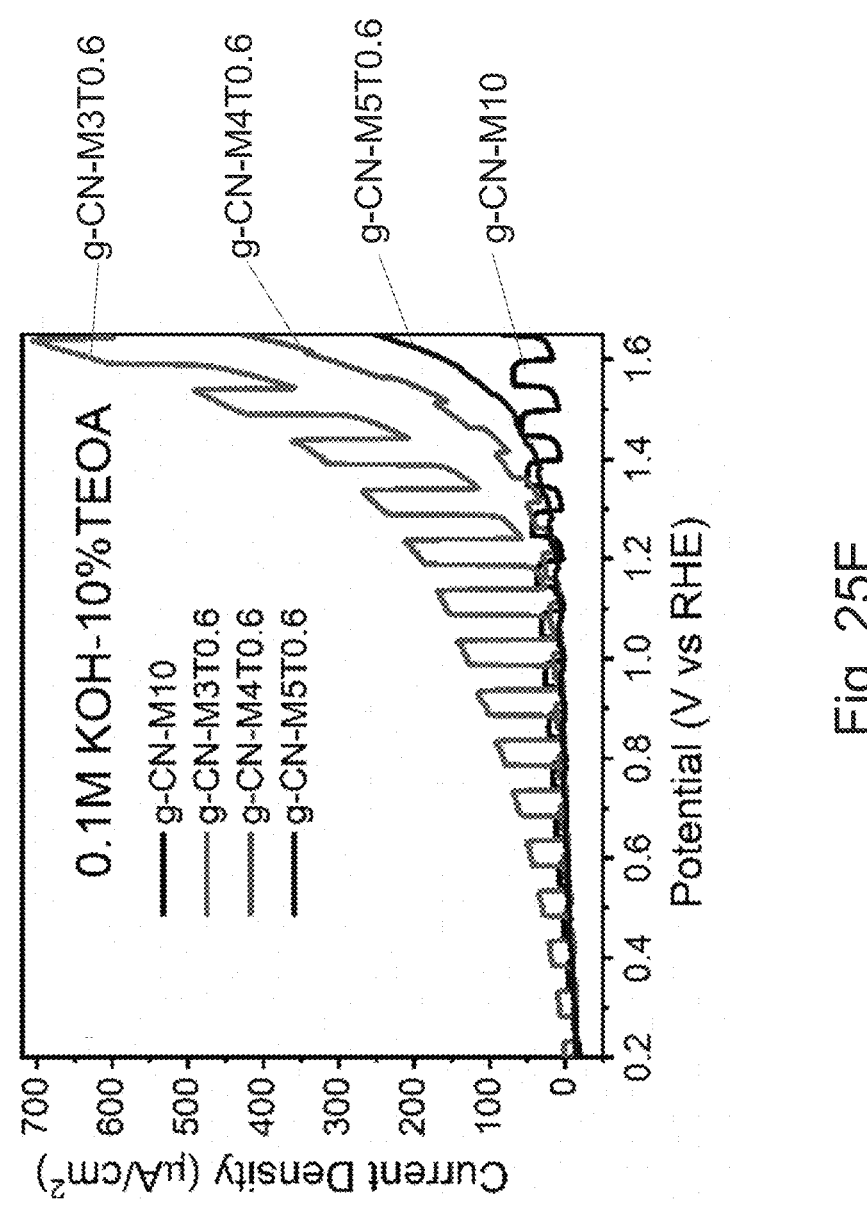
FIG. 25E shows the light-chopped LSV curves in 0.1M KOH-10% TEOA for g-CN-M10, g-CN-M3T0.6, g-CN-M4T0.6 and g-CN-M5T0.6.
Figure 25F:
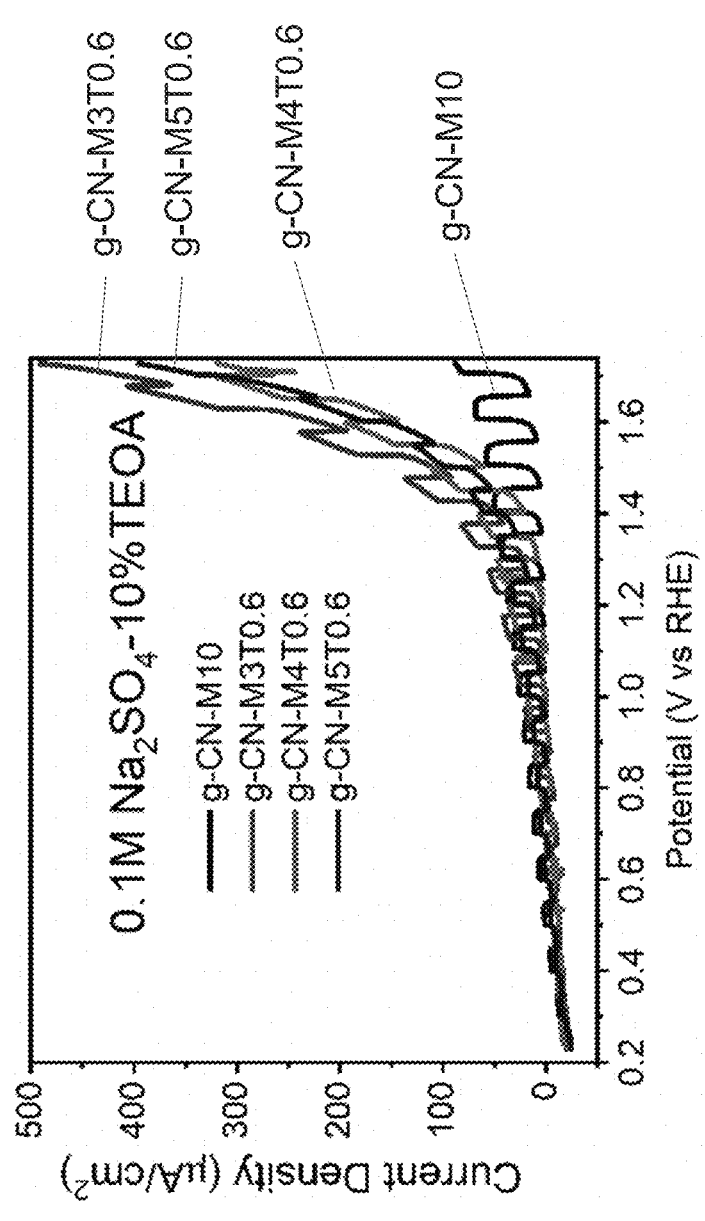
FIG. 25F shows the light-chopped LSV curves in 0.1M Na$_2$SO$_4$-10% TEOA for g-CN-M10, g-CN-M3T0.6, g-CN-M4T0.6 and g-CN-M5T0.6.

When we change to use 0.1M $Na_2SO_4$-10% TEOA electrolyte, the transient photocurrent density (FIG. 25C) of g-CN-M3T0.6 can reach 319.8 μA $cm^{-2}$, still much higher than the other three samples. Specific transient photocurrent densities of the samples can be found in FIG. 25D. The light-chopped linear sweep voltammetry (LSV) curves (FIGS. 25E and 25F) also show that g-CN-M3T0.6 presents the best photo-response property among the samples in 0.1M KOH-10% TEOA or 0.1M $Na_2SO_4$-10% TEOA. It is believed that the basic solution of 0.1M KOH may facilitate a higher photocurrent density than the neutral 0.1M $Na_2SO_4$ solution. Overall, the g-CN films derived from melamine and TU precursors exhibit outstanding PEC performance enhancement, especially for g-CN-M3T0.6, compared to g-CN derived from melamine only.

To study the influence of precursor ratio between melamine and TU on the PEC performance of g-CN, the transient photocurrent densities as discussed above are further compared with two g-CN samples derived from 1 g, 2 g of melamine powder and the same amount of 0.6 g TU, named g-CN-M1T0.6 and g-CN-M2T0.6, which were prepared under the same synthetic procedure as any one of g-CN-M3T0.6, g-CN-M4T0.6, or g-CN-M5T0.6.

Figure 25H:
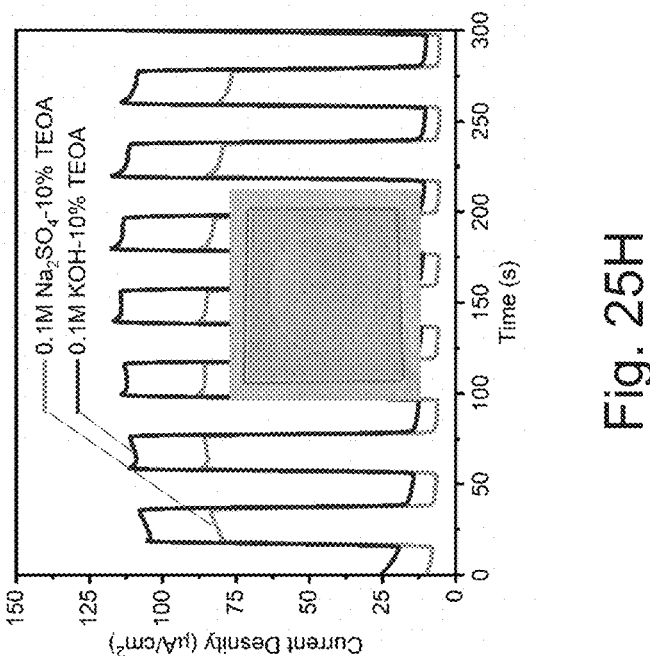
FIG. 25H shows the transient photocurrent density in 0.1M KOH-10% TEOA or 0.1M Na$_2$SO$_4$-10% TEOA for g-CN-M2T0.6 films, with film photograph inserted.
Figure 25G:
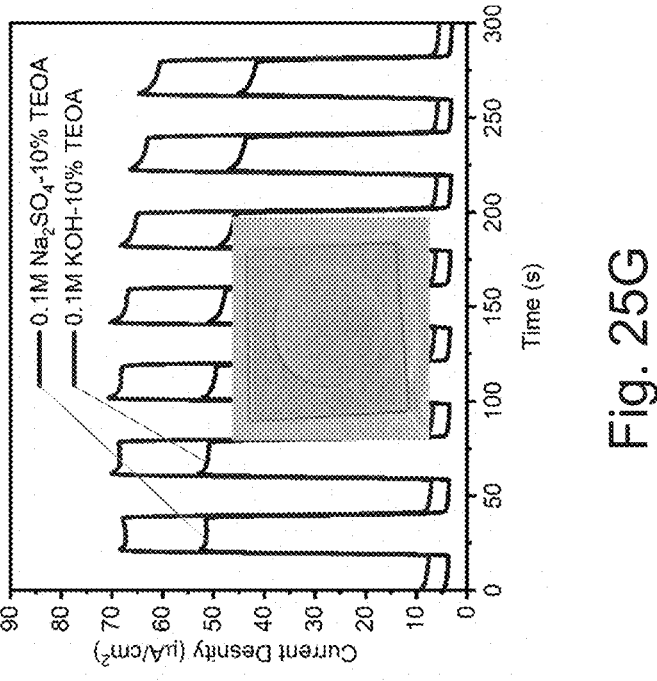
FIG. 25G shows the transient photocurrent density in 0.1M KOH-10% TEOA or 0.1M Na$_2$SO$_4$-10% TEOA for g-CN-MIT0.6 films, with film photograph inserted.
Figure 26A:
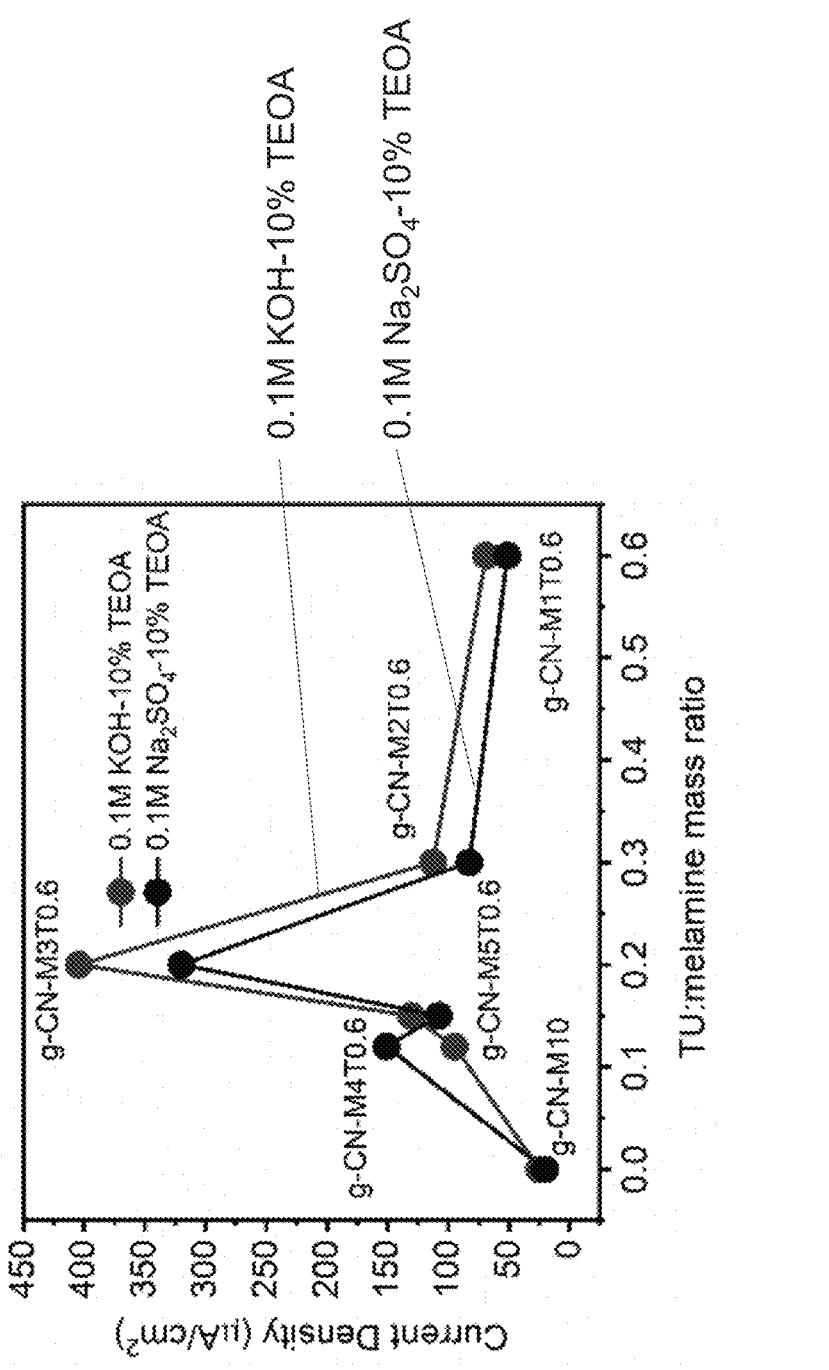
FIG. 26A shows the relationship of photocurrent density with thiourea: melamine mass ratio in the range of 0 to 0.6.
Figure 26B:
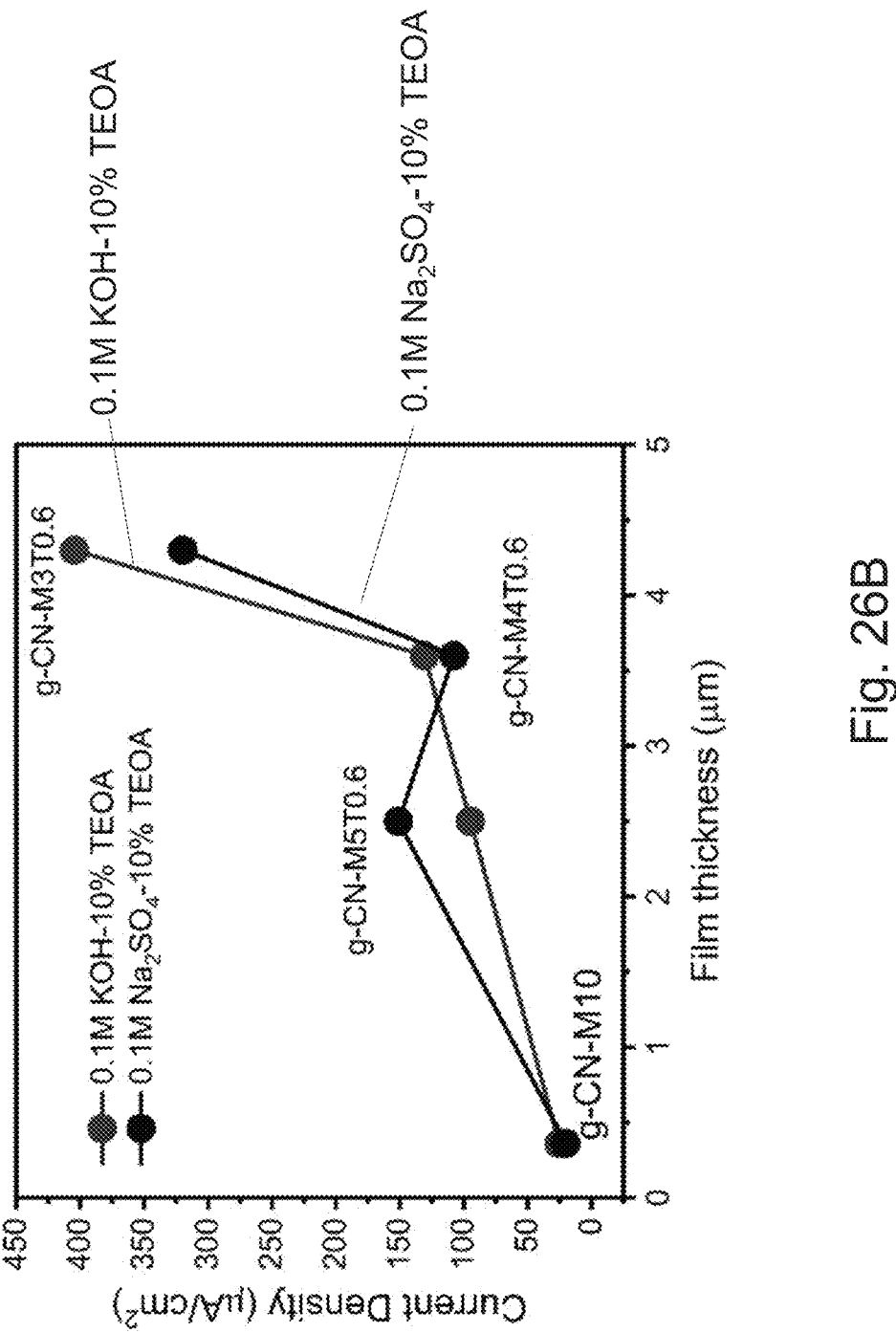
FIG. 26B shows the relationship of photocurrent density with film thickness of g-CN-M10, g-CN-M3T0.6, g-CN-M4T0.6 and g-CN-M5T0.6.

The transient photocurrent densities of g-CN-M1T0.6 achieve up to 68.9 and 51.4 μA $cm^{-2}$ in 0.1M KOH-10% TEOA and 0.1M $Na_2SO_4$-10% TEOA (FIGS. 25D and 25G), while those for g-CN-M2T0.6 reach up to 112.3 and 82.5 μA $cm^{-2}$ in two electrolyte solutions (FIGS. 25D and 25H). The trend of six sample photocurrent densities with respect to the mass ratio of TU to melamine (FIG. 26A) shows that the precursor ratio can definitely modulate the PEC performance of the as-prepared g-CN films, where the ratio of TU: melamine as 1:5 (i.e. g-CN-M3T0.6) reaches the best PEC performance. The PEC performance enhancement may be also relative with the film thicknesses (FIG. 26B), which is due to that thicker films can facilitate stronger light absorptions and charge carriers diffused in a larger area.

Figure 27B:
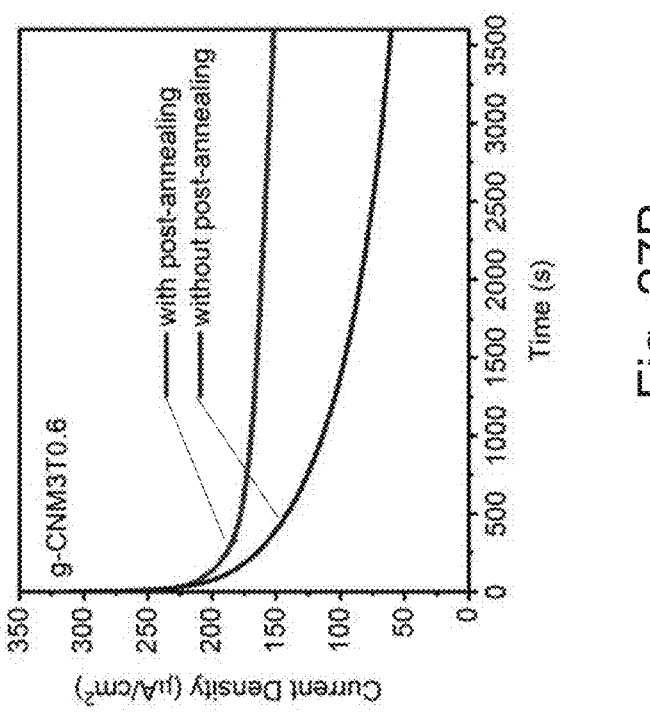
FIG. 27B shows the photostability assessment of g-CN-M3T0.6/g-CN-M3T0.6' with/without post-annealing.
Figure 27A:
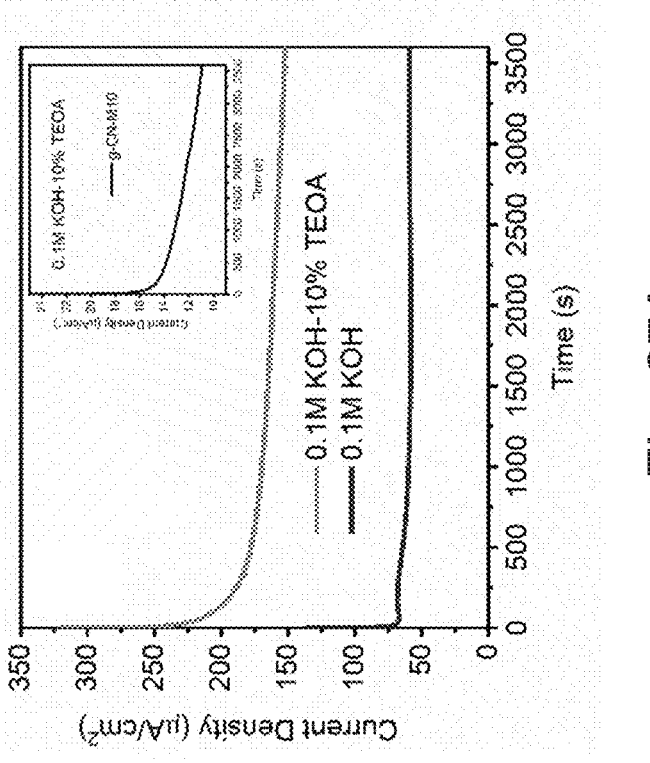
FIG. 27A shows the photostability assessment of g-CN-M3T0.6 with/without sacrificial reagent TEOA (inset: photostability of g-CN-M10 sample for comparison)

The photostability of the g-CN-M3T0.6 sample is addressed to monitor its photocurrent density change under 3600s illumination by using two working electrolytes with or without sacrificial reagent (FIG. 27A). Notably, the photocurrent density of g-CN-M3T0.6 in 0.1M KOH without TEOA is stabilized in the range of 60-70 μA $cm^{-2}$ within 1 hour after a quick initial decay, while in 0.1M KOH-10% TEOA undergoes a mild and smooth decay in the first 500 s and maintains over 150 μA $cm^{-2}$, much higher than the platform value without TEOA. It means that the added TEOA, as an efficient hole scavenger, is essential for removing the kinetic barrier of the oxidation half-reaction to allow a maximal photocurrent density and hinder the charge carrier recombination, which is assumed that the holes are released from the g-CN surface and transferred to the oxidized $TEOA^+$. Compared with the photostability of g-CN-M10 (FIG. 27A, insert), the g-CN-M3T0.6 has an absolute advantage in PEC performance due to the superior microstructure derived from the optimal ratio of TU to melamine precursors. Furthermore, when comparing the photostability of g-CN-M3T0.6 with that of g-CN-M3T0.6', it is found that the photocurrent density of g-CN-M3T0.6 maintains over 150 μA $cm^{-2}$ after the first 500 s whereas g-CN-M3T0.6' keeps decaying under the same experimental conditions (FIG. 27B). Thus, it is suggested that the post-annealing step is essential to the film quality/performance of g-CN-MxT0.6.

The charge transfer properties between the electrolyte and the photoelectrode comprising g-CN-MxT0.6 under illumination or dark conditions is characterized by electrochemical impedance spectroscopy (EIS, i.e. Nyquist plot). In general, a smaller semicircle diameter of the Nyquist plots at lower resistance indicates a higher conductivity, quicker charge carrier migration, and lower charge recombination rate.

Figure 28B:
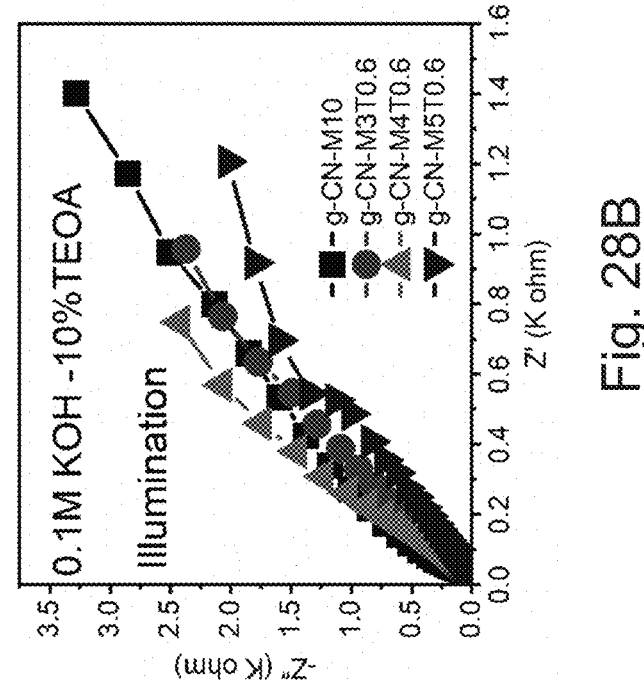
FIG. 28B shows the Nyquist plots of g-CN-M10, g-CN-M3T0.6, g-CN-M4T0.6 and g-CN-M5T0.6 in 0.1M KOH-10% TEOA under illumination.
Figure 28A:
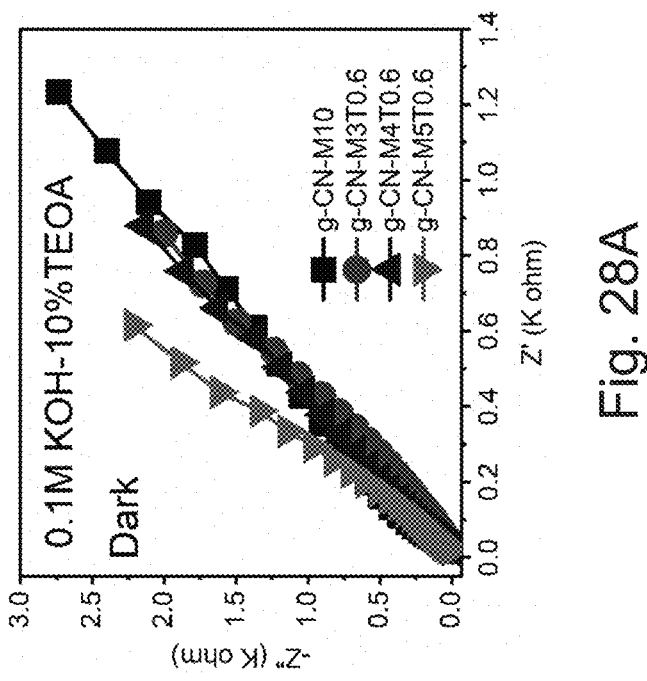
FIG. 28A shows the Nyquist plots of g-CN-M10, g-CN-M3T0.6, g-CN-M4T0.6 and g-CN-M5T0.6 in 0.1M KOH-10% TEOA under the dark.
Figure 28D:
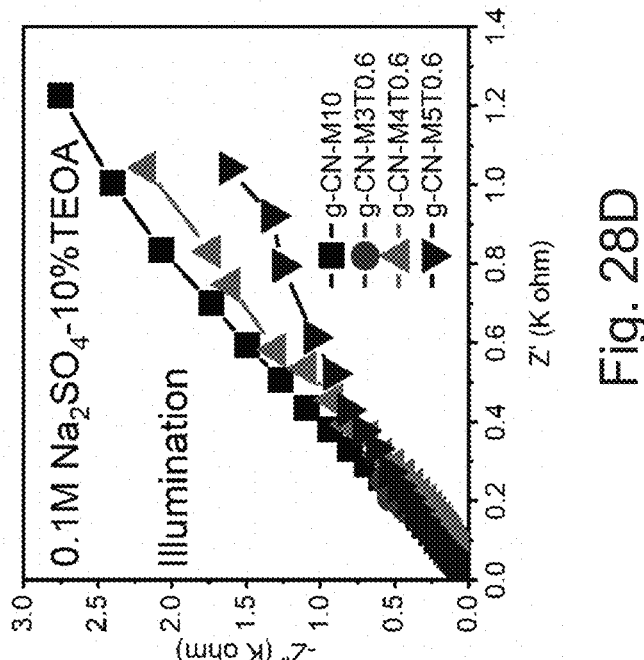
FIG. 28D shows the Nyquist plots of g-CN-M10, g-CN-M3T0.6, g-CN-M4T0.6 and g-CN-M5T0.6 in 0.1M Na$_2$SO$_4$-10% TEOA under illumination.
Figure 28C:
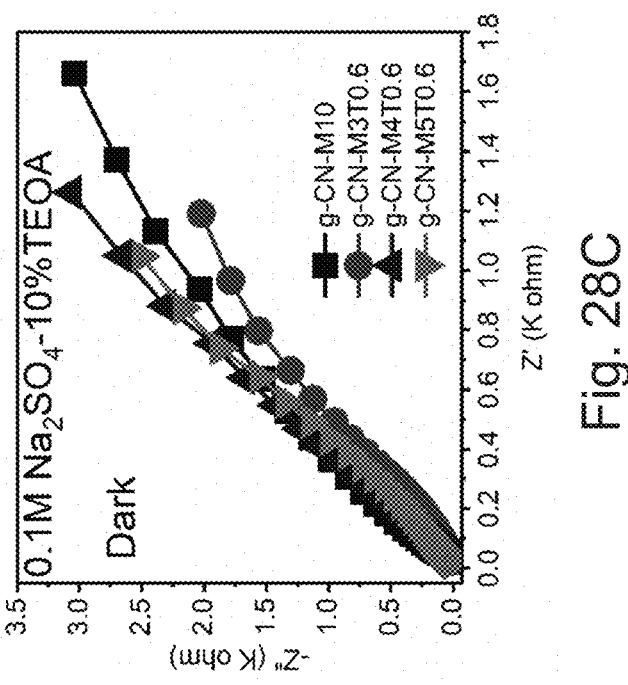
FIG. 28C shows the Nyquist plots of g-CN-M10, g-CN-M3T0.6, g-CN-M4T0.6 and g-CN-M5T0.6 in 0.1M Na$_2$SO$_4$-10% TEOA under the dark.
Figure 28F:
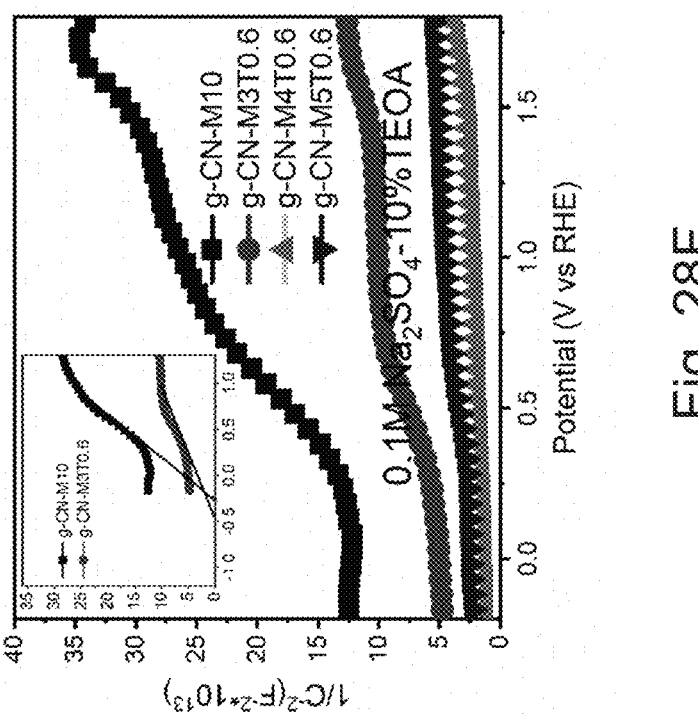
FIG. 28F shows the Mott-Schottky plots of g-CN-M10, g-CN-M3T0.6, g-CN-M4T0.6 and g-CN-M5T0.6 in 0.1M $Na_2SO_4$-10% TEOA.
Figure 28E:
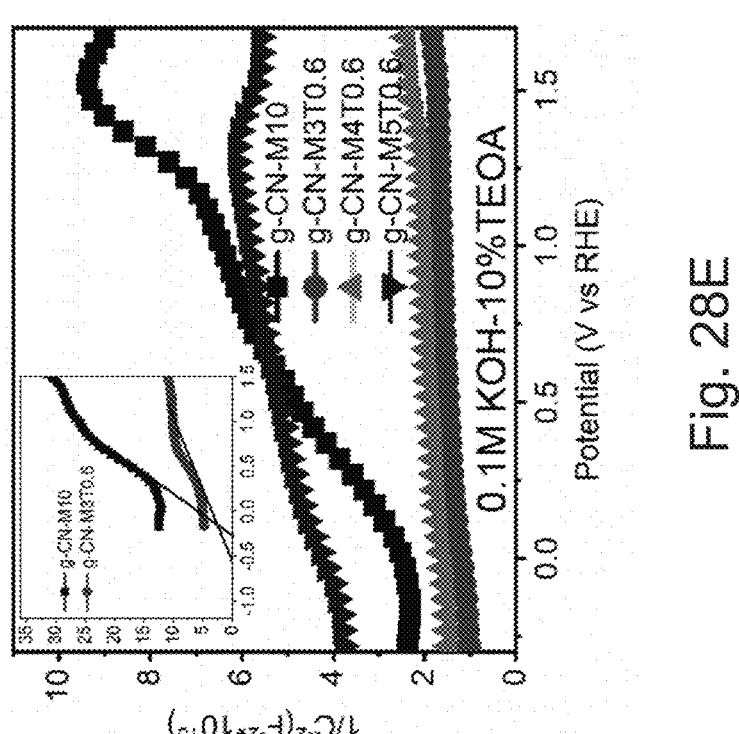
FIG. 28E shows the Mott-Schottky plots of g-CN-M10, g-CN-M3T0.6, g-CN-M4T0.6 and g-CN-MST0.6 in 0.1M KOH-10% TEOA.

It is found that the diameter of the arc (FIGS. 28A to 28D) for g-CN-M10 is always larger than the g-CN-M3T0.6, g-CN-M4T0.6, g-CN-M5T0.6 films no matter in 0.1M KOH-10% TEOA or 0.1M $Na_2SO_4$-10% TEOA under illumination or dark conditions, indicating the enhanced charge separation and transfer of electron-hole pairs in the g-CN-M3T0.6, g-CN-M4T0.6, g-CN-M5T0.6 films. Meanwhile, g-CN-M3T0.6 sample achieves the smallest arc diameter of semicircle most of the time, supporting that the charge transfer resistance between the electrolyte and electrode is suppressed to the greatest extent. The positive slopes of Mott-Schottky (MS) plots (FIGS. 28E and 28F) suggest that all samples are n-type semiconductors. The reduced flat band potentials of g-CN-M3T0.6, g-CN-M4T0.6, and g-CN-M5T0.6 reflect the much-improved charge carrier densities compared with the g-CN-M10 film. Therefore, it is believed that the prepared g-CN films based on melamine-TU precursors can promote bulk electrical conductivity. Combined with the interceptions of tangents in MS curves for g-CN-M10 (FIGS. 28E and 28F, inserts), it can be seen that there are left-shifted on the potential axis from g-CN-M10 to g-CN-M3T0.6, which facilitates the charge carrier separation and reduces the charge recombination rate that enhances electrical conductivity, consistent with the EIS Nyquist plots.

Example 4B

Photoelectrochemical Properties of CNMT-x-t

Figure 29A:
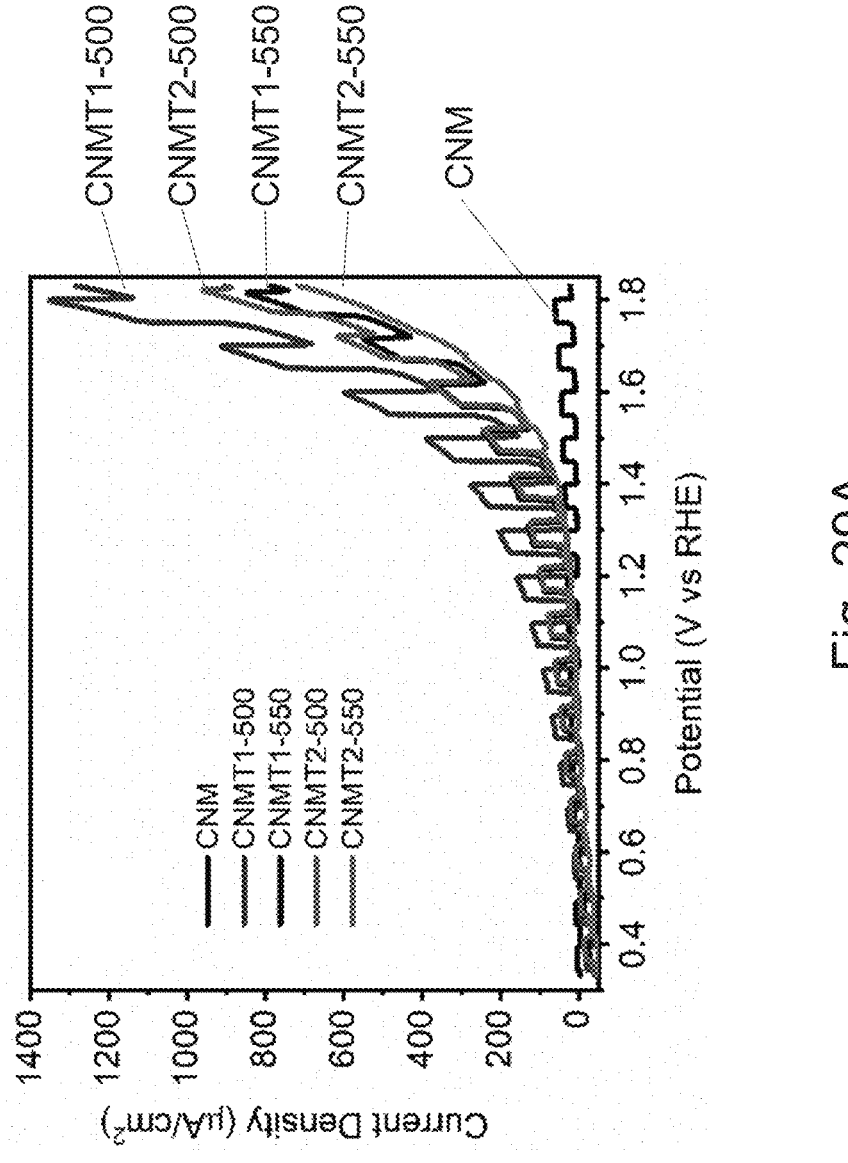
FIG. 29A shows the light-chopped LSV curves in 0.1M $Na_2SO_4$-10% TEOA for CNM, CNMT1-500, CNMT1-550, CNMT2-500, and CNMT2-550.
Figure 29B:
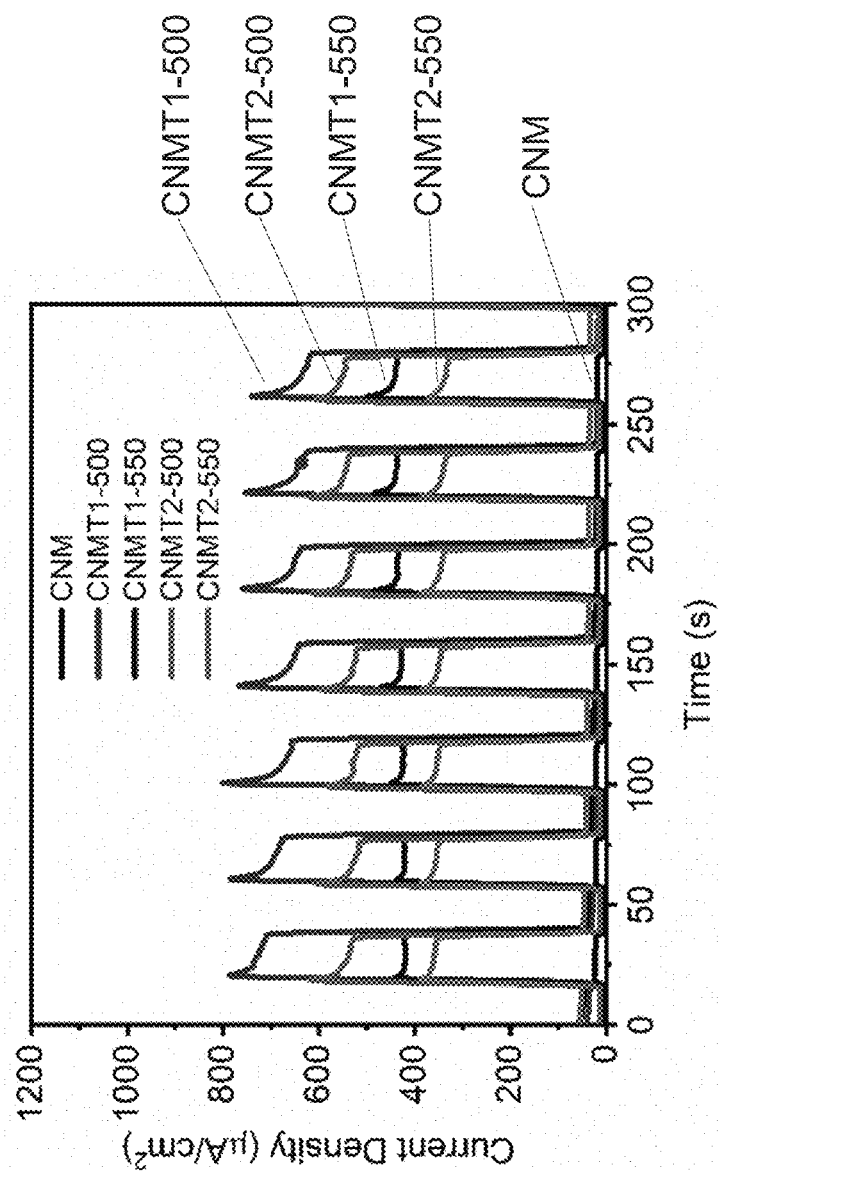
FIG. 29B shows transient photocurrent density curves in 0.1M $Na_2SO_4$-10% TEOA for CNM, CNMT1-500, CNMT1-550, CNMT2-500, and CNMT2-550.
Figure 29C:
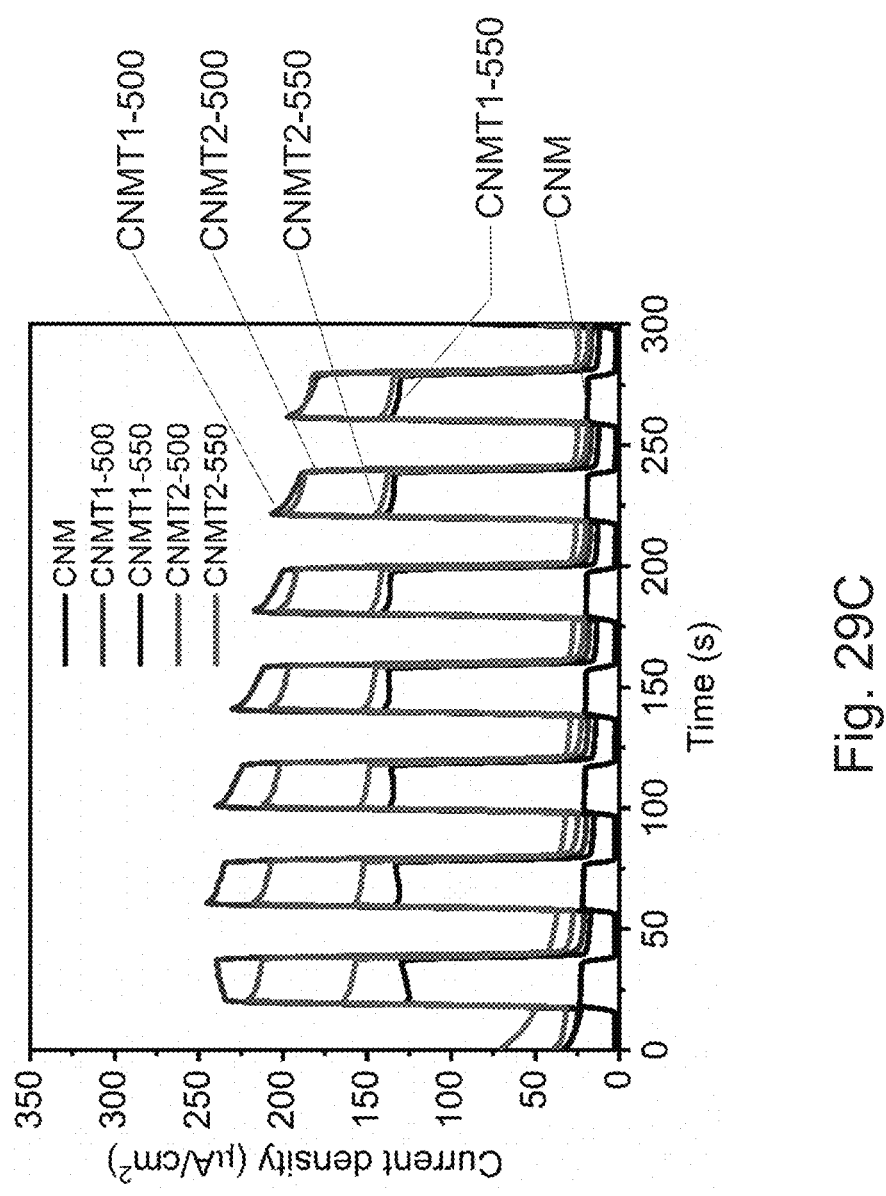
FIG. 29C shows transient photocurrent density curves in 0.1M $Na_2SO_4$ solution for CNM, CNMT1-500, CNMT1-550, CNMT2-500, and CNMT2-550.

The PEC performance of CNMT-x-t film was conducted in a three-electrode configuration in two electrolytes of 0.1M $Na_2SO_4$ with or without added 10% TEOA solutions as described herein. The linear sweep voltammetry (LSV) measurements of all the films were carried out under chopped simulated AM 1.5 G illumination at 1.23V vs. RHE in 0.1M $Na_2SO_4$-10% TEOA solution (FIG. 29A). The transient photocurrent densities of all samples in 0.1M $Na_2SO_4$ with or without 10% TEOA solution under the chopped light illumination are shown in FIGS. 29B to 29D.

To estimate the hole extraction efficiency, 10% TEOA was added to the 0.1M $Na_2SO_4$ electrolyte as an efficient hole scavenger. The photocurrent density is boosted to 790.5 μA $cm^{-2}$, 447.5 μA $cm^{-2}$, 611.2 μA $cm^{-2}$, 393.9 μA $cm^{-2}$ for CNMT1-500 CNMT1-550, CNMT2-500, CNMT2-550, respectively whereas CNM reaches 28.2 μA $cm^{-2}$ in this system (FIGS. 29B to 29D). Thus, the photocurrent of CNMT1-500 is enhanced by a factor of 28 than the CNM sample, which is supercilious to that of the as-reported graphitic carbon nitride photoanodes created from two precursors together (FIG. 30).

Figure 31:
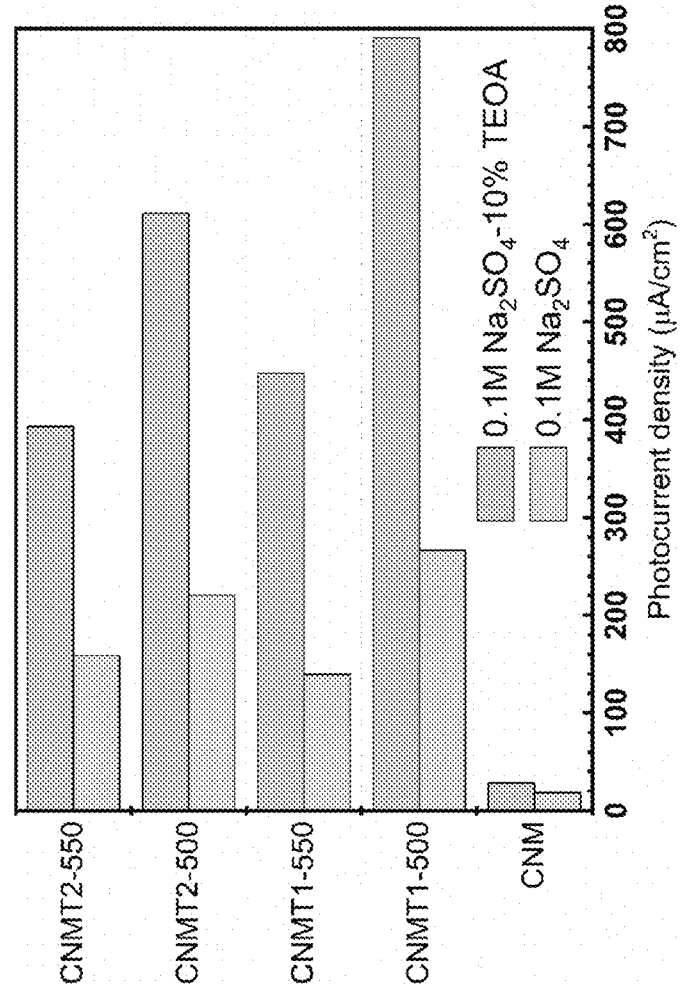
FIG. 31 shows the photocurrent density-electrolyte relationships of CNM, CNMT1-500, CNMT1-550, CNMT2-500, and CNMT2-550.

It is believed that the boosted photocurrent density may be attributed to 1) TEOA oxidation; and/or 2) film quality and/or film thickness. For TEOA oxidation, most holes are believed to be extracted from the layer that tends to reduce the oxidation half-reaction kinetic barrier, allowing for maximum photocurrent density. Therefore, it is believed that TEOA is a favorable choice to enhance the photocurrent density in this work (FIG. 31). For film quality and/or film thickness, it is believed to be relevant to the precursor weight correlation and/or deposition temperature.

Figure 32A:
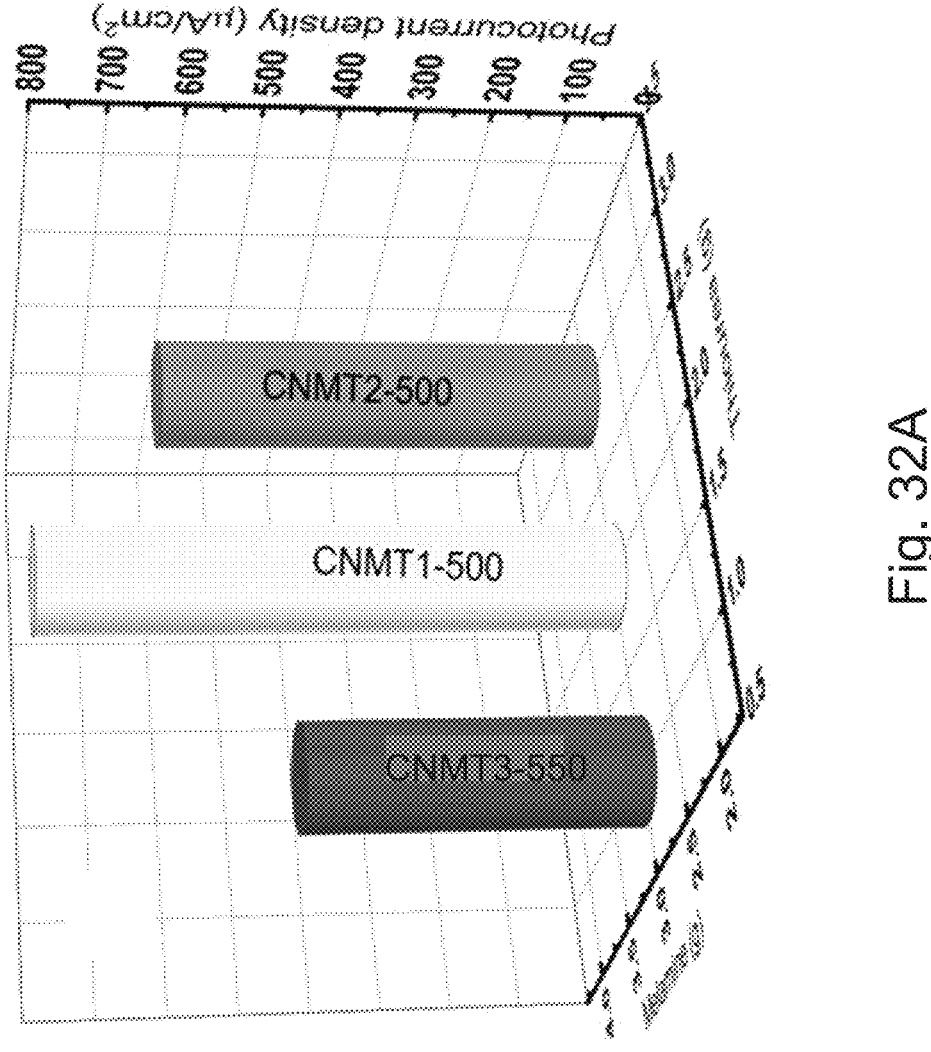
FIG. 32A shows photocurrent density-precursor weight relationship of CNMT1-500, CNMT2-500, and CNMT3-500.
Figure 32B:
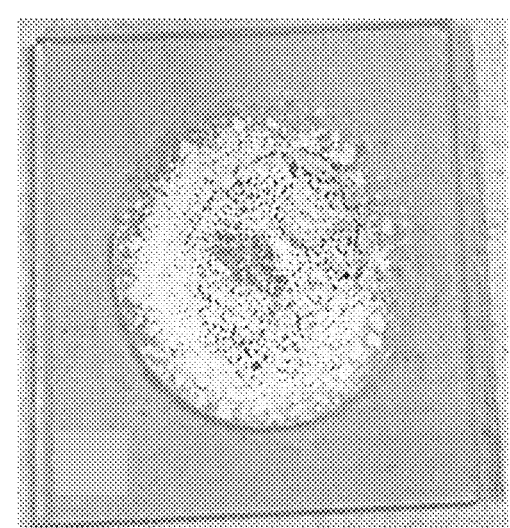
FIG. 32B shows the photograph of g-CN film grown on FTO glass from thiourea powder.
Figure 33B:
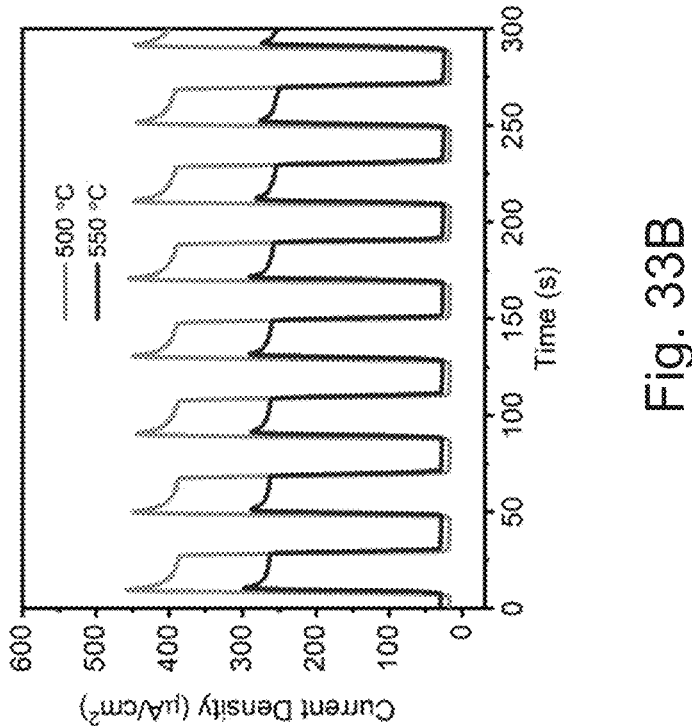
FIG. 33B shows photocurrent density of CNMT1-500 and CNMT1-550 in 0.1 M $Na_2SO_4$-10% TEOA solution.
Figure 33A:
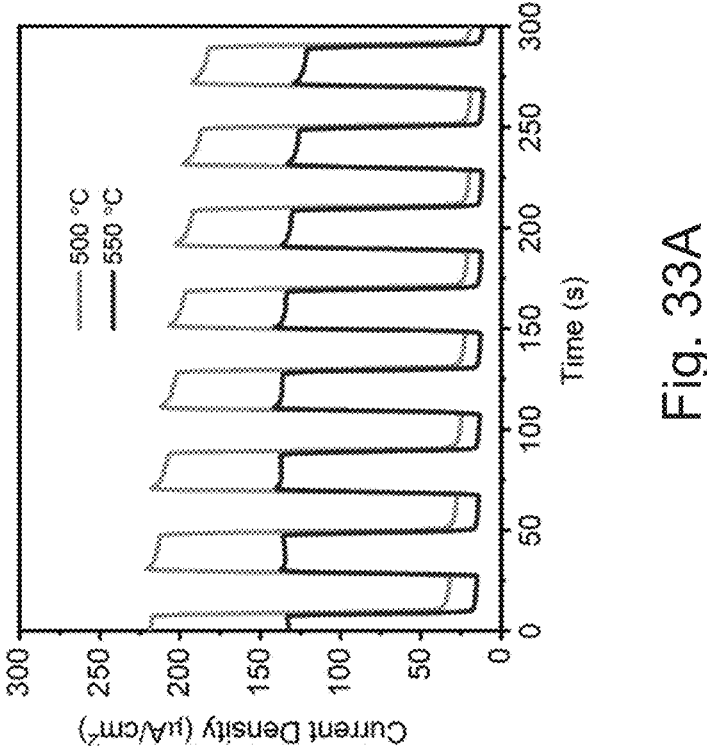
FIG. 33A shows photocurrent density of CNMT1-500 and CNMT1-550 in 0.1 M $Na_2SO_4$ solution.
Figure 33C:
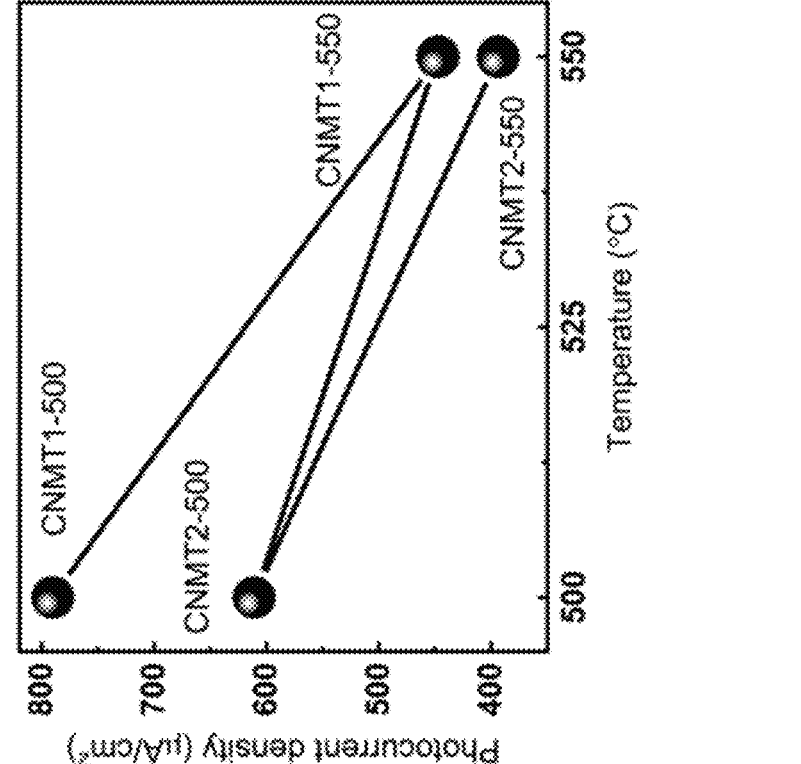
FIG. 33C shows the photocurrent density-annealing temperature relationship of CNMT1-500, CNMT1-550, CNMT2-500, and CNMT2-550.

The role of precursor weight correlation is first investigated by using CNMT3-500 and CNMT3-550, which are synthesized from 1 g thiourea and 3 g melamine under an annealing temperature of 500° C. or 550° C. in accordance with the procedure as disclosed herein. The PEC performance may be tuned by varying the amount of thiourea added to the melamine precursor (FIGS. 29D and 32A). For comparison, it is attempted to use thiourea powder alone for preparing g-CN film on FTO glass. A porous, non-uniform g-CN film is formed (FIG. 32B). Taken together with the SEM results (FIGS. 13A to 13E), it is suggested that thiourea may in fact help melamine to accomplish uniform and thick (at micrometer level) g-CN film on FTO glass.

As for the calcination temperatures, all the CNMT samples prepared under 500° C. calcination showed a better PEC performance than those prepared under 550° C. calcination (FIGS. 31 and 33A to 33C). It is believed that upon heat treatment, the layer structure may be moderately exfoliated, and the conjugated poly-triazine ring structure is destructive to a certain extent (FIGS. 13B to 13E). Consequently, the g-CN surface structure may be changed, such as with increased surface defects (which may be confirmed by UV results (FIGS. 24A and 24B)) that may facilitate recombination of the photogenerated charge carriers as charge recombination centers, thus reducing photocatalytic activity.

Figure 34B:
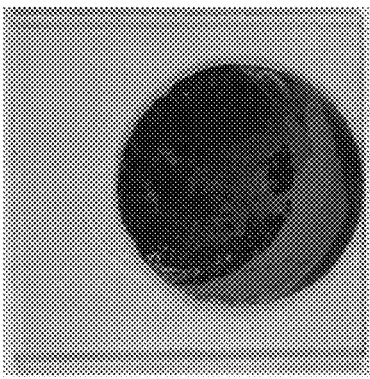
FIG. 34B shows the photograph of CNMT2-600.
Figure 34A:
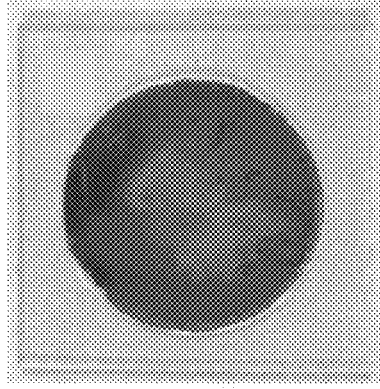
FIG. 34A shows the photograph of CNMT1-600.

Further increasing the processing temperature to 600° C. would turn the colour of g-CN films to brown (FIGS. 34A and 34B), which appears to be not functional. Hence, it is believed that 550° C. would be the uppermost limit of calcination temperature for fabricating uniform g-CN film in this work.

Overall, it is believed that with the appropriate thiourea and melamine precursor ratio and annealing temperature, it would result in uniform g-CN film with micrometer level thickness, which may promote light penetration within the electrode (i.e. increase the amount of charge carriers) and reduced electron-hole recombination within the active layer before they react (i.e. better charge carrier mobility) due to its sufficient electron diffusion length, thereby improving PEC performance.

Figure 35:
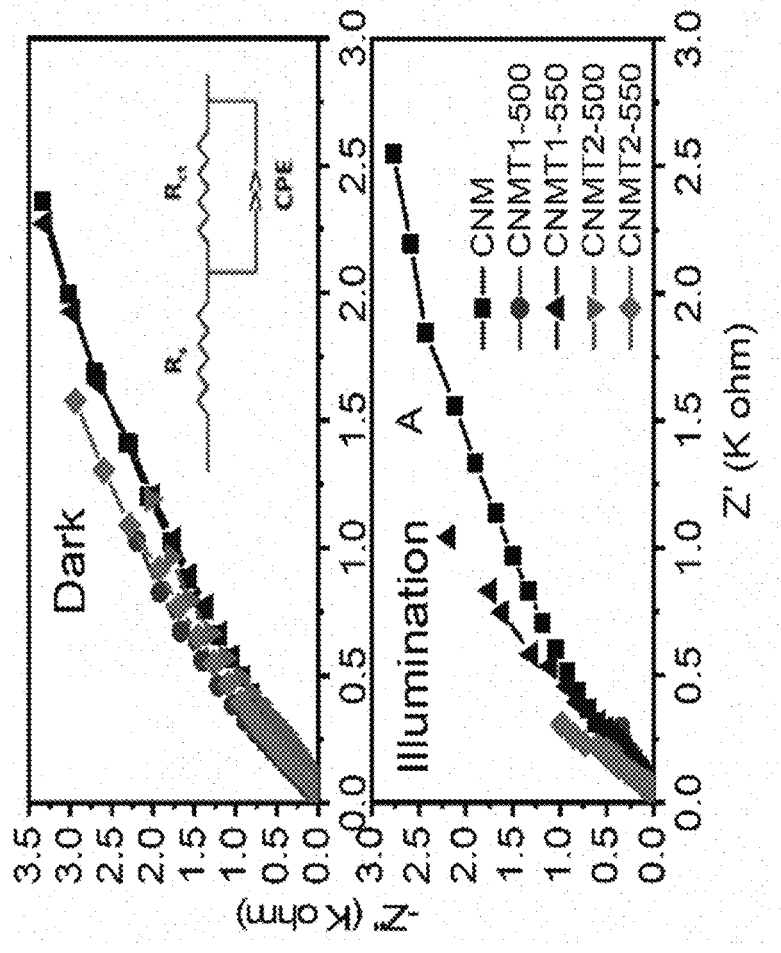
FIG. 35 shows EIS plots of CNM, CNMT1-500, CNMT1-550, CNMT2-500, and CNMT2-550 under dark and illumination conditions.

To clarify the photocurrent enhancement, the charge transport properties between the photoelectrode and the electrolyte are characterized by electrochemical impedance spectroscopy (EIS) measurement for fabricated g-CN films. The Randles-Ershler (R-E) circuit model (FIG. 35, inset) was adopted as the equivalent circuit to simulate the PEC process. The resistor $R_s$ stands for the contact resistance between the electrolyte and the external electrical circuit. $R_{et}$ resistor is related to the charge transfer process at the photoanode and electrolyte interfaces. The resultant arc diameters of the semicircles in Nyquist plots represent the magnitude of the corresponding $R_{et}$ at the electrolyte and electrode interface. The decreased arc diameter of the semicircle in the Nyquist plots under both dark and illumination demonstrates a reduced charge transfer and transport resistance from film to the electrolyte. It can be seen that CNMT1-500 owns the shortest arc diameter under both conditions; hence the charge recombination rate in this candidate is suppressed, which is correlated with the best PEC performance among the candidates.

Figure 36:
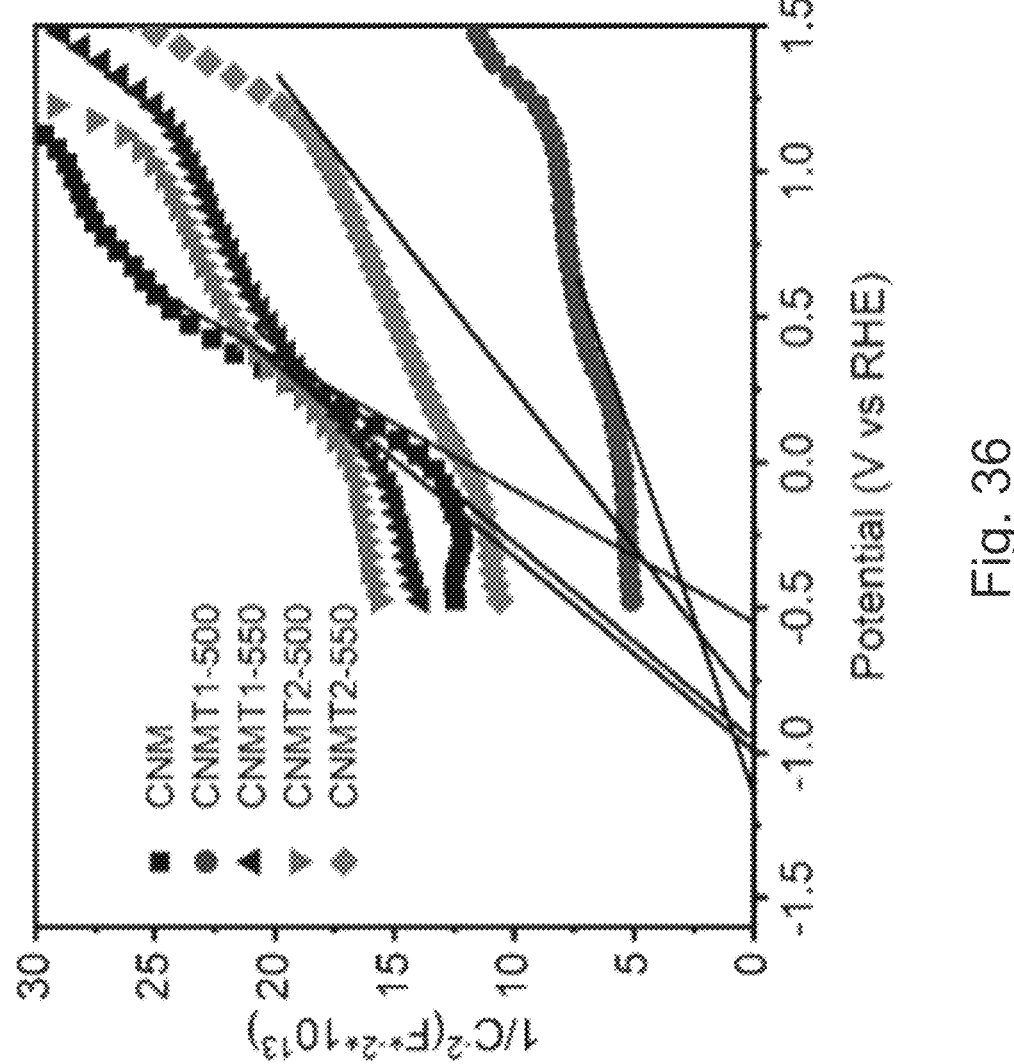
FIG. 36 shows the Mott-Schottky curves of CNM, CNMT1-500, CNMT1-550, CNMT2-500, and CNMT2-550.

The Mott-Schottky (MS) relationships are adopted to reveal the n-type characteristics of g-CN films on the flat band potential and band alignment, and the free carrier density enhancement can be interpreted. The positive slope in the plot (FIG. 36) suggests that g-CN is an n-type semiconductor. The steepest slope of CNM film indicates the lowest free carrier density. Usually, the bulk electrical conductivity depends on the carrier density. After constructing CNMT films on the FTO substrate, the free carriers introduced grantee to improve the bulk electrical conductivity. Moreover, the intercept of the slope shifts towards negative direction, indicating a substantial band bending in the space charge zone, and the values of flat band potential (FIG. 37). The increased band bending action boosts the carrier charge separation. As a result, the fast recombination rate of the charge carrier is hindered, which is consistent with the Nyquist plot.

Based on the above, it is believed that the introduction of different thiourea weights to melamine, the chemical structure, composition, and morphology, as well as the film thickness of the synthesized mela/thio-g-CN samples, are substantially dissimilar with the g-CN derived from single melamine. The contact resistance for charge transport and charge collection in PEC applications is reduced due to the intimate contact between the film and the substrate, revealing the sufficient electron diffusion length to minimize the electron-hole recombination. Consequently, efficient light harvesting is achieved, as discussed in the optical properties of UV and PL spectra which also indicate good PEC performance.

The photostability of the CNMT film has been investigated. In particular, CNMT1-500 is selected as an example embodiment and compared with CNM film for practical long-term use in PEC applications.

Figure 38:
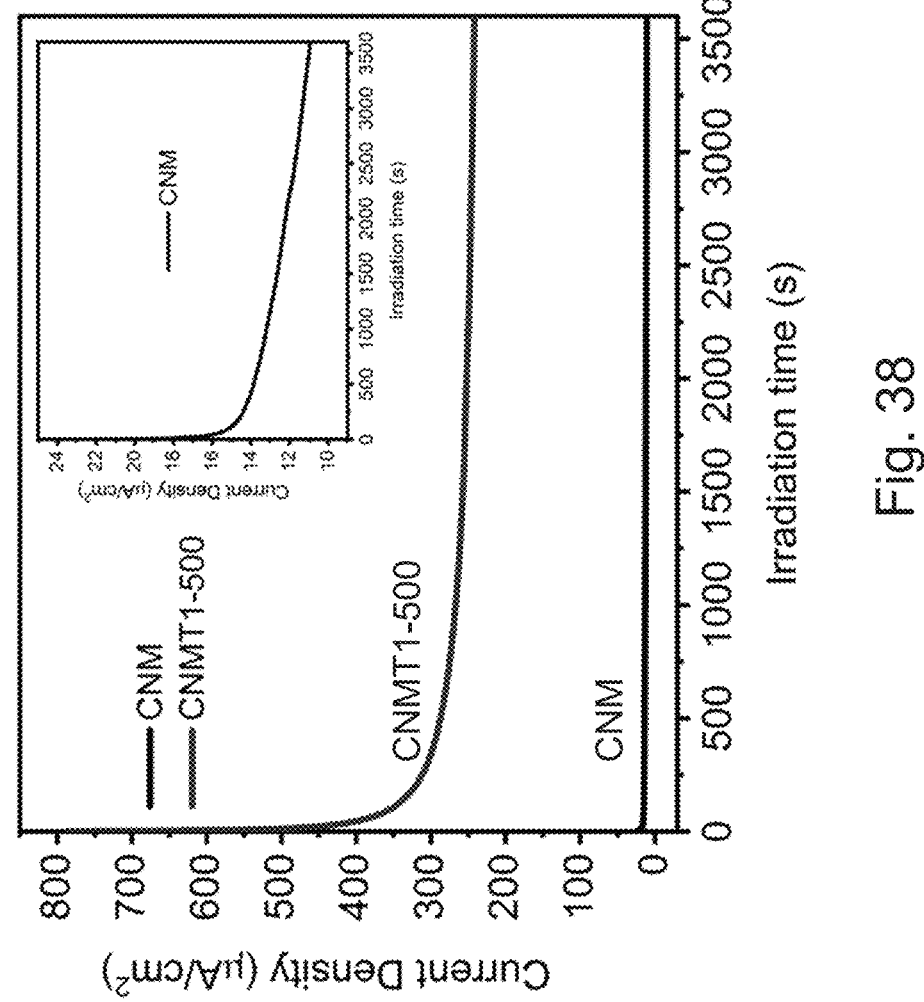
FIG. 38 shows photostability measurement of CNM and CNMT1-500 with three-electrode workstation under AM 1.5G 1 sun illumination (100 mW/cm$^{-2}$)
Figure 39B:
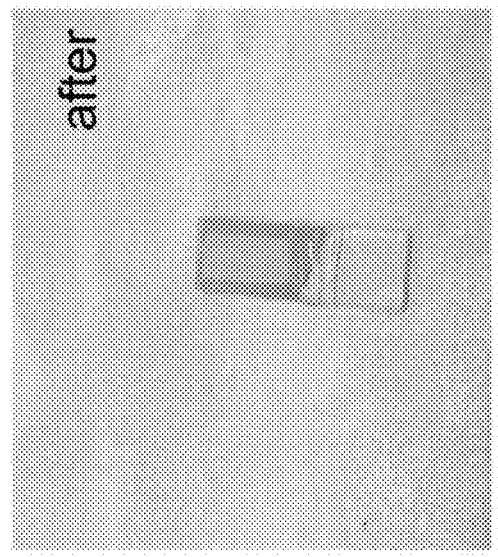
FIG. 39B shows the photograph of CNMT1-500 film after all PEC tests.
Figure 39A:
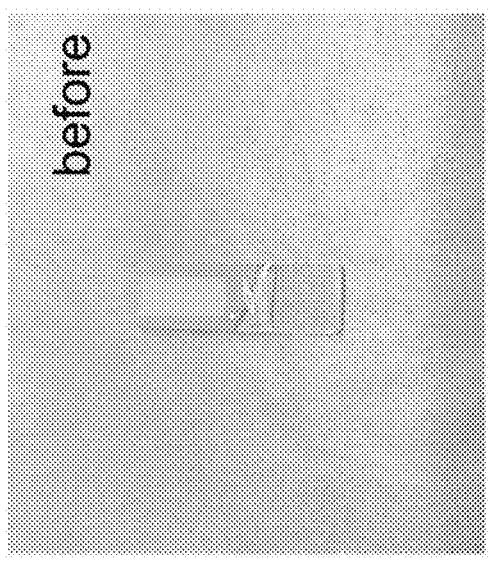
FIG. 39A shows the photograph of CNMT1-500 film before all PEC tests.
Figure 39D:
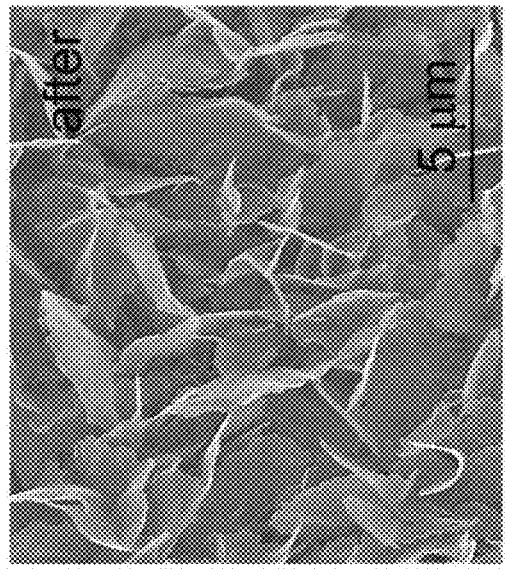
FIG. 39D shows the SEM image of CNMT1-500 film after all PEC tests.
Figure 39C:
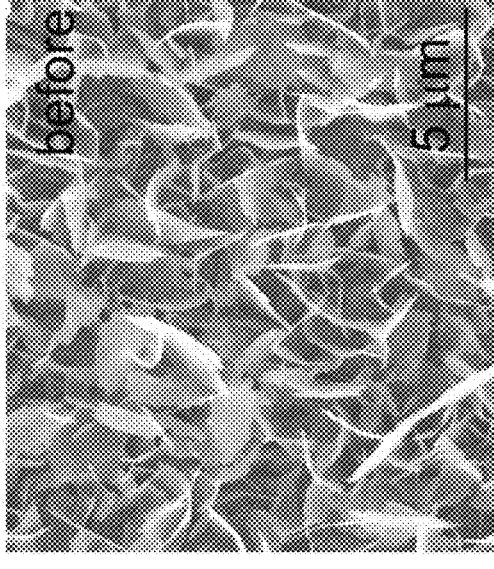
FIG. 39C shows the SEM image of CNMT1-500 film before all PEC tests.

It is found that CNMT1-500 owns good stability after the initial decay, maintaining the photocurrent density as about 300 $\mu A\,cm^{-2}$ (FIG. 38). On the contrary, CNM film (FIG. 38, inset) decays continuously, during the irradiated processing time of 1 hour, presumably due to the enhancement of charge separation and hole extraction. It is believed that the improved stability may be attributed to the film quality. For example, it appears that no damage has happened to the film after a long test for all PEC properties (FIGS. 39A and 39B), revealing the strong cohesive force between the film and the FTO glass. It is believed that such an excellent contact between the film and substrate would lead to lower resistance, enabling higher photocurrent and better stability. Besides, CNMT1-500 film was characterized after all photoelectrochemical assessments by SEM (FIGS. 39C and 39D). The formed nanoflowers are almost identical owing to an outstanding stability during the PEC operation. Moreover, the CNMT1-500 sample overcomes the common limitation regarding the thickness of g-CN films. The film is thick enough, on micrometer scale as measured above, that is efficient in absorbing light in the visible range; as a result, the charge carriers are well collected by the FTO film that boots electronic conductivity. Thus, this work offers the opportunity to implement PEC applications by proficiently selecting starting precursors and processing temperatures.

Example 5A

Density Functional Theory (DFT) Calculations of g-CN-MxT0.6

To reveal the underlying reason why g-CN polymerization of g-CN-MxT0.6 can be improved by using melamine and TU precursors, a series of DFT calculations is performed and the specific calculation details are as follows:

The gas-phase microscopic reactions starting from thiourea and melamine to g-CN were calculated at the level of CAM-B3LYP/6-31G*, including the geometry optimizations of reactants (R), intermediates (IM), products (P), and transition states (TS), and subsequent frequency calculations to confirm their natures as local minima or first-order saddle points. Intrinsic reaction coordinate (IRC) calculations were also performed by CAM-B3LYP/6-31G*, to demonstrate the TS connected with the desired R/IM and IM/P and calculate the activation energy ($E_\alpha$) and reaction heat ($\Delta H$) for each step of the reactions. All calculations were conducted with Gaussian 09 Program package.

Based on the calculations, it is believed that it is the small and active carbodiimide (HN=C=NH) species mainly generated from TU precursor that are anchored on melamine one by one, leading to the formation of the heptazine or even larger-area conjugated structures. The DFT-calculated energy profiles (FIGS. 40A to 40C) show that the chemical reactions of melamine with HN=C=NH will alternately undergo polycondensation, cycloaddition/addition, and hydrogen shift reactions to generate larger g-CN conjugated clusters and ammonia gas. The reaction pathway is feasible to go through as the activation barriers are in the range of 6-60 kcal/mol, which can be easily overcome under the TVC synthesis condition (550° C. for 3 hr). Especially in the process of melamine growing into heptazine, the reaction heats are mostly exothermic, which can increase the driving force of chemical reactions thermodynamically. Notably, the heptazine cluster is not the final product, but can continue to anchor more HN=C=NH to form larger-area conjugated structure like the real graphite phase, which is most probably present in g-CN-M3T0.6 sample when the reactant ratio of TU to melamine is appropriate.

To visualize how melamine grows into g-CN, FIGS. 41A to 41C shows the DFT-calculated geometries of 16 transition states (TS) and 16 intermediates (IM) involved in the 16-step chemical reactions of melamine with HN—C=NH. The —CNH$_2$ group is mainly the active site that anchors the —N=C=NH group and meanwhile releases NH$_3$ gas, i.e. polycondensation reactions in steps of 1, 7, 10, or self-condensation reactions in steps of 5, 16. When the —CNH group encounters the HN=C=NH, an addition reaction will occur with the —N=C=NH group connected to C to form sp$^3$—C and —H connected to —NH to form —NH$_2$, such as in steps of 4, 14. Once a HN=C=NH is linked to the substrate, another HN=C=NH may also combine with it to form a new six-membered ring, i.e. a cycloaddition reaction occurs, such as in steps of 2, 8, 11. When two H atoms are connected to two adjacent N, one H can migrate from one N to another, i.e. H-shift reaction occurs, forming a new —NH$_2$ group to serve as the active site for the subsequent polycondensation reaction, such as in steps of 3, 6, 9, 12, 13, 15. In general, the cycloaddition reactions for HN=C=NH combined with the melamine-based substrate are relatively easy to proceed due to the smaller barriers (~20 kcal/mol), while polycondensation reactions are relatively difficult due to the larger energy barriers (49-51 kcal/mol) and endothermic reaction heats. Therefore, polycondensation reactions should be the rate-determining steps. In comparison, the 1-6 steps would be more favorable to occur than the 7-16 steps, indicating that the heptazine cluster may be the most possible unit structure for g-CN crystalline.

Notably, there is a large difference in producing HN=C=NH species between the chemical reactions starting from melamine and TU. There are two steps to undergo (FIGS. 42A and 42B) from melamine to HN=C=NH: 1) Melamine decomposition into three cyanamides with an extremely high energy barrier of 124.9 kcal/mol and unfavourable endothermic reaction heat of +73.4 kcal/mol; 2) One hydrogen atom migrates from one side of cyanamide to another to form HN=C=NH, accompanied with a still high barrier of 91.6 kcal/mol and reaction heat of +3.1 kcal/mol.

By contrast, the two steps for the chemical reactions of 1) TU decomposition into HN=C=S and NH$_3$, and then 2) HN=C=S dimer polycondensation to form HN=C=NH and CS$_2$ (FIGS. 42C and 42D), are relatively easy to proceed due to the much lower barriers (40.8 and 39.5 kcal/mol) than that from melamine. It is found that the HN=C=NH species derived from TU would be much easier than that from melamine precursor, resulting in the significant polymerization improvement of g-CN once TU is added to melamine as the precursors in the experiment.

Besides the formation of conjugated units, the N—C$_3$ coordination bonds in g-CN film can also be formed through hydrogen shifts and polycondensations among three g-CN conjugated clusters (FIG. 43A). Taking melamine as the representative unit of g-CN, the whole process will undergo 4 steps from monomer to dimer and trimer, accompanied with two ammonia molecules released. The barriers are in the range of 34-53 kcal/mol and reaction heats are almost endothermic (FIG. 43B). Chemical reactions among larger g-CN units may further increase the difficulty of N—C$_3$ coordination bond formation due to more severe steric effects. It indicates that the N—C$_3$ coordination bonds are not as easy to form as the unit growth (FIGS. 40A and 40B). This may be why g-CN-M3T0.6 has the greatest difference between its C=N—C and N—C$_3$ XPS peaks among four samples, because the growth of its conjugated units promoted by more HN=C=NH is easier and faster than the connection among conjugated units.

The experimental microstructure characterizations and the growth mechanism revealed by computations disclosed herein consistently demonstrate that the unique polymer structure of g-CN-M3T0.6 derived from the mass ratio of TU to melamine as 1:5 has the highest polymerization degree, which implies that g-CN-M3T0.6 has most excellent optical property and PEC performance among four samples, while the g-CN—M10 is the worst.

Example 5B

Density Functional Theory (DFT) Calculations of CNMT-x-t

DFT method is used to investigate the electronic properties of the g-CN structures of CNMT-x-t. Specifically, pure g-CN was built with seven heptazines. Simulations were implemented using the Gaussian 09 program package. The geometries were optimized and the band gap were calculated at the level of B3LYP/6-31G(d,p). According to the supercell structure for g-CN, the cluster models were constructed containing one (g-CN(H$_1$)), three (g-CN(H$_3$)), six (g-CN (H$_6$)), and ten (g-CN(H$_{10}$)) heptazines to consider the effects of size on photochemical performance (FIGS. 44A to 44D). Fundamental energy gaps (E$_g$) were calculated as the energy difference between the highest occupied molecular orbital (HOMO) and lowest unoccupied molecular orbital (LUMO) (FIG. 45). The E$_g$ values decrease from 5.00 cV to 3.50 cV, with the size increasing from one heptazine to ten heptazines, indicating the same trend as the results of reported DFT studies.

Figure 24A:
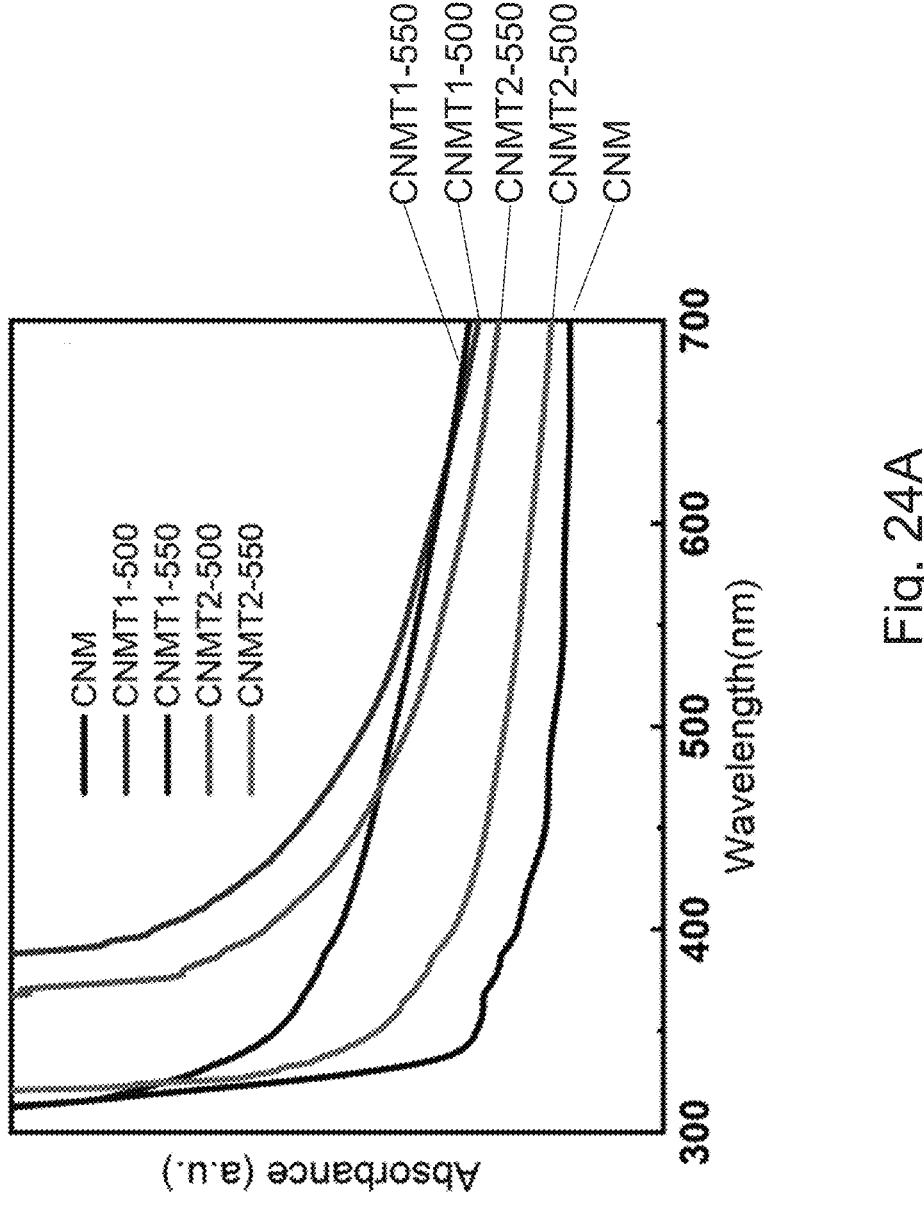
FIG. 24A shows the UV-Vis absorption spectra of CNM, CNMT1-500, CNMT1-550, CNMT2-500, and CNMT2-550.
Figure 24B:
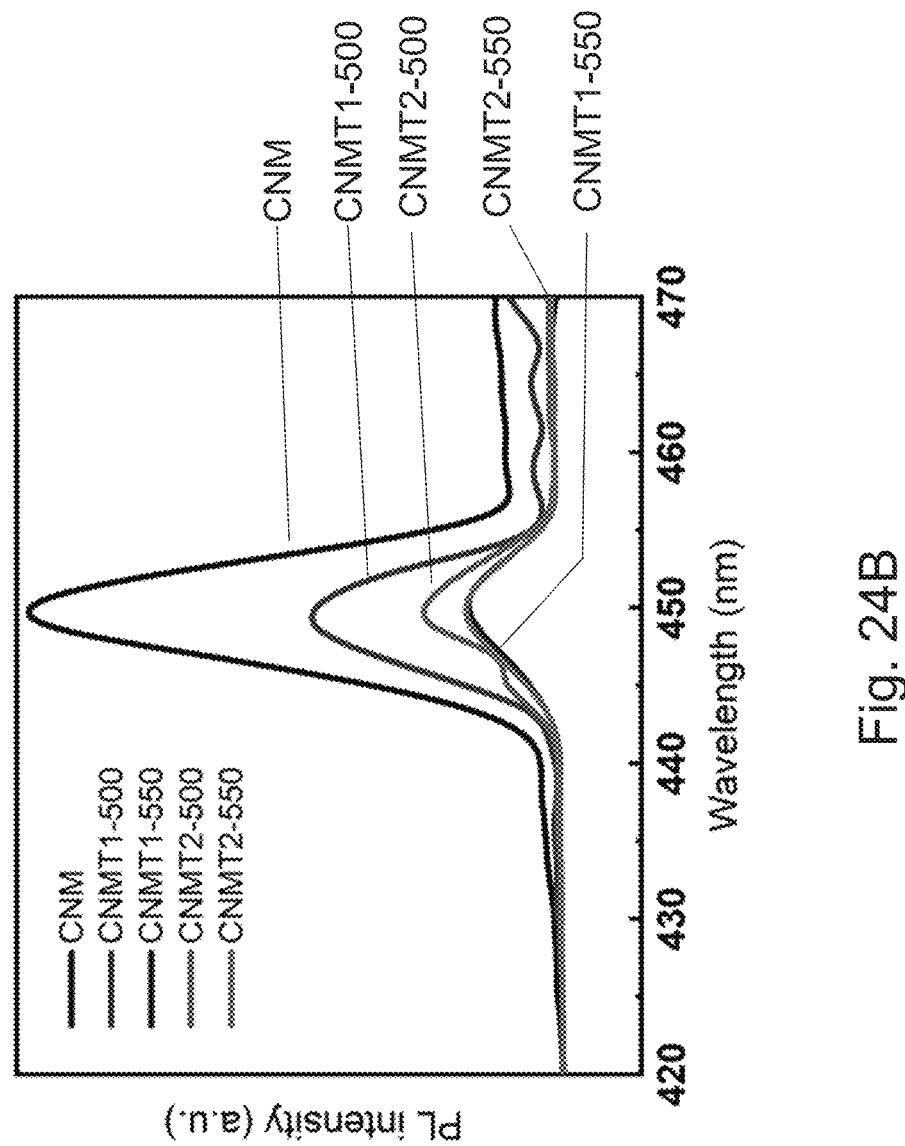
FIG. 24B shows the photoluminescence (PL) spectra of CNM, CNMT1-500, CNMT1-550, CNMT2-500, and CNMT2-550.

Besides, the system size also affects the UV-vis absorption spectra, the electron-hole pair binding energies, and the spatial distributions of photo-induced electrons and holes. To calculate the UV-vis absorption spectra the first sixty excited states were considered at the level of ωB97XD/6-31G(d,p). The spatial distributions of photo-induced holes and electrons were analyzed by Multiwfn code and visualized by VMD software. The calculated largest oscillator strength of UV-vis absorption spectra (FIGS. 46A to 46D)

located at 201.81 nm for g-CN(H$_1$), located at 239.95 nm for g-CN(H$_3$), located at 240.00 nm for g-CN(H$_6$), and located at 256.94 nm for g-CN(H$_{10}$), were redshifted with the size of g-CN increasing. This is similar to the trend observed in the experimental UV-vis spectra (FIG. 24A).

After the UV-Vis absorption, according to Kasha's rule, the electronic states of g-CN systems will quickly decay to the first excited states. Therefore, the spatial distributions of photo-induced holes and electrons were analysed at the first excited states (FIGS. 44A to 44D). The photo-induced electrons are mainly located at the C atom, but the holes are predominantly located at the C—N bonds with minimal presence at the nitrogen (N) atoms. Owing to the high symmetry of g-CN(H$_1$) (FIG. 44A), the centres of photo-induced holes and electrons almost overlap at the first excited state (S$_1$), exhibiting minimal spatial separation. Moreover, the increasing size of g-CN leads to longer distances (D$_{h-e}$) between the photo-induced holes and electrons as well as the lower electron-hole pair binding energies (FIG. 45). Finally, the D$_{h-e}$ of 0.20 Å was obtained in the g-CN(H$_{10}$). The results prove that the large size of g-CN can facilitate the effective segregation of photo-induced holes and electrons, resulting in reduced recombination between them. This makes more long-lasting photo-induced holes and electrons existing to react with water. Thus, the better photoelectrochemical performance is achieved.

Example 6

Photoelectrocatalytic H$_2$ Generation by CNMT-x-t

To investigate the water splitting activity of CNMT-x-t film for H$_2$ generation, about 1 cm$^2$ area of the g-CN films are performed as H$_2$ evolving catalysts through a three-electrode system under 100 mW/cm$^2$ illumination as the same system of photoelectrochemical measurements. The g-CN film (CNMT1-500) was attached as a working electrode, and Pt and Ag/AgCl electrodes as counter and reference electrodes, respectively (FIG. 47A). After 2-hour illumination, a total of 4.34 μmol H$_2$ gas is produced from CNMT1-500 film in 50 mL 0.1 M NaSO$_4$-10% TEOA electrolyte solution (pH=10.36), which is 16 times higher than that of CNM film, i.e., about 0.27 μmol (FIG. 47B). In other words, the more time consumed, the more hydrogen gas evolved from the g-CN photoanodes (FIG. 47C). Then, the Faradaic efficiency (FE), defined as the ratio of the actually evolved gas divided by the ideally evolved gas calculated using the current density, is calculated at about 77.3% for CNMT1-500 and the solar-to-hydrogen (STH) conversion efficiency is determined to be 0.75% whereas CNM film achieves negligible small value (FIG. 47D). In addition, it is noted that the g-CN film in this work generally outperforms other reported g-CN-based photocatalysts for overall water splitting, expect for incorporated with foreign elements such as CDot and metal (FIGS. 48 and 49).

The invention has been given by way of example only, and various other modifications of and/or alterations to the described embodiment may be made by persons skilled in the art without departing from the scope of the invention as specified in the appended claims.

The invention claimed is:

1. A method for forming a film of graphitic carbon nitride (g-CN) by way of thermal vapor condensation comprising the steps of:
   a) providing a solid-phase thiourea precursor and a solid-phase melamine precursor in a container;
   b) covering the container with a first substrate; and c) thermally generating a vapor-phase thiourea source and a vapor-phase melamine source from the solid-phase thiourea precursor and the solid-phase melamine precursor in an air environment thereby forming a layer of g-CN on the first substrate;
wherein the solid-phase thiourea precursor and the solid-phase melamine precursor are physically separated by a support substrate.

2. The method as claimed in claim 1, wherein the support substrate is positioned at an angle relative to a side of the container.

3. The method as claimed in claim 2, wherein the support substrate comprises a layer of solid-phase thiourea precursor.

4. The method as claimed in claim 3, further comprising the step of forming the layer of solid-phase thiourea precursor.

5. The method as claimed in claim 4 further comprising the steps of:
   heating thiourea solid in deionized water to form a hot saturated thiourea solution;
   forming a layer of saturated thiourea on the support substrate by at least partially immersing the support substrate in the saturated thiourea solution; and
   drying the layer of saturated thiourea to obtain the solid-phase thiourea precursor.

6. The method as claimed in claim 5, wherein the step of drying the layer of saturated thiourea solution is conducted under ambient conditions.

7. The method as claimed in claim 5, wherein the thiourea solid in deionized water is heated to a temperature of about 60° C. to about 150° C.

8. The method as claimed in claim 5, wherein the support substrate is at least partially immersing in the saturated thiourea solution for about 2-15 seconds.

9. The method as claimed in claim 5, wherein the layer of solid-phase thiourea precursor has a thickness of about 1.5 mm.

10. The method as claimed in claim 5, wherein the layer of solid-phase thiourea has a weight of about 0.6 g.

11. The method as claimed in claim 1, wherein the solid-phase melamine precursor has a weight of about 1 g to about 5 g.

12. The method as claimed in claim 1, wherein step c) includes the steps of:
   annealing the solid-phase thiourea precursor and the solid-phase melamine precursor to generate the vapor-phase thiourea source comprising active carboiimide species and the vapor-phase melamine source; and
   allowing the vapor-phase thiourea source and the vapor-phase melamine source to deposit and react to form the layer of g-CN on the first substrate.

13. The method as claimed in claim 12, wherein the annealing step is conducted in a muffle furnace at about 550° C. for about 3 hours, with a heating rate of about 3° C./min.

14. The method as claimed in claim 1 further comprising step d) post-annealing the layer of g-CN formed in step c).

15. The method as claimed in claim 14, wherein step d) is conducted in a muffle furnace at about 300° C. for about 30 min, with a heating rate of about 3° C./min.

16. The method as claimed in claim 1, wherein the first substrate comprises a FTO glass.

17. The method as claimed in claim 1, wherein the support substrate comprises a glass strip.

18. The method as claimed in claim 1, wherein the container is polished.

19. The method as claimed in claim 18 further comprising the step of polishing the container rim successively with an abrasive from about 400 Cw to about 1200 Cw.

20. The method as claimed in claim 1 further comprising the step of placing a load on top of the first substrate for minimizing leakage of the vapor-phase thiourea source and a vapor-phase melamine source.

21. The method as claimed in claim 1, wherein each of the solid-phase thiourea precursor and the solid-phase melamine precursor is in powder form.

22. The method as claimed in claim 21 further comprising the steps of:

preparing a homogeneous mixture of the solid-phase thiourea precursor and the solid-phase melamine precursor by grinding thiourea solid and melamine solid; and transferring the homogeneous mixture to the container for thermal treatment.

23. The method as claimed in claim 22, wherein the thiourea solid and the melamine solid has a weight ratio of about 1-3:3.

24. The method as claimed in claim 22, wherein step c) comprises the steps of:

annealing the solid-phase thiourea precursor and the solid-phase melamine to generate the vapor-phase thiourea source and the vapor-phase melamine source; and allowing the vapor-phase thiourea source and the vapor-phase melamine source to deposit and react to form the layer of g-CN on the first substrate.

25. The method as claimed in claim 24, wherein the annealing step is conducted in a muffle furnace at about 500° C. to about 550° C. for about 3 hours, with a heating rate of about 3° C./min.

* * * * *